(12) United States Patent
Beder et al.

(10) Patent No.: US 7,782,538 B2
(45) Date of Patent: Aug. 24, 2010

(54) PROJECTION OBJECTIVE HAVING A HIGH APERTURE AND A PLANAR END SURFACE

(75) Inventors: Susanne Beder, Aalen (DE); Wolfgang Singer, Aalen (DE); Karl-Heinz Schuster, Koenigsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/269,686

(22) Filed: Nov. 12, 2008

(65) Prior Publication Data

US 2009/0059385 A1 Mar. 5, 2009

Related U.S. Application Data

(63) Continuation of application No. 11/151,465, filed on Jun. 14, 2005, now Pat. No. 7,466,489, which is a continuation-in-part of application No. PCT/EP2004/014062, filed on Dec. 10, 2004.

(60) Provisional application No. 60/530,978, filed on Dec. 22, 2003, provisional application No. 60/536,248, filed on Jan. 14, 2004, provisional application No. 60/544,967, filed on Feb. 13, 2004, provisional application No. 60/568,006, filed on May 4, 2004, provisional application No. 60/587,504, filed on Jul. 14, 2004, provisional application No. 60/591,775, filed on Jul. 27, 2004, provisional application No. 60/592,208, filed on Jul. 29, 2004, provisional application No. 60/612,823, filed on Sep. 24, 2004, provisional application No. 60/617,674, filed on Oct. 13, 2004, provisional application No. 60/658,417, filed on Mar. 2, 2005, provisional application No. 60/587,504, filed on Jul. 14, 2004, provisional application No. 60/530,623, filed on Dec. 19, 2003.

(30) Foreign Application Priority Data

Oct. 22, 2004 (DE) .................. 10 2004 051 730

(51) Int. Cl.
*G02B 27/30* (2006.01)
*G03B 27/42* (2006.01)

(52) U.S. Cl. ..................................... 359/649; 355/53

(58) Field of Classification Search ................. 359/793, 359/649–651, 708, 713–717; 355/53, 55, 355/67–71
See application file for complete search history.

(56) References Cited

U.S. PATENT DOCUMENTS 2,380,887 A  7/1945 Warmisham (Continued)

FOREIGN PATENT DOCUMENTS

CN  1802726 A  7/2006

(Continued)

OTHER PUBLICATIONS

U.S. Appl. No. 60/632,550, filed Dec. 1, 2004, Weippert et al.

(Continued)

*Primary Examiner*—Jack Dinh
(74) *Attorney, Agent, or Firm*—Sughrue Mion, PLLC

(57) ABSTRACT

A projection objective for imaging a pattern provided in an object plane of the projection objective onto an image plane of the projection objective suitable for microlithography projection exposure machines has a plurality of optical elements transparent for radiation at an operating wavelength of the projection objective. At least one optical element is a high-index optical element made from a high-index material with a refractive index $n \geq 1.6$ at the operating wavelength.

9 Claims, 7 Drawing Sheets

U.S. PATENT DOCUMENTS

| | | | |
|---|---|---|---|
| 3,244,073 A | 4/1966 | Bouwers et al. |
| 4,103,990 A | 8/1978 | Yamada |
| 4,241,390 A | 12/1980 | Markle et al. |
| 4,346,164 A | 8/1982 | Tabarelli et al. |
| 4,398,809 A | 8/1983 | Canzek |
| 4,443,068 A | 4/1984 | Itoh |
| 4,469,414 A | 9/1984 | Shafer |
| 4,482,219 A | 11/1984 | Canzek |
| 4,666,259 A | 5/1987 | Iizuka |
| 4,685,777 A | 8/1987 | Hirose |
| 4,711,535 A | 12/1987 | Shafer |
| 4,757,354 A | 7/1988 | Sato et al. |
| 4,779,966 A | 10/1988 | Friedman |
| 4,812,028 A | 3/1989 | Matsumoto |
| 4,834,515 A | 5/1989 | Mercado |
| 4,861,148 A | 8/1989 | Sato et al. |
| 4,951,078 A | 8/1990 | Okada |
| 5,004,331 A | 4/1991 | Haseltine et al. |
| 5,031,976 A | 7/1991 | Shafer |
| 5,293,186 A | 10/1991 | Offner |
| 5,063,586 A | 11/1991 | Jewell et al. |
| 5,114,238 A | 5/1992 | Sigler |
| 5,121,256 A | 6/1992 | Corle et al. |
| 5,153,898 A | 10/1992 | Suzuki et al. |
| 5,212,588 A | 5/1993 | Viswanathan et al. |
| 5,220,590 A | 6/1993 | Bruning et al. |
| 5,315,629 A | 5/1994 | Jewell et al. |
| 5,353,322 A | 10/1994 | Bruning et al. |
| 5,410,434 A | 4/1995 | Shafer |
| 5,477,304 A | 12/1995 | Nishi |
| 5,488,229 A | 1/1996 | Elliott et al. |
| 5,515,207 A | 5/1996 | Foo |
| 5,636,066 A | 6/1997 | Takahashi |
| 5,650,877 A | 7/1997 | Phillips, Jr. et al. |
| 5,652,679 A | 7/1997 | Freeman |
| 5,686,728 A | 11/1997 | Shafer |
| 5,717,518 A | 2/1998 | Shafer et al. |
| 5,729,376 A | 3/1998 | Hall et al. |
| 5,734,496 A | 3/1998 | Beach |
| 5,802,335 A | 9/1998 | Sturlesi et al. |
| 5,805,346 A | 9/1998 | Tomimatsu |
| 5,805,365 A | 9/1998 | Sweatt |
| 5,815,310 A | 9/1998 | Williamson |
| 5,861,997 A | 1/1999 | Takahashi |
| 5,917,879 A | 6/1999 | Mashima |
| 5,956,192 A | 9/1999 | Williamson |
| 5,969,441 A | 10/1999 | Loopstra et al. |
| 5,999,310 A | 12/1999 | Shafer et al. |
| 6,033,079 A | 3/2000 | Hudyma |
| 6,064,516 A | 5/2000 | Schuster |
| 6,097,537 A | 8/2000 | Takahashi et al. |
| 6,169,627 B1 | 1/2001 | Schuster |
| 6,169,637 B1 | 1/2001 | Tsunashima |
| 6,172,825 B1 | 1/2001 | Takahashi |
| 6,188,513 B1 | 2/2001 | Hudyma et al. |
| 6,195,213 B1 | 2/2001 | Omura et al. |
| 6,213,610 B1 | 4/2001 | Takahashi et al. |
| 6,259,510 B1 | 7/2001 | Suzuki |
| 6,262,845 B1 | 7/2001 | Sweatt |
| 6,285,737 B1 | 9/2001 | Sweatt et al. |
| 6,353,470 B1 | 3/2002 | Dinger |
| 6,426,506 B1 | 7/2002 | Hudyma |
| 6,473,243 B1 | 10/2002 | Omura |
| 6,597,498 B1 | 7/2003 | Schuster |
| 6,600,608 B1 | 7/2003 | Shafer et al. |
| 6,631,036 B2 | 10/2003 | Schuster |
| 6,636,350 B2 | 10/2003 | Shafer et al. |
| 6,717,722 B2 | 4/2004 | Shafer et al. |
| 6,750,948 B2 | 6/2004 | Omura |
| 6,757,051 B2 | 6/2004 | Takahashi et al. |
| 6,816,320 B2 | 11/2004 | Wada |
| 6,822,727 B2 | 11/2004 | Shima |
| 6,829,099 B2 | 12/2004 | Kato et al. |
| 6,842,298 B1 | 1/2005 | Shafer et al. |
| 6,859,328 B2 | 2/2005 | Schultz et al. |
| 6,873,476 B2 | 3/2005 | Shafer |
| 6,882,804 B2 | 4/2005 | Eskey |
| 6,912,042 B2 | 6/2005 | Shafer |
| 6,930,758 B2 | 8/2005 | Schuster et al. |
| 6,995,886 B2 | 2/2006 | Hendriks et al. |
| 6,995,918 B2 | 2/2006 | Terasawa et al. |
| 7,030,965 B2 | 4/2006 | Takahashi |
| 7,075,726 B2 | 7/2006 | Terasawa et al. |
| 7,079,314 B1 | 7/2006 | Suenaga et al. |
| 7,085,075 B2 | 8/2006 | Mann et al. |
| 7,092,168 B2 | 8/2006 | Terasawa et al. |
| 7,187,503 B2 | 3/2007 | Rostalski et al. |
| 7,190,530 B2 | 3/2007 | Mann et al. |
| 7,218,445 B2 | 5/2007 | Shafer et al. |
| 7,224,520 B2 | 5/2007 | Mitchell |
| 7,237,915 B2 | 7/2007 | Hudyma |
| 7,239,453 B2 | 7/2007 | Terasawa et al. |
| 7,557,997 B2 | 7/2009 | Omura et al. |
| 2001/0019454 A1 | 9/2001 | Tadic-Galeb et al. |
| 2002/0024741 A1 | 2/2002 | Terasawa et al. |
| 2002/0102497 A1 | 8/2002 | Sparrow |
| 2002/0176063 A1 | 11/2002 | Omura |
| 2003/0011755 A1 | 1/2003 | Omura et al. |
| 2003/0011894 A1 | 1/2003 | Schuster |
| 2003/0174301 A1 | 9/2003 | Imanishi |
| 2003/0174408 A1 | 9/2003 | Rostalski et al. |
| 2003/0197922 A1 | 10/2003 | Hudyma |
| 2003/0197946 A1 | 10/2003 | Omura |
| 2003/0234912 A1 | 12/2003 | Omura |
| 2003/0234992 A1 | 12/2003 | Shafer |
| 2004/0012866 A1 | 1/2004 | Mann et al. |
| 2004/0075895 A1 | 4/2004 | Lin |
| 2004/0130806 A1 | 7/2004 | Takahashi |
| 2004/0160677 A1 | 8/2004 | Epple et al. |
| 2004/0190151 A1 | 9/2004 | Krahmer et al. |
| 2004/0207928 A1 | 10/2004 | Schultz et al. |
| 2004/0240047 A1 | 12/2004 | Shafer et al. |
| 2005/0036213 A1 | 2/2005 | Mann et al. |
| 2005/0082905 A1 | 4/2005 | Gronau et al. |
| 2005/0179994 A1 | 8/2005 | Webb |
| 2005/0190435 A1 | 9/2005 | Shafer et al. |
| 2005/0225737 A1 | 10/2005 | Weissenrieder et al. |
| 2005/0248856 A1 | 11/2005 | Omura et al. |
| 2006/0012885 A1 | 1/2006 | Beder et al. |
| 2006/0066962 A1 | 3/2006 | Totzeck et al. |
| 2006/0077366 A1 | 4/2006 | Shafer et al. |
| 2006/0114445 A1 | 6/2006 | Ebihara |
| 2006/0119750 A1 | 6/2006 | Epple et al. |
| 2006/0132739 A1 | 6/2006 | Ebihara |
| 2006/0132740 A1 | 6/2006 | Ebihara |
| 2006/0198018 A1 | 9/2006 | Shafer et al. |
| 2006/0221456 A1 | 10/2006 | Shafer et al. |
| 2006/0244938 A1 | 11/2006 | Schuster |
| 2006/0256447 A1 | 11/2006 | Dodoc |
| 2007/0037079 A1 | 2/2007 | Omura |
| 2007/0064214 A1 | 3/2007 | Ebihara |
| 2007/0091451 A1 | 4/2007 | Schuster |
| 2007/0109659 A1 | 5/2007 | Rostalski et al. |
| 2007/0165198 A1 | 7/2007 | Kneer et al. |
| 2007/0211234 A1 | 9/2007 | Ebihara |
| 2008/0037111 A1 | 2/2008 | Shafer et al. |
| 2008/0165336 A1 | 7/2008 | Omura et al. |
| 2009/0034061 A1 | 2/2009 | Dodoc et al. |

FOREIGN PATENT DOCUMENTS

| | | |
|---|---|---|
| DE | 196 33 128 A1 | 2/1998 |
| DE | 101 23 725 A1 | 11/2002 |
| DE | 103 32 112 | 1/2005 |

| | | | |
|---|---|---|---|
| DE | 102005056721 A1 | 11/2006 |
| EP | 0267766 A2 | 5/1988 |
| EP | 0 951 054 | 10/1999 |
| EP | 0 962 830 A1 | 12/1999 |
| EP | 1 061 396 A3 | 12/2000 |
| EP | 1059550 A1 | 12/2000 |
| EP | 1 069 448 B | 1/2001 |
| EP | 1089327 A1 | 4/2001 |
| EP | 1098215 AL | 10/2001 |
| EP | 1 318 425 A2 | 6/2003 |
| EP | 1318425 B1 | 6/2003 |
| EP | 1 336 887 A1 | 8/2003 |
| EP | 1 480 065 A2 | 11/2004 |
| EP | 1 635 382 A1 | 3/2006 |
| GB | 2146454 A | 4/1985 |
| JP | 5-175098 A | 7/1993 |
| JP | 06-053120 A | 2/1994 |
| JP | 6-188169 A | 7/1994 |
| JP | 8-166542 A | 6/1996 |
| JP | 8-330220 A | 12/1996 |
| JP | 9-148241 A | 6/1997 |
| JP | 10-163099 | 6/1998 |
| JP | 10-214783 A | 8/1998 |
| JP | 10-284408 A | 10/1998 |
| JP | 10-303114 A | 11/1998 |
| JP | 2001-228401 A | 8/2001 |
| JP | 2002-208551 | 7/2002 |
| JP | 2002208551 A | 7/2002 |
| JP | 2002372668 A | 12/2002 |
| JP | 2003114387 | 4/2003 |
| JP | 2003-307680 | 10/2003 |
| JP | 2004-333761 | 11/2004 |
| JP | 2004317534 A | 11/2004 |
| JP | 2005-003982 A | 1/2005 |
| KR | 10-2006-018869 A | 3/2006 |
| WO | 92/05462 A2 | 4/1992 |
| WO | 94/06047 A1 | 3/1994 |
| WO | 98/28665 A1 | 7/1998 |
| WO | 99/26097 A1 | 5/1999 |
| WO | 99/42905 A1 | 8/1999 |
| WO | 99/57596 A1 | 11/1999 |
| WO | 01/04682 A1 | 1/2001 |
| WO | 01/51979 A2 | 7/2001 |
| WO | 01/55767 A2 | 8/2001 |
| WO | 01/59502 | 8/2001 |
| WO | 02091078 A1 | 11/2002 |
| WO | 03/036361 | 5/2003 |
| WO | 03077036 A1 | 9/2003 |
| WO | 2003077007 A3 | 9/2003 |
| WO | 03/088330 A1 | 10/2003 |
| WO | 2004/010200 A1 | 1/2004 |
| WO | 2004/019128 A2 | 3/2004 |
| WO | 2004/107011 A1 | 12/2004 |
| WO | 2004114380 A1 | 12/2004 |
| WO | 2005/013009 A1 | 2/2005 |
| WO | 2005/015316 A2 | 2/2005 |
| WO | 2005/040890 | 5/2005 |
| WO | 2005/059055 A2 | 6/2005 |
| WO | 2005/059654 A1 | 6/2005 |
| WO | 2005/098504 | 10/2005 |
| WO | 2005/098506 | 10/2005 |
| WO | 2005/598505 A1 | 10/2005 |
| WO | 2005111689 | 11/2005 |
| WO | 2006/005547 A1 | 1/2006 |
| WO | 2005001432 A2 | 1/2006 |
| WO | 2007/025643 A1 | 3/2007 |
| WO | 2007/086220 A1 | 8/2007 |

OTHER PUBLICATIONS

M: Switkes et al., Resolution Enhancement of 157-nm Lithography by Liquid Immersion, Proc.SPIE vol. 4691, Optical Microlithography XV, pp. 459365, Jul. 2002.

Tomoyuki Matsuyama et al., "Microlithographic Lens for DUV Scanner," SPIE vol. 4832, Dec. 2003, Conference Jun. 3-7, 2002, pp. 170-174.

Tomoyuki, Matsuyama et at., "High NA and Low Residual Aberration Projection Lens for DUVScanner," PSIE, vol. 4691 (2002, pp. 687-695.

Ulrich, W. et al., "Trends in Optical Design of Projection Lenses for UV-and 'EUV-Lithography,"Proc. Of SPIELvol. 4146 (2000).

Glatzel, E., "New Lenses for Microlithography," SPIE vol. 237 (1980), pp. 310-320.

J.J Shaffer et al., "Effect of Thermal Cycling on Dimensional Stability of Zerodur and ULE", Applied Optics, vol. 23, No. 14, Sep. 1, 1984.

"Expansion hysteresis upon thermal cycling of Zerodur", Jacobs et al., Applied Optics, vol. 23,No. 17, Sep. 1, 1984.

"Thermal expansion and length stability of Zerodur in dependence on temperature and time", Lindig et al., Applied Optics, vol. 24, No. 20, Oct. 15, 1985.

M. H. Freeman, Innovative Wide-Field Binocular Design, OSA Proceedings of the InternationalOptical Design Conference, 1994, pp. 389-393, vol. 22.

Tomoyuki Matsuyama et al., Nikon Projection Lens Update, Proceedings of SPIE, 2004, vol. 5377,No. 65.

Donald DeJager. Camera viewfinder using tilted concave mirror erecting elements, International LensDesign Conference (OSA), SPIE, 1980, pp. 292-298, vol. 237.

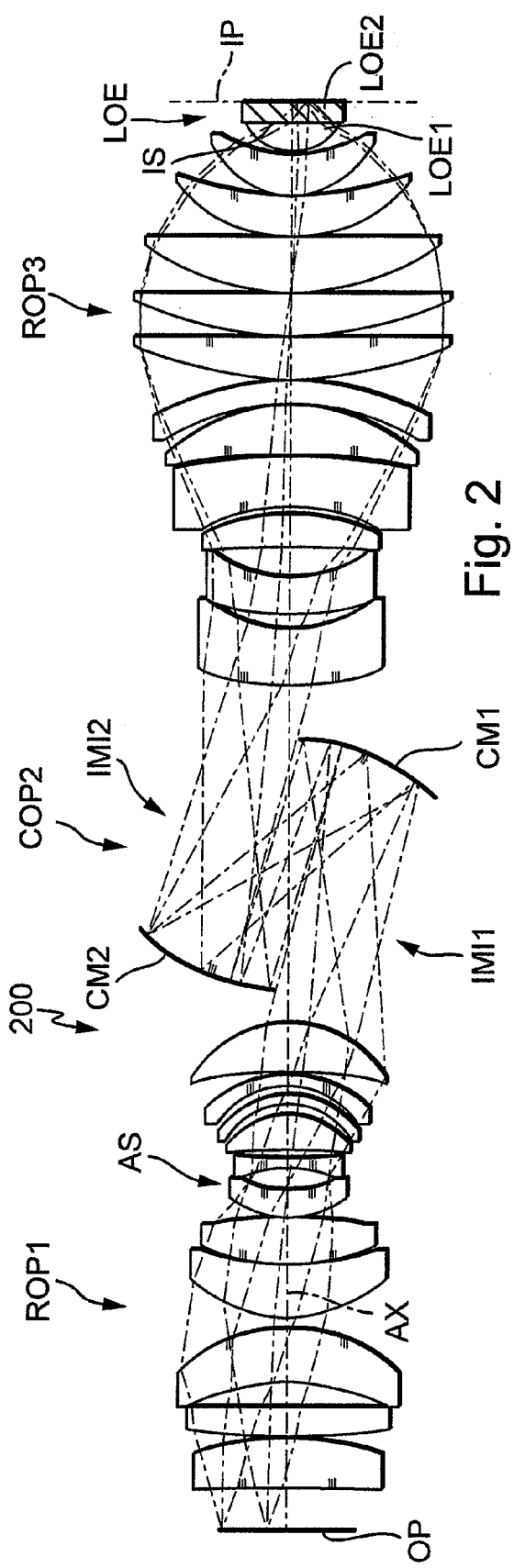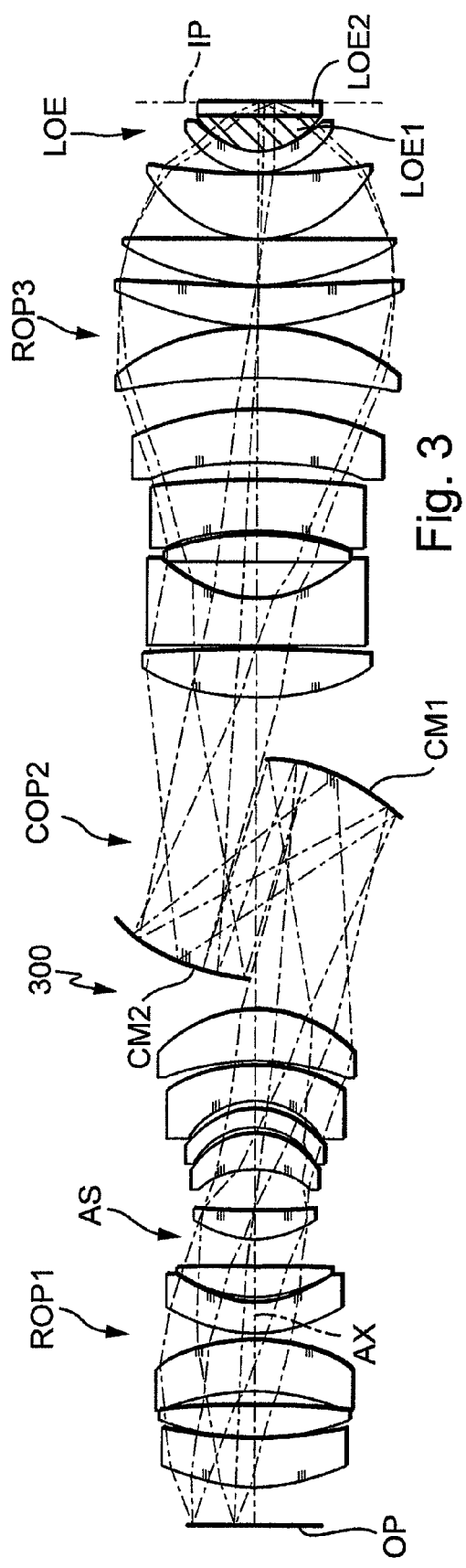

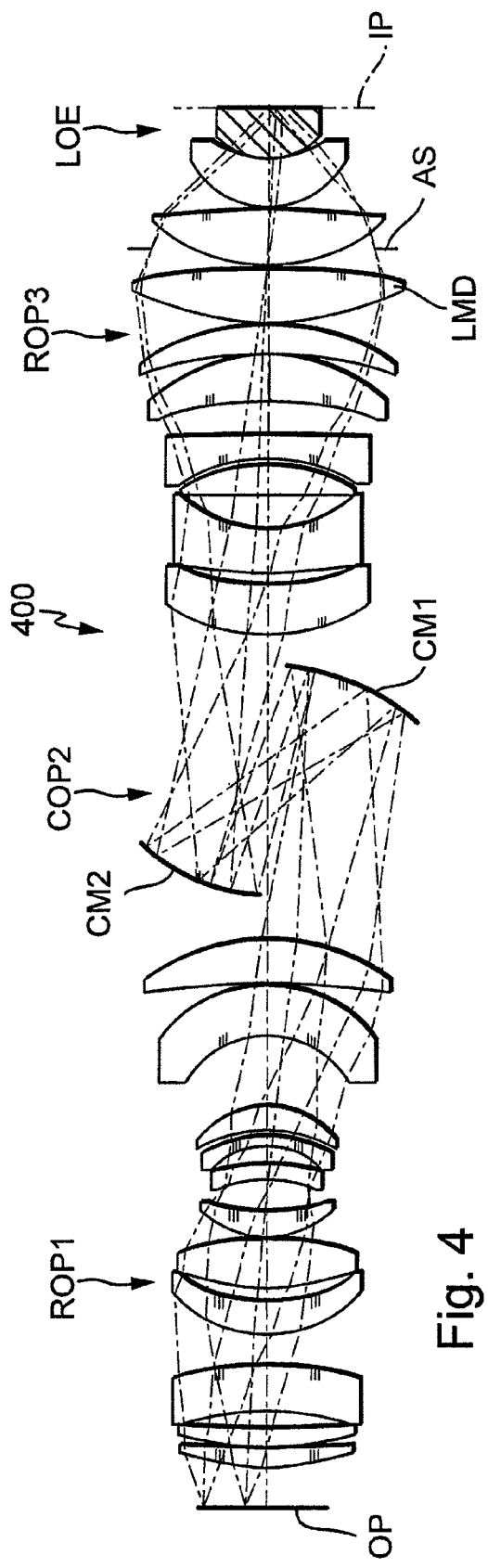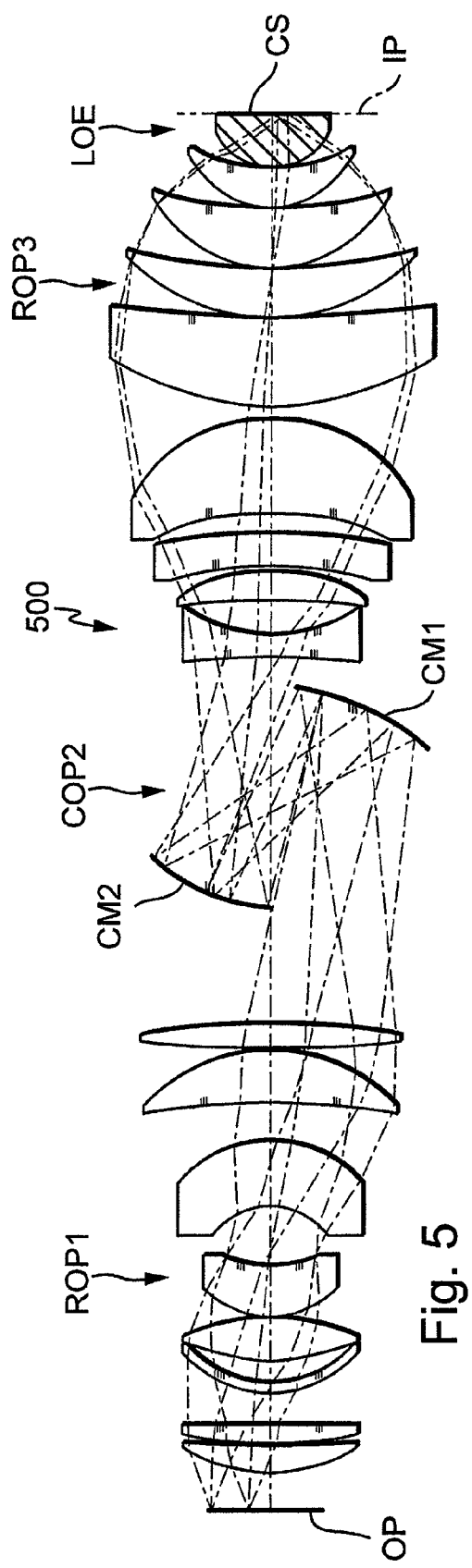
Fig. 4
Fig. 5

PROJECTION OBJECTIVE HAVING A HIGH APERTURE AND A PLANAR END SURFACE

This is a continuation of U.S. application Ser. No. 11/151,465, filed Jun. 14, 2005, now U.S. Pat. No. 7,466,489 which is a Continuation-in-Part Application of International Application No. PCT/EP2004/014062, filed Dec. 10, 2004, which was an international application of U.S. application Ser. No. 10/734,623, filed Dec. 15, 2003; the Continuation-in-Part Application claims the benefit of U.S. Provisional Application 60/587,504, filed Jul. 14, 2004, U.S. Provisional Application 60/591,775, filed Jul. 27, 2004, U.S. Provisional Application 60/592,208, filed Jul. 29, 2004, U.S. Provisional Application 60/612,823, filed Sep. 24, 2004, U.S. Provisional Application 60/617,674, filed Oct. 13, 2004, U.S. Provisional Application 60/658,417, filed Mar. 2, 2005, and German Patent Application DE 10 2004 051 730.4, filed Oct. 22, 2004; the International Application claims the benefit of U.S. Provisional Application 60/530,623, filed Dec. 19, 2003, U.S. Provisional Application 60/530,978, filed Dec. 22, 2003, U.S. Provisional Application 60/536,248, filed Jan. 14, 2004, U.S. Provisional Application 60/544,967, filed Feb. 13, 2004, U.S. Provisional Application 60/568,006, filed May 4, 2004, U.S. Provisional Application 60/587,504, filed Jul. 14, 2004, U.S. Provisional Application 60/591,775, filed Jul. 27, 2004, U.S. Provisional Application 60/592,208, filed Jul. 29, 2004, U.S. Provisional Application 60/612,823, filed Sep. 24, 2004, U.S. Provisional Application 60/617,674, filed Oct. 13, 2004, and German Patent Application DE 10 2004 051 730.4, filed Oct. 22, 2004.

BACKGROUND OF THE INVENTION

1. Field of the Invention

The present invention relates to a projection objective for imaging a pattern provided in an object plane of the projection objective onto an image plane of the projection objective. The projection objective may be used for microlithography projection exposure machines. The invention relates, in particular, to exposure machines for semiconductor structures which are designed for immersion operation, that is to say in an aperture range where the image side numerical aperture NA is greater than 1.0.

2. Description of the Related Art

In the case of reducing optical imaging, in particular of projection lithography, the image side numerical aperture NA is limited by the refractive index of the surrounding medium in image space. In immersion lithography the theoretically possible numerical aperture NA is limited by the refractive index of the immersion medium. The immersion medium can be a liquid or a solid. Solid immersion is also spoken of in the latter case.

However, for practical reasons the aperture should not come arbitrarily close to the refractive index of the last medium (i.e. the medium closest to the image), since the propagation angles then become very large relative to the optical axis. It has proven to be practical for the aperture not substantially to exceed approximately 95% of the refractive index of the last medium of the image side. This corresponds to propagation angles of approximately 72° relative to the optical axis. For 193 nm, this corresponds to a numerical aperture of NA=1.35 in the case of water ($n_{H2O}$=1.43) as immersion medium.

With liquids whose refractive index is higher than that of the material of the last lens, or in the case of solid immersion, the material of the last lens element (i.e. the last optical element of the projection objective adjacent to the image) acts as a limitation if the design of the last end surface (exit surface of the projection objective) is to be planar or only weakly curved. The planar design is advantageous, for example, for measuring the distance between wafer and objective, for hydrodynamic behaviour of the immersion medium between the wafer to be exposed and the last objective surface, and for their cleaning. The last end surface must be of planar design for solid immersion, in particular, in order to expose the wafer, which is likewise planar.

For DUV (operating wavelength of 248 nm or 193 nm), the materials normally used for the last lens are fused silica (synthetic quartz glass, $SiO_2$) with a refractive index of $n_{SiO2}$=1.56 or $CaF_2$ with a refractive index of $n_{CaF2}$=1.50. The synthetic quartz glass material will also be referred to simply as "quartz" in the following. Because of the high radiation load in the last lens elements, at 193 nm calcium fluoride is preferred for the last lens, in particular, since synthetic quartz glass would be damaged in the long term by the radiation load. This results in a numerical aperture of approximately 1.425 (95% of n=1.5) which can be achieved. If the disadvantage of the radiation damage is accepted, quartz glass still allows numerical apertures of 1.48 (corresponding to approximately 95% of the refractive index of quartz at 193 nm). The relationships are similar at 248 nm.

SUMMARY OF THE INVENTION

One object of the invention is to provide a high-aperture projection objective which circumvents the disadvantages of conventional designs with immersion media such as water or with lens materials such as fused silica and $CaF_2$. It is another object of the invention to provide projection objectives suitable for immersion lithography at image side numerical apertures of at least NA=1.35 having moderate size and material consumption.

As a solution to this and other objects, this invention, according to one formulation, provides a projection objective for imaging a pattern provided in an object plane of the projection objective onto an image plane of the projection objective suitable for microlithography projection exposure machines comprising: a plurality of optical elements transparent for radiation at an operating wavelength of the projection objective; wherein at least one optical element is a high-index optical element made from a high-index material with a refractive index n≧1.6 at the operating wavelength.

One embodiment consists in a radiation-proof lithography objective with image side numerical apertures which are preferably greater than or equal to NA=1.35 and for which at least the last lens element consists of a high-index material (refractive index n>1.6, in particular n>1.8). In the case of the reduction ratio, customary in lithography, of (absolute) 4:1 (|β|=0.25), the object-side (mask-side) numerical aperture is then $NA_{obj}$≧0.33, preferably $NA_{obj}$≧0.36.

Various aspects of the invention are explained below in more detail using exemplary embodiments for 193 nm. In the examples, a material used for the last lens element or a part thereof is sapphire ($Al_2O_3$), while the remaining lenses are made from fused silica. However, the examples can be transferred to other high-index lens materials and other wavelengths. For example, for 248 nm it is possible to use Germanium dioxide ($GeO_2$) as material for the last lens or a part thereof. By contrast with sapphire, this material has the advantage that it is not birefringent. However, the material is no longer transparent at 193 nm.

In the case of liquid immersion, an NA>1.35 may be reached if an immersion liquid with a higher refractive index than water is used. Cyclohexane (refractive index n=1.556) was used in some application examples.

Immersion media with n>1.6 are currently regarded as realistic.

If an immersion liquid is used, the thickness of the high-index liquid, that is to say the immersion liquid, can preferably be between 0.1 and 10 mm. Smaller thicknesses within this range may be advantageous since the high-index immersion media generally also exhibit a higher absorption.

In preferred embodiments, the projection objective has a last optical element closest to the image plane where that last optical element is at least partly made of a high-index material with refractive index n>1.6. In this case, the image-side numerical aperture NA may be extended close to the refractive index of the high-index material in certain cases. The last optical element may be a monolytic plano-convex lens made of the high-index material. In other embodiments, the last optical element consists of at least two optical elements in optical contact with each other along a splitting interface, where at least one of the optical elements forming the last optical element consists of a high-index material with refractive index n>1.6. Further degrees of freedom for the design may be obtained by using such a plano-convex composite lens.

The composite last optical element may have an entry-side plano-convex lens element having a curved entry surface and a planar exit surface and an exit-side plane parallel plate in optical contact with the plano-convex lens element along a planar splitting surface.

In other embodiments the last optical element includes a plano-convex composite lens having an image-side plano-convex second lens element having a curved entry surface and an essentially planar exit surface, and an object-side first lens element having a curved entry surface and a curved exit surface in optical contact with the curved entry surface of the first lens element. A curved splitting surface is obtained this way. Preferably, a first curvature radius R1 of the curved entry surface of the first lens element is larger than a second curvature radius R2 of the entry surface of the second lens element. A reduction in field dependent aberrations can be obtained this way. The first lens element may have a first refractive index n1 which is smaller than the second refractive index n2 of the second lens element such that the condition $\Delta n \geqq 0.25$ holds for a refractive index difference $\Delta n = n2-n1$. A stepwise increase of refractive index in light propagation direction is thereby obtained close to the image surface.

A high-index crystalline material is preferably used for the second lens element positioned on the image-side, whereas the first lens element (on the object-side) is preferably made from a glassy material. The crystalline material may be chosen from the group consisting of aluminum oxide ($Al_2O_3$), beryllium oxide (BeO), magnesium aluminum oxide ($MgAlO_4$, spinell), magnesium oxide (MgO), yttrium aluminum oxide ($Y_3Al_5O_{12}$), yttrium oxide ($Y_2O_3$) and lanthanum fluoride ($LaF_3$). Silicon dioxide (fused silica, $SiO_2$) is preferably used for the first lens element.

The first and second lens element may be optically contacted by wringing. However, problems due to differences in thermal expansion coefficients of the first and second lens element may arise at an interface formed by wringing. Therefore, in some embodiments, an immersion medium having refractive index $n_I$ is disposed in a gap between the exit surface of the first lens element and the entry surface of the second lens element, whereby these lens elements can be mechanically decoupled. Immersion liquids having a refractive index in the range $1.3 \leqq n_I \leqq 1.6$ may be used for that purpose. A small gap width may be preferable such that a maximum gap width GW in the range $50\,\mu m \leqq GW \leqq 2$ mm is obtained. Here, the gap width is defined for each point on the curved entry surface of the second lens element as the minimum distance to a corresponding point on the exit surface of the first lens element.

In some embodiments designed for very high image-side numerical apertures $NA \geqq 1.6$, e.g. with $1.7 \leqq NA \leqq 1.8$ it has been found beneficial if the last optical element includes a hyper-hemispherical lens having a curved entry surface with curvature radius R2, an essentially planar exit surface, and an axial lens thickness T defined as a distance between the entry surface and the exit surface measured along the optical axis of the lens, where T>R2. In this case, the center of curvature of the entry surface lies within the lens at a distance T−R2 from the exit surface. The shape of the hyper-hemispherical lens may be a combination of a hemispherical section and a cylindrical section having a radius equal to the radius of curvature of the hemispherical section. In other embodiments, the hyper hemispherical lens has a spherical entry surface extending spherically beyond a central section plane through the center of curvature of the spherical entry surface and aligned perpendicular to the optical axis of the lens. Such lens may be manufactured in a two-step process, where the first step includes forming a sphere from the desired lens material, e.g. a crystalline material having NA>1.6, and a second step of forming a planar exit surface on that lens element by removing a spherical calotte from that sphere, e.g. by cutting. The hyper-hemispherical lens may be used to form the image-side second lens element of a composite plano-convex last optical element described above.

In some embodiments, particularly where a very high image-side numerical aperture such as NA=1.5 or above is desired, it has been found useful to have a spatially dense sequence of aspheric lens surfaces in selected regions of the projection objective, e.g. close to the object surface and/or close to the image surface. To that end, preferred embodiments of projection objectives include at least one aspheric lens group consisting of a number $N_{ASPL}$ of at least two immediately consecutive aspheric lenses providing a number $N_{ASP}$ of aspheric lens surfaces, where the condition AR>1 holds for an asphere ratio $AR=N_{ASP}/N_{ASPL}$. With other words: within an aspheric lens group obeying this condition, the number of aspheric surfaces is higher than the number of aspheric lenses. As a consequence, at least one "double asphere" is formed within the aspheric lens group. The term "double asphere" as used here describes a situation where two aspherical lens surfaces are directly following each other along the optical path. The double asphere may be formed by facing aspherical surfaces of two separate, neighbouring lenses or by a double aspherical lens (biasphere) where both lens surfaces are aspherical surfaces. The aspheric lens group may also include at least one triple asphere (three immediately consecutive aspherical surfaces), or higher order multiple aspheres where e.g. 4, 5, 6 or more immediately consecutive aspherical surfaces may be present.

In some embodiments exactly one spherical surface may be present within an aspheric lens group such that a sequence aspheric-spheric-aspheric is formed within that asperic lens group. In these cases, the condition $N_{ASP}=2 \cdot N_{ASPL}-1$ is fulfilled. Depending on requirements, the number of aspherical lenses $N_{ASPL}$ may be two or three or four or five, for example. Due to the high spatial density of aspheric surfaces within the aspheric lens group, the aspheric lens group will also be denoted "high aperture density lens group" or "HADLG" in the following.

An image-side aspheric lens group with high aspheric density (HADLG) may be arranged immediately upstream of the last optical element, i.e. optically close to the image surface. The aspherical lens surfaces of the aspheric lens group may be designed such that the correction of spherical aberration and oblique spherical aberration (tangential and sagittal) may be effected and at the same time the sine condition is essentially fulfilled for a large aperture. At least one double asphere is preferably provided, where more preferably at least three or at least four immediately consecutive aspheric lens surfaces are provided immediately upstream of the last optical element.

Further, it may be desirable to provide an object-side aspheric lens group arranged immediately downstream of the object-surface and designed as a high aspheric density lens group as described above. The aspheric surfaces may be designed particularly to correct for distortion and to provide object-side telecentricity at high entry-side numerical apertures. Preferably, at least three consecutive aspheric lens surfaces may be provided, where four or more consecutive aspheric lens surfaces may be useful to correct for very complex wavefront deformations having short periodicity in a pupil surface.

The previous and other properties can be seen not only in the claims but also in the description and the drawings, wherein individual characteristics may be used either alone or in sub-combinations as an embodiment of the invention and in other areas and may individually represent advantageous and patentable embodiments.

BRIEF DESCRIPTION OF THE DRAWINGS

FIG. 2 is a longitudinally sectioned view of a second embodiment of a catadioptric projection objective according to the invention;

FIG. 3 is a longitudinally sectioned view of a third embodiment of a catadioptric projection objective according to the invention;

FIG. 4 is a longitudinally sectioned view of a fourth embodiment of a catadioptric projection objective according to the invention;

FIG. 5 is a longitudinally sectioned view of a fifth embodiment of a catadioptric projection objective according to the invention;

DETAILED DESCRIPTION OF THE PREFERRED EMBODIMENTS

In the following description of preferred embodiments of the invention, the term "optical axis" shall refer to a straight line or sequence of straight-line segments passing through the centers of curvature of the optical elements involved. The optical axis can be folded by folding mirrors (deflecting mirrors). In the case of those examples presented here, the object involved is either a mask (reticle) bearing the pattern of an integrated circuit or some other pattern, for example, a grating pattern. In the examples presented here, the image of the object is projected onto a wafer serving as a substrate that is coated with a layer of photoresist, although other types of substrate, such as components of liquid-crystal displays or substrates for optical gratings, are also feasible.

Where tables are provided to disclose the specification of a design shown in a figure, the table or tables are designated by the same numbers as the respective figures.

Figure 1:
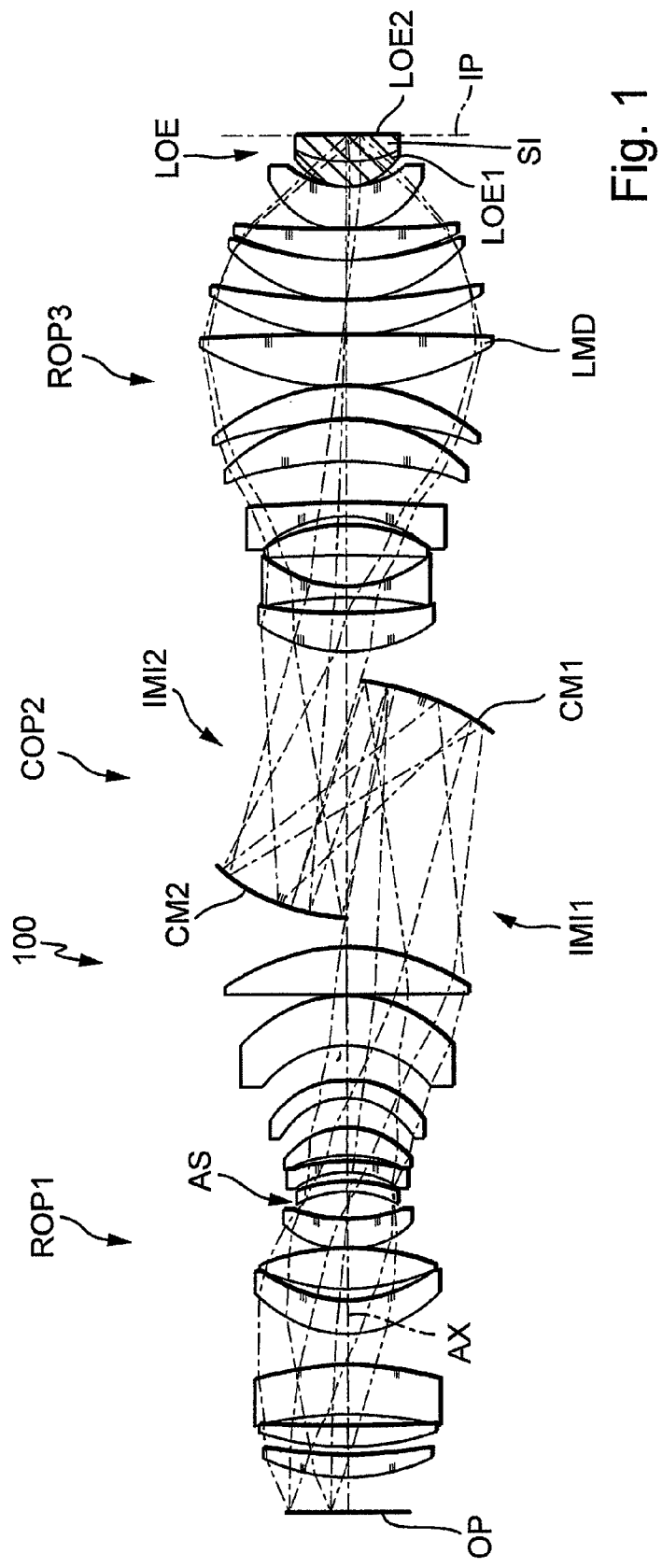
FIG. 1 is a longitudinally sectioned view of a first embodiment of a catadioptric projection objective according to the invention.

FIG. 1 shows a first embodiment of a catadioptric projection objective 100 according to the invention designed for ca. 193 nm UV working wavelength. It is designed to project an image of a pattern on a reticle (or mask) arranged in the object plane OP into the image plane IP on a reduced scale, for example, 4:1, while creating exactly two real intermediate images IMI1 and IMI2. A first refractive objective part ROP1 is designed for imaging the pattern in the object plane into the first intermediate image IMI1, a second, catoptric (purely reflective) objective part COP2 images the first intermediate image IMI1 into the second intermediate image IMI2 at a magnification close to 1:1, and a third, refractive objective part ROP3 images the second intermediate image IMI2 onto the image plane IP with a strong reduction ratio. The second objective part COP2 comprises a first concave mirror CM1 having the concave mirror surface facing the object side, and a second concave mirror CM2 having the concave mirror surface facing the image side. The mirror surfaces are both continuous or unbroken, i.e. they do not have a hole or bore. The mirror surfaces facing each other define an intermirror space, enclosed by the curved surfaces defined by the concave mirrors. The intermediate images IMI1, IMI2 are both situated geometrically inside the intermirror space, at least the paraxial intermediate images being almost in the middle thereof well apart from the mirror surfaces.

Each mirror surface of a concave mirror defines a "curvature surface" or "surface of curvature" which is a mathematical surface extending beyond the edges of the physical mirror surface and containing the mirror surface. The first and second concave mirrors are parts of rotationally symmetric curvature surfaces having a common axis of rotational symmetry.

The system 100 is rotational symmetric and has one straight optical axis AX common to all refractive and reflective optical components. There are no folding mirrors. The concave mirrors have small diameters allowing to bring them close together and rather close to the intermediate images lying in between. The concave mirrors are both constructed and illuminated as off-axis sections of axial symmetric surfaces. The light beam passes by the edges of the concave mirrors facing the optical axis without vignetting.

Catadioptric projection objectives having this general construction are disclosed e.g. in the U.S. provisional applications with Ser. Nos. 60/536,248 filed on Jan. 14, 2004, 60/587,504 filed on Jul. 14, 2004 and a subsequent extended application filed on Oct. 13, 2004. The contents of these applications is incorporated into this application by reference. It is one characterizing feature of this type of catadioptric projection objectives that pupil surfaces (at axial positions where the chief ray intersects the optical axis) are formed between the object plane and the first intermediate image, between the first and the second intermediate image and between the second intermediate image and the image plane and that all concave mirrors are arranged optically remote from a pupil surface, particularly at positions where the chief ray height of the imaging process exceeds a marginal ray height of the imaging process. Further, it is preferred that at least the first intermediate image is located geometrically within the intermirror space between the first concave mirror and the second concave mirror. Preferably, both the first intermediate image and the second intermediate image are located geometrically within the intermirror space between the concave mirrors.

The exemplary examples described below share these basic characteristics which allow immersion lithography at numerical apertures NA>1 with optical systems that can be built with relatively small amounts of optical material.

FIG. 1 shows as first exemplary embodiment a lithography objective for 193 nm with a sapphire lens and cyclohexane as immersion medium in conjunction with an image-side numerical aperture of NA=1.45. The sapphire lens is the last optical element LOE closest to the image plane. The image-side working distance is 1 mm. The catadioptric design has two concave mirrors, chiefly for chromatic correction and Petzval correction, and an intermediate image respectively upstream and downstream of the pair of mirrors. The intermediate images are, however, not fully corrected and serve primarily for the geometrical limitation of the design and for separating two beam paths running toward a mirror and running from a mirror after reflection thereupon. The image field (on the wafer) is rectangular. The external field radius (on the wafer side) is 15.5 mm, the inner one 4.65 mm. The result of this is a rectangular field of 26×3.8 mm.

The aperture diaphragm (aperture stop AS, system aperture) is arranged in the first refractive objective part ROP1 in the first exemplary embodiment. This is advantageous in order, on the one hand, to fashion a smaller variable aperture diaphragm, and on the other hand largely to protect the subsequent objective parts (seen from the object plane (mask plane)) against useless and interfering radiation loads when stopping down the aperture diaphragm. The rear diaphragm plane in the image-side objective part ROP3, i.e. a position where an aperture stop could be placed, is positioned in a region between the lens of maximum diameter LMD and the image plane IP in the convergent beam path.

Formed in the object-side front refractive partial objective ROP1 is a waist (constriction of the beam and lens diameters) which serves primarily for correcting the image field curvature (Petzval sum). The aperture stop AS is arranged at the waist.

The use of $CaF_2$ for the last lens is not to be preferred, since this requires a numerical aperture that is as far as possible not greater than 1.425 (~95% of the refractive index of $CaF_2$). At 193 nm, sapphire ($Al_2O_3$) is used in this example as high-index material in the last lens element LOE. In all embodiments shown in the figures optical elements made of sapphire are shaded gray for easier reference.

The birefringence occurring when sapphire is used is largely compensated by splitting the last lens (last optical element LOE) into two lens elements LOE1 and LOE2 and rotating the two lens elements relative to one another around the optical axis. In this case, the separation interface SI (contact surface of the two lens elements LOE1 and LOE1) is preferably curved such that both lens elements have similar refractive power. Alternatively, it is possible to use for the compensation a second element made from sapphire which is located at a site in the objective which acts similarly in optical terms, for example in the vicinity of the intermediate images or in the vicinity of the object plane. In the present case, the last sapphire lens LOE is split into two lens elements LOE1 and LOE2 which act virtually identically. The front radius of the sapphire lens LOE (i.e. the radius of the light entry side) is designed such that an aperture beam, i.e. a beam running towards the image at the perimeter of the convergent light bundle, toward the center of the image field passes through the interface virtually without being refracted, that is to say strikes the interface virtually perpendicularly (lens radius is virtually concentric with the point of intersection of the image plane with the optical axis). The radius of the splitting interface SI between the two lens elements of the split sapphire lens is flatter (radius>1.3 times the distance from the image plane where a wafer can be placed).

Compensation of birefringence effects by relative rotation of elements made of birefringent material is described in detail e.g. in patent applications DE 101 23 725 A1 (corresponding e.g. to US 2004/0190151 A1) or WO 03/077007 A2 by the applicant. Catadioptric projection objectives having a final lens element closest to the image plane designed as a split final lens made from a birefringent material (calcium fluoride) are known from U.S. Pat. No. 6,717,722 B.

The specifications for the design of FIG. 1 are summarized in Table 1. The leftmost column lists the number of the refractive, reflective, or otherwise designated surface, the second column lists the radius, r, of that surface [mm], the third column lists the distance, d [mm], between that surface and the next surface, a parameter that is referred to as the "thickness" of the optical element, the fourth column lists the material employed for fabricating that optical element, and the fifth column lists the refractive index of the material employed for its fabrication. The sixth column lists the optically utilizable, clear, semi diameter [mm] of the optical component. In the tables, a radius value r=0 is given for planar surfaces having infinite radius.

In the case of this particular embodiment, fifteen surfaces are aspherical surfaces. Table 1A lists the associated data for those aspherical surfaces, from which the sagitta of their surface figures as a function of the height h may be computed employing the following equation:

$$p(h)=[((1/r)h^2)/(1+SQRT(1-(1+K)(1/r)^2h^2))]+C1 \cdot h^4+ C2 \cdot h^6+\ldots,$$

where the reciprocal value (1/r) of the radius is the curvature of the surface in question at the surface vertex and h is the distance of a point thereon from the optical axis. The sagitta p(h) thus represents the distance of that point from the vertex of the surface in question, measured along the z-direction, i.e., along the optical axis. The constants K, C1, C2, etc., are listed in Table 1A.

Likewise, the specifications of the following embodiments are represented in similar manner in tables 2, 2A for FIG. 2, tables 3, 3A for FIG. 3, tables 4, 4A for FIG. 4 and tables 5, 5A for FIG. 5.

In accordance with the projection objective 200 according to FIG. 2 the last optical element LOE on the image side has the overall shape of a plano-convex lens. The lens is subdivided into two optical elements LOE1 and LOE2 which are contacted along a plane splitting interface SI. Specifically, a quartz glass lens LOE1 with a positive radius of curvature of the entry surface and a rear planar surface is wrung onto one (or two) plane-parallel plates LOE2 made from sapphire. This yields values of NA no higher than possible in quartz glass, but there is the advantage that the angle of propagation of the light beams is reduced in the last objective part where the aperture is greatest owing to the high-index medium. This is advantageous when considering the reflection losses and scattered light effects at the interface and at possible protective layers on the last end surface, which constitute a problem for these otherwise very large angles of propagation. The largest angles then occur only at the wrung surface between the quartz lens LOE1 and the first high-index plane-parallel plate LOE2. This wrung surface (contact interface where the adjacent optical elements are adhered to each other by wringing) is protected against contamination and damage, and can be designed with a coating which is sensitive to environmental influences as well. If two plane-parallel plates are used to form the plane-parallel high-index element LOE2, then the two plane-parallel plates made from sapphire can be rotated relative to one another around the optical axis virtually ideally to compensate the birefringence effect for the S- and P-polarisations in the x- and y-directions which are chiefly required for imaging the semiconductor structures.

However, because of its lower refractive index, the quartz lens LOE1 has the effect here that—because of its lesser collecting effect—very large lens diameters are required even for image-side numerical apertures of a projection objective of limited overall length which are not really so large. In the second exemplary embodiment (FIG. 2), the aperture is NA=1.35, but the lens diameters are greater than in the first exemplary embodiment. Here, the lens diameter is already over 143 mm and thus virtually 212 times the numerical aperture, while in the exemplary embodiment in FIG. 1 only 200 times the numerical aperture is reached. In particular, in the exemplary embodiment in FIG. 2 at 143 mm the maximum half lens diameter is even greater than the mirror semidiameter at approximately 136 mm.

In order to minimize the diameter of the largest lens elements of the projection objective, and at the same time to minimize the effect of the birefringence, in an alternative embodiment (projection objective 300) of the design example with NA=1.45 the last lens element LOE comprises a thin sapphire lens LOE1 with positive refractive power, a spherically curved entry surface and a planar exit surface, which is wrung onto a thin quartz glass plate LOE2 (exemplary embodiment 3 in FIG. 3). The plane-parallel quartz glass plate providing the exit surface of the objective can then be interchanged upon the occurrence of damage owing to the radiation load. A wrung quartz plate therefore also acts as interchangeable protection of the sapphire lens LOE1 against contamination and/or scratches or destruction. Embodiment 3 is adapted to Cyclohexane as an immersion fluid, which has a refractive index (n=1.556) similar to that of fused silica (n=1.560) used for the plate in contact with the immersion fluid.

In these cases, the NA is limited by the refractive index of the quartz glass. However, by comparison with a design having a last lens made from pure quartz glass the result upstream of the last lens is smaller beam angles and therefore also smaller diameters of the overall objective and lower sensitivities (interference susceptibilities to manufacturing tolerances) of the last lens element. In embodiment 3, at 135 mm the maximum lens diameter is now approximately 186 times the numerical aperture.

Of course, the present invention can also be used for objectives of low numerical aperture, in order to reduce substantially the diameter of previous projection objectives. This advantageously affects the price of the projection objective, since the amount of material can be reduced substantially.

The exemplary fourth embodiment (FIG. 4) shows a lithography objective 400 for 193 nm with a monolithic last lens made of sapphire and water ($n_{H2O}$=1.43) as immersion medium for NA=1.35 with a working distance of 1 mm. The top side (entrance side) of the monolithic (one part, not split) sapphire lens LOE is aspheric, and the aperture stop AS is situated in the rear part of the image side refractive objective part ROP3 in the region of convergent radiation between the region of largest beam diameter in the third objective part ROP3 at biconvex lens LMD with largest diameter and the image plane IP. The maximum lens diameter is limited to less than 190 times the numerical aperture.

Even higher numerical apertures than NA=1.45 are possible with the aid of high-index materials for at least the last lens element.

The fifth exemplary embodiment 500 (FIG. 5) is designed for solid immersion (contact projection lithography) with a piano-convex sapphire lens LOE ($n_{sapphire}$=1.92) for an NA=1.6. Consequently, even numerical apertures of up to NA>1.8 are feasible in principle. In the example, the outer field radius on the wafer side is at 15.53 mm, and the inner one is at 5.5 mm, that is to say the size of the rectangular field here is 26×3 mm.

Since the high-aperture beams with apertures of NA>0.52 experience total reflection upon transition from sapphire to air at the plane exit surface, working distances of less than the wavelength must be realized for solid immersion in order to efficiently use evanescent waves for the exposure of the wafer. This can be performed in vacuo by bringing the wafer to be exposed constantly to, for example, 100 nm (≈λ/2) in the vicinity of the last lens surface.

However, since on the basis of the power transmission, which drops exponentially with distance, through evanescent fields small changes in distance result in strong fluctuations in uniformity, it is advantageous to bring the wafer into direct mechanical contact with the last end surface (exit surface) of the projection objective. To be exposed, the wafer can be wrung onto the last planar lens surface (contact surface CS) for this purpose in order to obtain a mechanical contact between the exit surface of the projection objective and the incoupling surface associated to the substrate. A step-and-scan mode or stitching methods of exposure is to be preferred in this case, that is to say larger regions than the image field are exposed in individual steps, the reticle mask being correspondingly adjusted for alignment instead of, as previously customary, the wafer. This is also advantageous because owing to the reducing imaging the reticle can be adjusted with less accuracy than an adjustment of the wafer. Mutually adjoining exposure regions (target areas) or sequential levels of the semiconductor structure from subsequent exposure steps are thereby brought into overlay by lateral and axial movement and rotation of the reticle mask in order thereby to expose the semiconductor structures onto the possibly also defectively wrung wafers with an overlay accuracy of better than a few nm. Alignment marks, for example, of the reticle are brought into agreement for this purpose with alignment marks already exposed on the wafer.

The release of the wafer from the last surface is preferably performed in vacuo. If required, there is located between the wafer and last planar lens surface a thin layer (pellicle/membrane) which can be exchanged after each exposure step, for example. This membrane can, for example, also remain bonded on the wafer and assist in the separation and serves, in particular, as protection for the last planar lens surface. The latter can optionally be protected in addition by a thin protective layer.

In the case of solid immersion, standing waves of high intensity can be produced during the exposure in the edge region of the last lens surface owing to the instances of imaging interference. It is therefore even advantageous for the repeated exposure of a structure onto a wafer when the wafer is inaccurately positioned by chance in certain ranges of a few micrometers owing to the wringing, something which is compensated by adjustment using the reticle in order to prevent systematic structures from being burnt into the last lens.

If it is desired to obtain resolutions at the 32 nm-node at 193 nm image-side numerical apertures $1.7 \leq NA \leq 1.75$ are desirable. Typical resist materials available for that wavelength have refractive indices in that range, i.e. $1.7 \leq n \leq 1.75$. If resist materials with high index close to $n=1.75$ can be used, sufficient light energy can be coupled into the resist material at e.g. $NA=1.73$ using immersion techniques or projection across the optical near field. In the following, technical measures are presented which contribute to obtaining NA values in the desired range, particularly for catadioptric in-line projection objectives exemplarily shown above.

One contribution for obtaining very high NA is concerned with improving the construction of the last optical element in order to accommodate extremely high aperture angles. Another contribution concerns the use of aspheric lens surfaces within the optical system.

Figure 6:
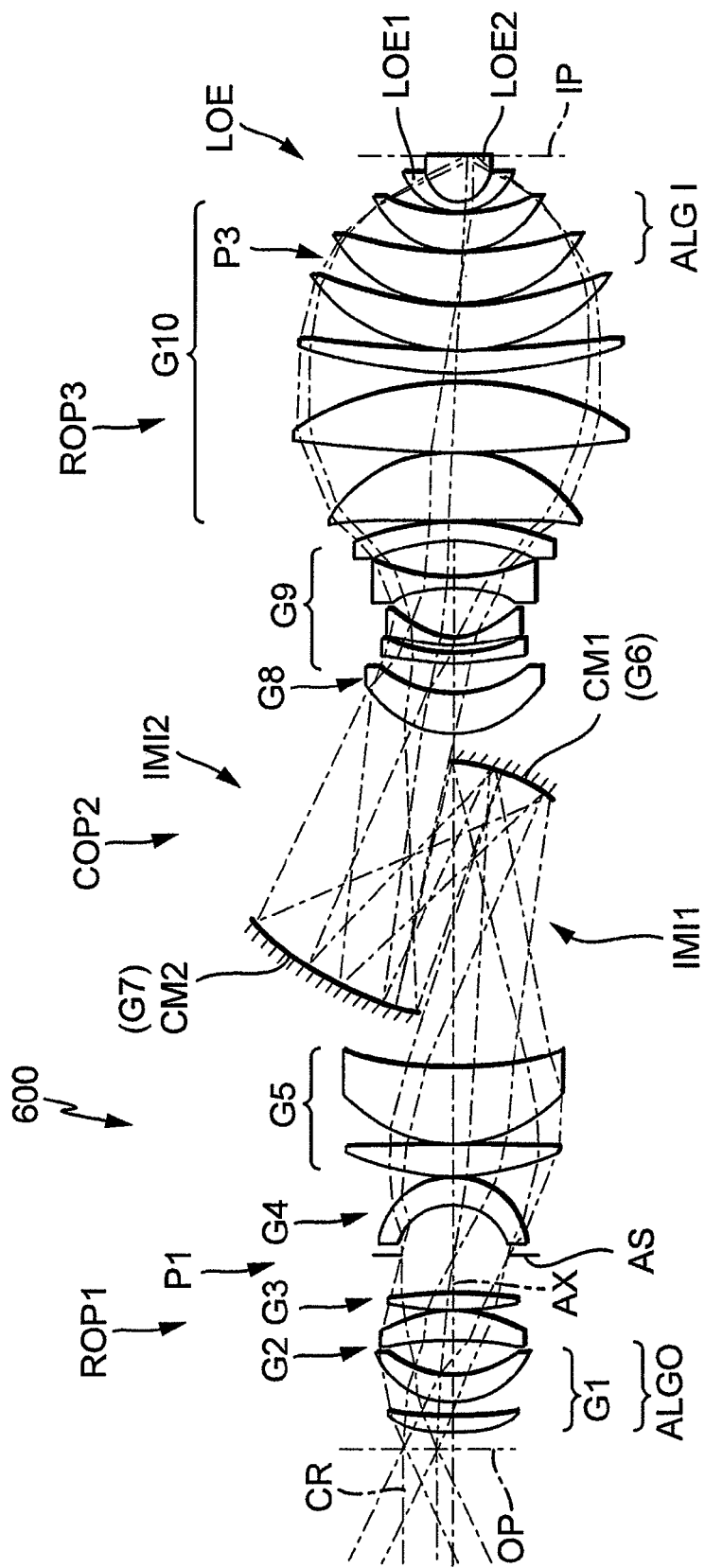
FIG. 6 is a longitudinally sectioned view of a sixth embodiment of a catadioptric projection objective according to the invention.

FIG. 6 shows a meridional lens section of a sixth exemplary embodiment of a projection objective 600 designed for microlithography at 193 nm at an image-side working distance of 1 mm and having an image-side numerical aperture $NA=1.73$ at an image field size 4 mm·20 mm, where the off-axis rectangular image field lies at a distance 4,375 mm outside the optical axis. The track length (axial distance between object plane and image plane) is 1308.7 mm. The optical correction for aberrations is characterized by a wavefront error (RMS) smaller than 7.0 mλ. The optical element closest to the image plane (see detail in FIG. 9) is made of sapphire, where the crystallographic axis CA of the optically uniaxial material is aligned parallel to the optical axis of the lens element. In the optical calculations, the refractive index of the ordinary beam ($n_o$) is used in connection with tangential polarization of the projection radiation. The specification is given in tables 6, 6A.

One problem addressed in this embodiment is the radius of curvature (curvature radius) of the entry surface of the last optical element, which should be quite short to accommodate a high NA without causing intolerable aberrations. In relation to the desired size of the image field a longer curvature radius would be desirable to avoid or minimize field dependent aberrations. Providing a larger curvature radius, however, would require a large thickness of the last optical element (where the thickness is the axial distance between the entry side of a lens and the exit side of a lens measured along the optical axis). In order to address these problems, the last optical element LOE of the embodiment is a plano-convex composite lens having an image-side piano-convex second lens element LOE2 having a curved entry surface and an essentially planar exit surface and an object-side first lens element LOE1 having a curved entry surface and a curved exit surface in optical contact with the curved entry surface of the second lens element LOE2. The first curvature radius R1 of the curved entry surface of the first lens element LOE1 is larger than the second curvature radius R2 of the entry surface of the second lens element LOE2. Whereas the second lens element LOE2 closest to the image plane is made of sapphire having a high first refractive index $n2=1.92$, the first lens element is made of fused silica having a smaller first refractive index $n1=1.52$ such that a refractive index difference $\Delta n=n2-n1=0.40$. In this configuration, the convex entry surface on the first lens element LOE1 with longer radius provides partly the corrective effect which a longer radius of the second optical element LOE2 would have had.

Different ways of contacting the first and second lens element of the last optical element along their curved contacting surfaces are possible. In an embodiment (not shown) the lens elements are contacted by wringing. However, problems may arise due to a difference in thermal expansion coefficient between the crystalline material of the image-side second lens element and the glassy material of the object-side first element. The thermal expansion coefficient of fused silica is about $0.52 \cdot 10^{-6}$ m/K. In contrast, the thermal expansion coefficient of suitable crystalline materials is much higher, typically by a factor of at least 10. The following table lists a number of suitable crystalline materials transparent at 193 nm (left column) and their respective linear thermal expansion coefficients $\beta_\parallel$ parallel to the crystallographic axis (middle column) and $\beta_\perp$ perpendicular to the crystallographic axis (right column) in terms of $10^{-6}$ m/K.

| Material | $\beta_\parallel$ [$10^{-6}$ m/K] | $\beta_\perp$ [$10^{-6}$ m/K] |
| --- | --- | --- |
| $Al_2O_3$ | 6.65 | 7.15 |
| BeO | 5.64 | 7.47 |
| $MgAlO_4$ | 6.97 | 9.4 |
| MgO | 10.6 | 10.6 |
| $Y_3Al_5O_{12}$ | 7.7 | 7.7 |
| $Y_2O_3$ | 6.56 | 6.56 |
| $LaF_3$ | 15.8 | 11.0 |

In view of the differences in thermal expansion, an immersion medium having a refractive index n1 is disposed in a gap (gap width GW=0.2 mm) between the exit surface of the first lens element and the entry surface of the second lens element such that the optical contact is provided through the immersion liquid IL. Preferably $1.3 \leq n_I \leq 1.6$, in the embodiment $n_I=1.561$. It has been found that a plano-convex composite lens including an object-side negative meniscus having image-side concave surface made from a glassy material, and an image-side plano-convex lens element made from a high-index crystalline material having a refractive index difference of at least $\Delta n=0.25$ optically contacted by an immersion liquid is capable of transporting very high numerical apertures, such as NA>1.6 or NA>1.7 without inducing significant aberration contributions. Such composite lens may be used in any type of projection objective capable of providing image-side numerical apertures in that range.

Residual aberrations may be left. Particularly, correction of spherical aberration and oblique spherical aberration (tangential and sagittal) in conjunction with obeying the sine condition impose a serious challenge. It has been found that it may be beneficial to provide a large spatial density of aspheric surfaces close to the last optical element particularly to obtain a magnification factor which is essentially constant across the image field. To that end, an image-side aspherical lens group ALGI is arranged immediately upstream of the last optical element LOE consisting of two positive meniscus lenses having image-side concave surfaces, where each of that lenses is a "biasphere" having aspheric entry and exit surface such that four immediately consecutive aspheric lens surfaces are provided immediately upstream of the last optical element LOE. With $N_{ASPL}=2$ and $N_{ASP}=4$, the asphere ratio AR=2. In other embodiments, three out of four lens surfaces immediately upstream of the last optical element are aspheric.

Other aberration problems are to be solved on the object-side of the projection objective, where the design of lenses immediately downstream of the object plane is optimized to provide object-side telecentricity and very low level of distortion. The entry side part of the first refractive objective part ROP1 arranged between object plane and the first pupil surface P1 (where the chief ray CR intersects the optical axis AX) is functionally subdivided into three groups G1, G2, G3, where each group consists of one or more lenses. No negative lenses are provided upstream of the aperture stop. A first group G1 is formed by two positive biaspherical meniscus lenses, where the curvature radius of the local curvature at the vertex and outside the optical axis are on the image-side primarily to secure object-side telecentricity. The second group G2, formed by one single positive lens G2 having aspherical entry sine and spherical exit side, is designed such that the center of curvature of local radii of curvature are on the object-side at least for the outer parts of the lens surfaces at more than 70% of the maximum height. In the case of aspherical lens surfaces, it is preferred that the local curvature increases substantially towards the edge of the lens for lens heights beyond 90% maximum height. Preferably, the radius of curvature R is shortened, or the curvature 1/R is increased from the center (on the optical axis) towards the edge by at least 30%. An object-side aspheric lens group ALGO having five immediately consecutive aspheric lens surfaces is thereby provided. For smaller apertures four or three consecutive aspherical lens surfaces may be sufficient.

A third group G3 is formed by one positive lens designed primarily for correcting spherical aberrations. Due to the high object-side numerical aperture this correction becomes extremely difficult. Therefore it is preferred to use a biaspherical lens immediately upstream of the first pupil surface where the aperture stop AS is positioned. The refractive power of this lens group is preferably decreasing from the center to the edge of the lens to provide the required amount of spherical overcorrection. Such lenses are preferably positioned at a distance from the aperture stop being less than the diameter of the aperture stop.

A fourth lens group G4 immediately downstream of the first pupil surface P1 is designed as a positive meniscus lens having an object-side concave entry surface, where the thickness of that meniscus lens is preferably less than 60% of the diameter. One or more meniscus lenses in that region immediately following the first pupil surface may be designed to primarily correct image shell differences and field dependent aberrations. The curvature radius is preferably smaller than 1.2 times the diameter of that lens.

A lens group G5 having overall positive refractive power is provided immediately upstream of the first concave mirror CM1 to converge radiation towards that mirror. Each lens element of the fifth lens group has a mean radius of curvature, $R_M = 1/(1/R1 + 1/R2)$ with the center of curvature on the image-side, where R1 and R2 are the radius of curvature of the entry side and exit side of the lens, respectively. Preferably, the last lens before the first concave mirror CM1 is a biaspheric lens with strong correcting effect.

The second, catoptric (purely reflective) objective part COP2 is formed by two aspheric concave mirrors CM1, CM2 (forming groups G6 and G7, respectively) and serves as an imaging subsystem to image the first intermediate image IMI1 onto the second intermediate image IMI2, which is strongly aberrated.

A lens group G8 immediately following the second concave mirror is formed by a single positive meniscus lens having an image-side concave surface. A lens group G9 having four consecutive negative lenses disposed with opposing sense of bending around a biconcave negative lens provides overcorrection for the subsequent positive lenses of the lens group G10, which is designed primarily to provide the high image-side numerical aperture. The mirror symmetry of the bending of positive lenses immediately upstream and downstream of the negative group G9 provides an essentially symmetric distribution of refractive power allowing to minimize asymmetric imaging errors over the field. It has been found that a dense sequence of aspheric lens surfaces within the negative lens group G9 is beneficial for providing the required complex correcting effect of that lens group. Therefore, at least three or at least four consecutive aspheric lens surfaces are considered beneficial in that region. In the embodiment, five consecutive aspheric lens surfaces are provided in a region where large angles of incidence occur, whereby a complex distribution of refractive power across the beam diameter is obtained.

The optical effect of the aperture-providing tenth lens group G10 has already been described above. It is worth to note that spherical lens surfaces appear to be sufficient in the region upstream of the image-side aspherical lens group ALGI. A thin meniscus lens having low refractive power is provided in the region of largest beam diameter upstream of the third pupil surface P3. For smaller NA values the undercorrecting effect of that lens may be provided by adjacent lenses such that a lens element with large diameter can be omitted.

Figure 7:
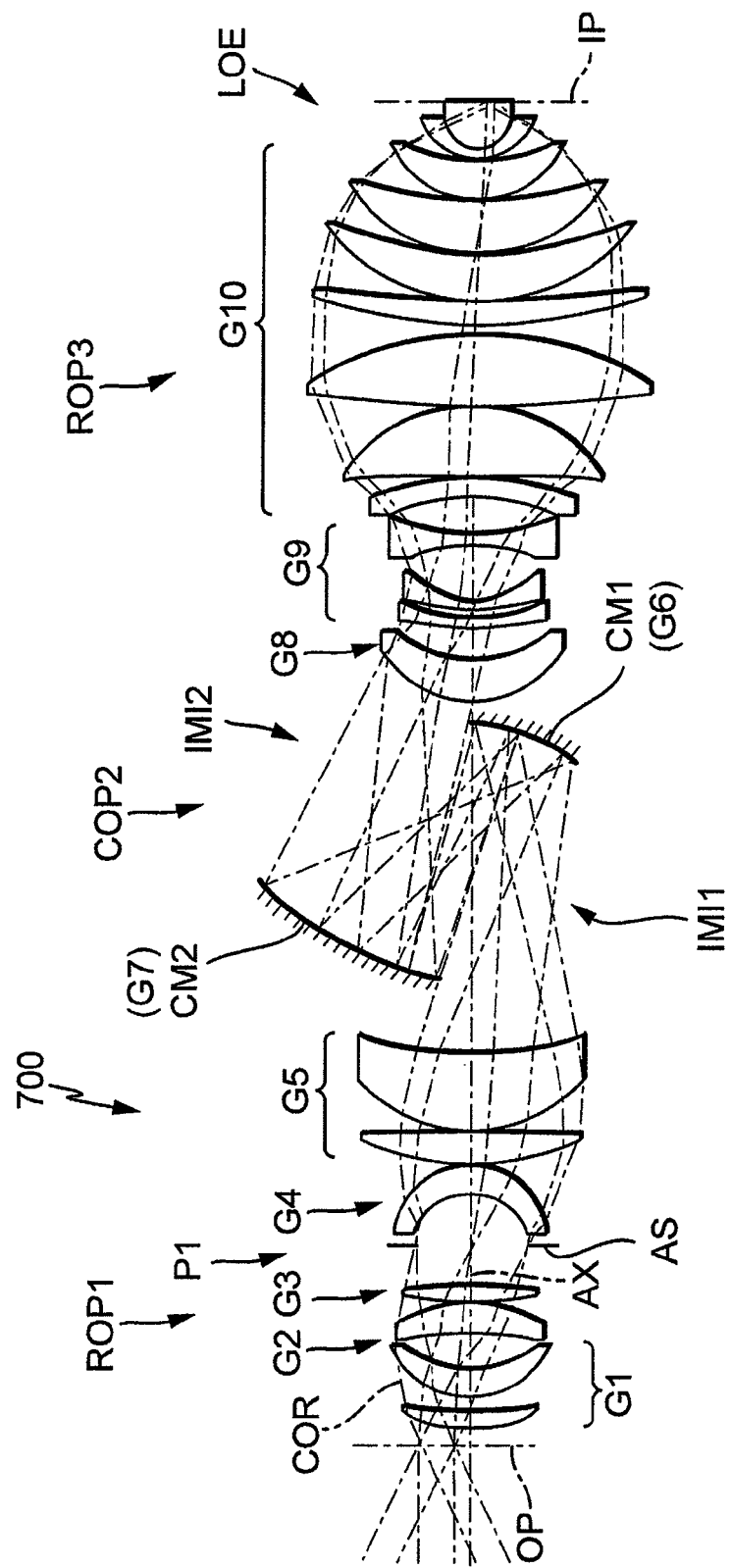
FIG. 7 is a longitudinally sectioned view of a seventh embodiment of a catadioptric projection objective according to the invention.

The projection objective 700 in FIG. 7 is a variant of the design of FIG. 6, where the number, type and sequence of lenses and mirrors is essentially the same as in FIG. 6, with the exception of the last optical element LOE. Reference is made to that description in so far. The specification is given in tables 7, 7A. An image-side numerical aperture NA=1.75 is obtained in a rectangular field (4.0 mm×20 mm) with a wavefront error of 7.0 mλ for 193 nm at track length 1332.2 mm. It is one characterizing feature that the ray height of the upper coma ray COR at the lens element closest to the object plane is essentially the same as the coma ray height at the last lens G3 immediately upstream of the first pupil surface P1 where the aperture stop AS is positioned (maximum height difference 10%). A third lens group G3 is designed as biaspherical lens to provide spherical overcorrection.

Figure 9:
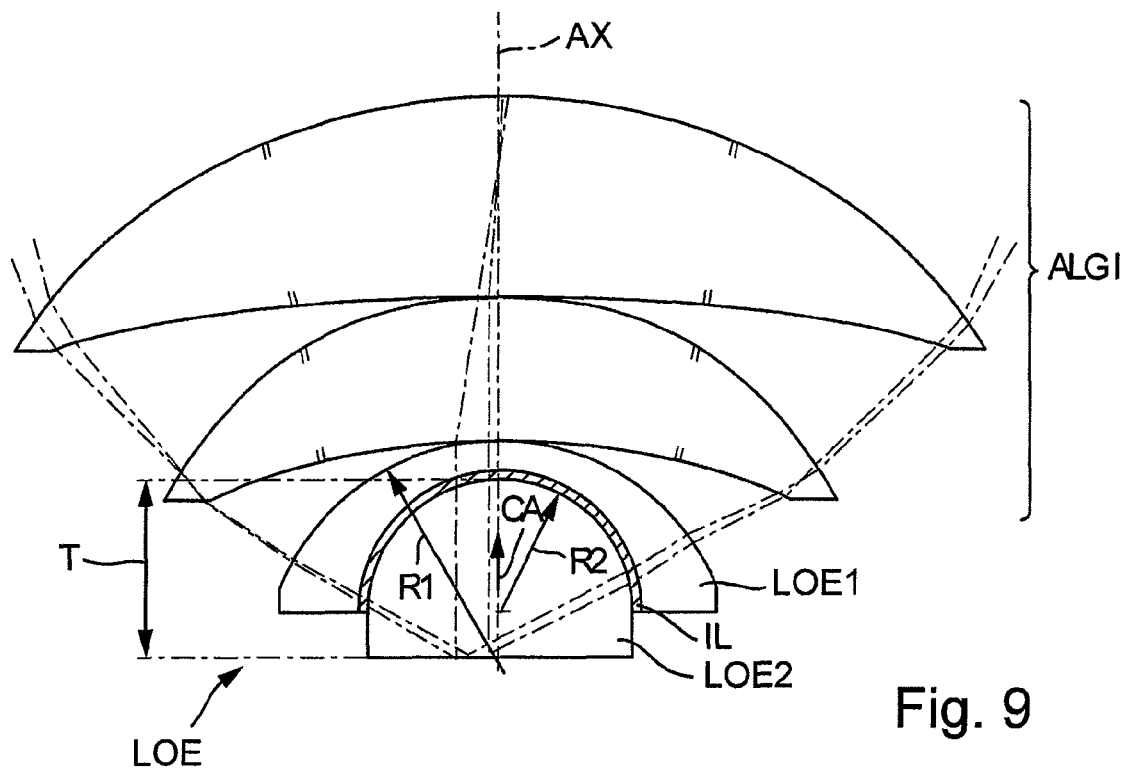
FIG. 9 is an enlarged detail illustration of the image-side end section of the projection objective in FIG. 6.

The last optical element LOE includes a hyper-hemispherical lens LOE2 having a curved entry surface with curvature radius R2 and an essentially planar exit surface and an axial lens thickness T defined as the axial distance between the curved entry surface and the exit surface along the optical axis of the lens, where T>R2 (compare FIG. 9). Particularly, T is at least 25%, preferably at least 30% or even at least 33% larger than the curvature radius of the convex entry surface (in the embodiment, T is about 34.7% larger than R2). If an immersion layer is used between the last optical element and the substrate surface disposed in the image plane, it is preferred that the thickness of that layer in included in the thickness T. Regarding this aspect, reference is made to US Provisional Application with title "Mikrolithographie-Projektionsobjektiv und Projektionsbelichtungsanlage" filed by the applicant on Mar. 2, 2005. The disclosure of this application is incorporated herein in its entirety by reference.

Figure 8:
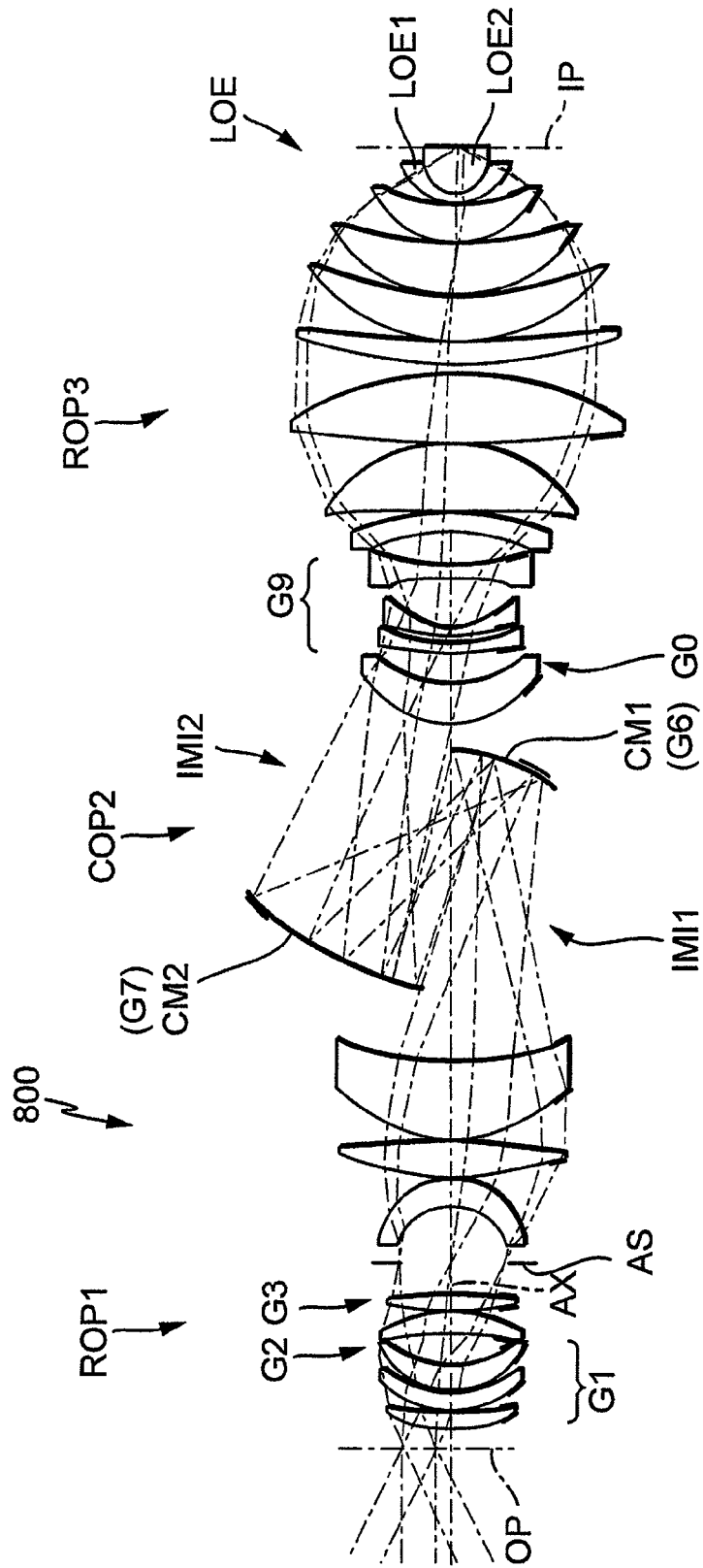
FIG. 8 is a longitudinally sectioned view of an eighth embodiment of a catadioptric projection objective according to the invention.

FIG. 8 shows a variant of the embodiments of FIGS. 6 and 7 with NA=1.75, where the RMS value of the wavefront error has been reduced to less than 4.5 mλ. The specification is given in tables 8, 8A. The types and sequence of lenses and mirrors are essentially the same as in the embodiments of FIGS. 6 and 7 with one exception on the entry side of the projection objective, where the first lens group G1 is now formed by three (instead of two) meniscus lenses having image-side concave surfaces. Each of the lenses is a biaspherical lens. Including the entry surface of the following positive meniscus G2 seven immediately consecutive asphere lens surfaces are provided immediately following the object plane. As the subsequent lens G3 immediately upstream of the aperture stop AS is a biaspherical lens, a total of nine aspheric surfaces ($N_{ASP}$=9) are provided on five consecutive aspheric lenses ($N_{ASPL}$=5) such that AR=1.8 holds for the object-side aspheric lens group ALGO following the object plane. Using the higher orders of single aspheric parameters and the spatially dense sequence of aspheric surfaces immediately following each other a very complex correcting effect on the wavefront across the diameter of the beam is obtained for various rays. The example also shows that an aspheric lens group may also be sufficiently effective if one spherical surface (e.g. convex exit surface of G2) is present within an aspheric lens group such that $N_{ASP}=2 \cdot N_{ASPL}-1$.

Another dense sequence of aspheric lens surfaces is provided in the region of the negative lenses of lens group G9 near the constriction region or waist on the entry side of the third refractive objective part ROP3. Here, each of the four negative lenses is an aspheric lens ($N_{ASPL}=4$). three of that lenses are biaspherical lenses, whereas one lens has one aspheric lens surface only ($N_{ASP}=7$). Considering that the entry side of the subsequent first lens of group G10 is also aspheric, there are seven immediately subsequent aspheric lens surfaces in G9 and G10, and in six subsequent aspheric lenses (G8, G9 and first lens of G10) there are nine aspheric lens surfaces ($N_{ASPL}=9$). Therefore, AR=1.5.

Further, three positive meniscus lenses with image-side concave surfaces immediately upstream of the last optical element LOE ($N_{ASPL}=3$) provide five aspheric lens surfaces ($N_{ASP}=5$) such that AR=1.66. Further, since the convex entry side of the last optical element is also aspheric, there are six immediately consecutive aspheric lens surfaces close to the image plane.

Figure 10:
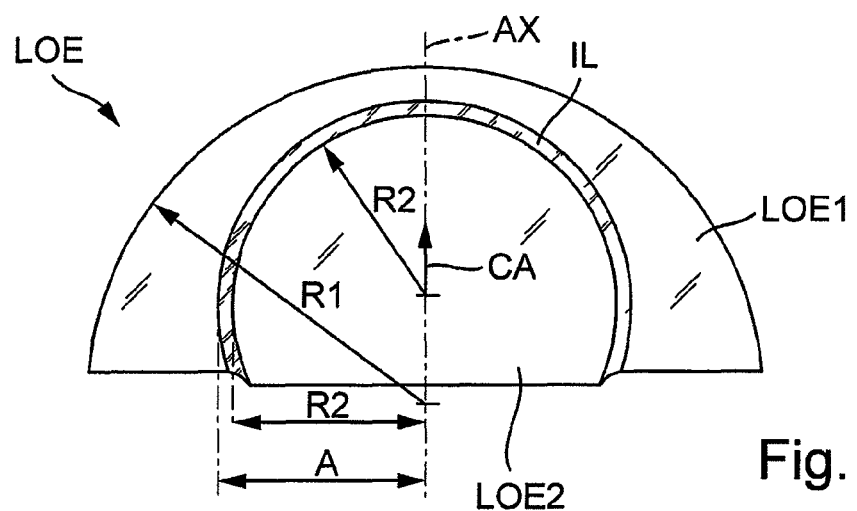
FIG. 10 is a schematic drawing of a last optical element including a hyper-hemispherical crystalline lens and an immersion layer.

The mutually facing curved surfaces of the constituent lenses LOE1, LOE2 of the last optical element are spherical. The piano-convex lens element LOE2 is a hyper-hemispherical lens having a spherical entry surface extending spherically beyond a central plane through the center of curvature of the curved entry surface perpendicular to the optical axis (FIG. 10). The lens element is manufactured by first manufacturing a spherical element and by secondly removing a smaller part of the sphere to provide the planar surface forming the exit surface. The planar exit surface is oriented perpendicular to the crystallographic axis CA of the optically uniaxial lens material sapphire. The corresponding spherical exit surface is likewise hyper-hemispherical. The fused silica material is sectioned such that an opening radius A for inserting the crystal lens LOE2 is larger than the radius R2 of the truncated spherical crystal lens LOE2. In the embodiment, an immersion liquid IL is provided in a gap between the mutually facing spherical lens surfaces.

The optimum shape of aspheric lens surfaces in aspheric lens groups having a number of consecutive aspheric surfaces generally differs depending on the position of the aspheric surfaces within the projection objective. Complex correcting effects can be obtained by a dense sequence of aspheric lens surfaces if the aspheric shapes of the consecutive aspheric surfaces are not uniform, but vary in a specific way within a sequence of aspheric surfaces. In the following, considerations regarding the specific shape of consecutive lens surfaces within aspheric lens groups are presented based on a refined analysis of the embodiments shown in FIGS. 6 to 8 having very high image-side numerical apertures, e.g. NA>1.6 and/or NA≧1.7. The optical calculations were performed with a strictly telecentric input beam on the object side. Therefore an aperture stop was not used for the calculations.

The aspheric shapes are characterized by Zernike coefficients with respect to a spherical reference envelope surface (envelope sphere). Selected parameters defining the Zernike representation with respect to the envelope sphere and the Zernike coefficients for the embodiments shown in FIGS. 6, 7 and 8 are given in tables 6Z, 7Z, 8Z, respectively, for all aspheric surfaces of the respective projection objectives. The parameters are calculated based on an envelope sphere defined as a mathematical sphere touching the aspheric lens surface at the vertex (on the optical axis) and at the radial outer edge of the optically used area. The optically used area is defined by its diameter $D_{max}=2 \cdot H_{max}$, where $H_{max}$ [mm] is the maximum height. The envelope sphere has an envelope sphere radius $R_{ENV}$ [mm]. The aspheric lens surfaces are further characterized by the vertex radius $R_V$ [mm], which is the local radius of the aspheric surface on the optical axis, and by the deformation Def [µm], which is defined here as the maximum value of the distance between the envelope sphere and the aspheric surface depending on the height, the deformation being measured parallel to the optical axis.

In the representation using Zernike coefficients and Zernike polynomials as used here, the sagitta p of a point on an aspherical surface is represented as a function of a normalized radial distance $h_n$ from the optical axis according to the following equation:

$$p(h_n) = \frac{h_n^2}{R\left(1+\sqrt{1-\frac{h^2}{R^2}}\right)} + K0 + K4 \cdot Z4 + K9 \cdot Z9 + K16 \cdot Z16 + K25 \cdot Z25 + K36 \cdot Z36 + K49 \cdot Z49 + K64 \cdot Z64 + K81 \cdot Z81 + K100 \cdot Z100$$

where the radius R of the aspheric lens surface is fixed such that K4=0. The Zernike polynomials are given in the following equations (where the normalized height $h_n$ is expressed in a simplified manner by parameter h for reasons of clarity):

$Z4 = 2 \cdot h^2 - 1$ $Z9 = 6 \cdot h^4 - 6 \cdot h^2 + 1$ $Z16 = 20 \cdot h^6 - 30 \cdot h^4 + 12 \cdot h^2 - 1$ $Z25 = 70 \cdot h^8 - 140 \cdot h^6 + 90 \cdot h^4 - 20 \cdot h^2 + 1$ $Z36 = 252 \cdot h^{10} - 630 \cdot h^8 + 560 \cdot h^6 - 210 \cdot h^4 + 30 \cdot h^2 - 1$ $Z49 = 924 \cdot h^{12} - 2772 \cdot h^{10} + 3150 \cdot h^8 - 1680 \cdot h^6 + 420 \cdot h^4 - 42 \cdot h^2 + 1$ $Z64 = 3432 \cdot h^{14} - 12012 \cdot h^{12} + 16632 \cdot h^{10} - 11550 \cdot h^8 + 4200 \cdot h^6 - 756 \cdot h^4 + 56 \cdot h^2 - 1$ $Z81 = 12870 \cdot h^{16} - 51480 \cdot h^{14} + 84084 \cdot h^{12} - 72072 \cdot h^{10} - 34650 \cdot h^8 - 9240 \cdot h^6 + 1260 \cdot h^4 - 72 \cdot h^2 + 1$ $Z100 = 48620 \cdot h^{18} - 218790 \cdot h^{16} + 411840 \cdot h^{14} - 420420 \cdot h^{12} + 252252 \cdot h^{10} - 90090 \cdot h^8 + 18480 \cdot h^6 - 1980 \cdot h^4 + 90 \cdot h^2 - 1$ The normalized radius $h_n$ is defined as:

$$h_n = \frac{\text{distance from optical axis}}{\frac{1}{2} \text{ lens diameter of the aspheric surface}}$$

where $0 < h_n \leq 1$.

The surface shape components resulting from the Zernike polynomial Z9 contribute to spherical aberration of the third order. The portions resulting from the Zernike polynomial Z16 contribute to the correction of the fifth order spherical aberration. The contributions from the Zernike polynomial Z25 contribute to the correction of the seventh order spherical aberration, and the portions from the Zernike polynomials Z36 contribute to the correction of the ninth order spherical aberration.

In tables 6Z, 7Z and 8Z all aspheric surfaces are characterized by the Zernike coefficients with respect to the radius of the envelope sphere. Generally, the specific shapes and distribution of shapes in a dens sequence of aspheric surfaces will change if one aspheric surface is added or removed from that aspheric lens group since the specific contributions to a complex wavefront deformation must be distributed anew. In spite of this, however, it has been found that some basic forms of asphericity appears to be beneficial even if the spatial density of aspherics is slightly changed in an aspheric lens group. In the following, these basic forms of asphericity are described in terms of selected ratios between selected Zernike coefficients for a lens group having a high spatial density of aspheric surfaces.

Firstly, the object-side of the projection objective is considered. In an object-side aspheric lens group ALGO formed by lenses immediately downstream of the object plane and having at least three immediately consecutive aspheric lens surfaces it is preferred that the first surface of that aspheric lens group (i.e. the aspheric lens surface closest to the object plane) observes at least one of the following conditions:

$-14 \geq K9/K16 \geq -25$ $+2 \leq K16/K25 \leq 8$.

For a second aspheric surface following the first aspheric surface of the object-side aspheric lens group at least one of the following conditions preferably holds:

$-3.5 \geq K9/K16 \geq -7.5$ $+7 \leq K16/K25 \leq +25$.

If the object-side aspheric lens group includes at least four immediately consecutive aspheric lens surfaces, at least one of the two following conditions holds for a fourth aspheric lens surface following the first, second and third aspheric lens surface:

$3 \leq K9/K16 \leq 5$ $5 \leq K16/K25 \leq 15$.

In an object-side aspheric lens group having three, four, five or six immediately consecutive aspheric lens surfaces, the surface curvature at the vertex is preferably oriented such that the local radius of curvature has its center on the image-side for all the aspheric lens surfaces. Alternatively, or in addition, the center of curvature of the envelope sphere is preferably on the image-side for all the aspheric lens surfaces of the object-side aspheric lens group.

If one or more or all of these conditions are observed for the object-side aspheric lens group, object-side telecentricity can be obtained at a very low level of distortion. The preferred conditions for the object-side aspheric lens group are particularly useful for projection objectives having an object side numerical aperture $NA_O > 0.4$.

It has been found that a change of the sense of curvature of aspheric lens surfaces will preferably occur as the axial position of the aspheric surfaces increases from the object plane. Whereas the lenses closest to the object plane preferably have a curvature radius center on the image-side, a second lens group G2 may be defined as the lens group starting with the first lens surface having the center of curvature on the object-side. Preferably, the center of curvature of the first aspheric surface of the second group G2 and/or the second aspheric lens surface of that group lies on the object-side. Further, the shape of the first asphere of the second group preferably obeys the following condition:

$9 \leq K9/K16 \leq 20$.

Note that the second lens group G2 is formed by a single positive meniscus lens having an image-side convex surface in the embodiments of FIGS. 6 to 8. The second lens group may have more than one lens, e.g. two lenses.

A third lens group G3 is preferably formed by a generally biconvex lens. Preferably, a first aspheric surface in the third lens group obeys at least one of the following conditions:

$-20 \geq K9/K6 \geq -25$ $-2.5 \geq K16/K25 \geq -3.5$

A second aspheric lens surface, normally formed by the exit surface of a biconvex, biaspherical lens, preferably observes at least one of the following conditions:

$+5.0 \leq K9/K16 \leq +8.0$ $+4 \leq K16/K25 \leq +7$.

In a fifth lens group G5, which is arranged immediately upstream of the first intermediate image in the embodiments of FIGS. 6 to 8, a first aspheric lens surface has at least one of the center of curvature at the vertex and the center of curvature of the envelope sphere on the image side and at least one of the following conditions holds:

$2.5 \leq K9/K16 \leq 3$ $-4 \geq K16/K25 \geq -7$.

A penultimate aspheric lens surface in G5 preferably has the centers of curvatures mentioned above on the image side and at least one of the following conditions holds:

$3 \leq K9/K16 \leq 5$ $6 \leq K16/K25 \leq 9$.

For a last aspheric surface of the fifth lens group (positioned immediately upstream of the first intermediate image) the center of curvature of the envelope sphere is preferably on the image side and at least one of the following conditions holds:

$12 \leq K9/K16 \leq 18$;

$4 \leq K16/K25 \leq 7$ $6 \leq K25/K36 \leq 10$.

For the eighth lens group G8 arranged for receiving the radiation exiting the catadioptric second objective part COP2 it has been found that it is beneficial if an aspheric lens surface of that lens group observes at least one of the following conditions:

$2.5 \leq K9/K16 \leq 4$;

$2.5 \leq K16/K25 \leq 4.0$ $3.0 \leq K25/K36 \leq 5$.

In the embodiments of FIGS. 6 to 8 a ninth lens group G9 includes negative lenses and is designed to form a waist, i.e. a constriction of the beam diameter, whereby a contribution to Petzval sum correction is obtained in addition to correcting effects on other aberrations. Preferably, a first aspheric lens surface of the ninth group G9 obeys at least one of the following conditions:

$3 \leq K9/K16 \leq 5$ $3 \leq K16/K25 \leq 5.$

If the ninth lens group G9 includes at least three and at most five consecutive aspheric lens surfaces the first aspheric lens surface of that group (in beam propagation direction) preferably obeys at least one of the following conditions:

$-3 \geq K9/K25 \geq -5$ $+5 \leq K16/K25 \leq +7.$

A second aspheric lens surface of that lens group preferably obeys at least one of the following conditions:

$0.3 \leq K9/K16 \leq 0.5$ $3.0 \leq K16/K25 \leq 5.0$

A third aspheric lens surface of that lens group preferably obeys at least one of the following conditions:

$3 \leq K9/K16 \leq 5$ $-25 \geq K16/K25 \geq -40.$

A fourth aspheric lens surface of the ninth group preferably obeys at least one of the following conditions:

$+5 \leq K9/K16 \leq +7$ $-3 \leq K16/K25 \leq -5.$

A fifth aspheric lens surface of that ninth lens group preferably obeys at least one of the following conditions:

$2.0 \leq K9/K16 \leq 3$ $10.0 \leq K16/K25 \leq 15.0$

A tenth lens group G10 immediately upstream of the last optical element LOE is primarily designed to provide the high image-side numerical aperture. To this end, this lens group is primarily or exclusively composed of positive lenses. For a first aspheric lens surface on a positive lens of this lens group at least one of the following conditions preferably holds:

$500 \leq K9/K16 \leq 700$ $0.2 \leq K16/K25 \leq 0.3.$

For a second aspheric lens surface following thereon, at least one of the following conditions preferably holds:

$-7.0 \geq K9/K16 \geq -10.0$ $1.3 \leq K16/K25 \leq 1.8.$

For an aspheric lens surface in the region of maximum beam diameter, preferably formed on a lens having low refractive power, at least one of the following conditions preferably holds:

$6 \leq K9/K16 \leq 9$ $12 \leq K16/K25 \leq 17.$

As noted above, it may be beneficial to have an aspheric lens group including at least three and at most five consecutive aspheric lens surfaces immediately upstream of the last optical element in the region of the convergent beam. For a first aspheric lens of that group at least one of the following conditions preferably holds:

$7.0 \leq K9/K16 \leq 12$ $-2.5 \geq K16/K25 \geq 5.0.$

The aspheric lens surfaces close to the image plane are particularly important for correction and very high image-side numerical apertures. Depending on the actual number of aspherics in that region, there may be a third aspheric lens surface of lens group immediately upstream of the last optical element (in beam propagation direction) which may be the penultimate aspheric lens group of that lens group. Preferably, at least one of the following conditions hold for that aspheric surface:

$3 \leq K9/K16 \leq 5$ $10 \leq K16/K25 \leq 15.$

A last aspheric surface of that lens group may or may not be the last aspheric surface of the projection objective before the image surface depending on whether or not the last optical element LOE has an aspheric lens surface. For this last aspheric lens surface, at least one of the following conditions preferably holds:

$+25 \leq K9/K16 \leq 40$ $-2 \geq K16/K25 \geq -4.$

A last aspheric lens surface of the projection objective, which may be the last aspheric lens surface of a lens group immediately upstream of the last optical element or an aspheric lens surface of the last optical element preferably obeys at least one of the following conditions:

$-1,8 \leq K9/K16 \leq 2,5$ $+1,3 \leq K16/K25 \leq 1,7$ $+2,5 \leq K25/K36 \leq 4,0$ $+3,5 \leq K36/K49 \leq 5,0$ $+4,5 \leq K49/K64 \leq 7,0.$ The above mentioned conditions in terms of Zernike coefficients have been derived from embodiments of catadioptric two-mirror in-line projection objectives having two intermediate images, as exemplified by FIGS. 6 to 8 and other figures. It is contemplated that the conditions observed for aspheric lens surfaces in the middle region of the projection objectives (e.g. within lens groups G4 to G8 or G9) may be specific for that type of projection objectives. However, it is also contemplated that the conditions derived for the aspheric lens surfaces close to the object surface (e.g. within the object-side aspheric lens group ALGO) and close to the image plane (e.g. within the lens group immediately upstream of the last optical element and/or within the image-side aspheric lens group ALGI) are representative of projection objectives irrespective of the specific construction (refractive or catadioptric, with or without intermediate image, one or more concave mirrors etc.). Particularly, the conditions for the image-side end region are considered to be applicable if a projection objective is used at high image-side numerical aperture $NA \geq 1.3$ or even $NA \geq 1.4$ in an optical limit range where the aperture $\sin \alpha$ (angle α equals half the opening angle of a beam bundle within the last optical element) within the last optical element LOE corresponding to the ratio $NA/n_{LOE}$ between the image-side numerical aperture and the refractive index $n_{LOE}$ of the last optical element obeys the condition $\sin \alpha \geq 0.8$ or even $\sin \alpha \geq 0.9.$ Consequently, the conditions are also considered to be beneficial independent of whether or not a high index material having refractive index n≧1.6 is used in any part of the projection objective, particularly on the image-side end thereof.

Therefore, the principles derived specifically for the object-side entry region and the image-side exit region of the very high NA projection objectives are considered to be universally applicable for projection objectives having comparable performance parameters with regard to object-side numerical aperture, magnification ratio, image-side numerical aperture, object- and image-field size etc.

All exemplary embodiments discussed above are catadioptric projection objectives with exactly two concave mirrors and exactly two intermediate images, where all optical elements are aligned along one straight, unfolded optical axis. The uniform basic type of projection objective chosen to explain preferred variants of the invention is intended to help illustrate some basic variants and technical effects and advantages related to different variants of the invention. However, the demonstrated use of lenses or lens elements made of high refractive index material (e.g. n≧1.6 or even n≧1.8) in projection objectives particularly for operating wavelength in the deep ultraviolet range (DUV) is not restricted to this type of projection objectives. The invention can also be incorporated into purely refractive projection objectives. In those types, the last optical element closest to the image plane is often a plano-convex lens which can be designed, for example, according to the rules laid out above for the last optical elements LOE in each of the first to fifth embodiment.

Examples are given e.g. in applicants U.S. applications having Ser. Nos. 10/931,051 (see also WO 03/075049 A), 10/931,062 (see also US 2004/0004757 A1), 10/379,809 (see US 2003/01744408) or in WO 03/077036 A. The disclosure of these documents is incorporated herein by reference.

Likewise, the invention can be implemented into catadioptric projection objectives having only one concave mirror, or catadioptric projection objectives having two concave mirrors in a arrangement different from that shown in the figures, or in embodiments having more than two concave mirrors. Also, use of the invention can be made independent of whether or not folding mirrors are present in the optical design. Examples of catadioptric systems are given e.g. in applicants U.S. applications having Ser. Nos. 60/511,673, 10/743,623, 60/530,622, 60/560,267 or in US 2002/0012100 A1. The disclosure of these documents is incorporated herein by reference. Other examples are shown in US 2003/0011755 A1 and related applications.

Likewise, the invention can be implemented into projection objectives without intermediate image, or with any suitable number of intermediate images depending on demand.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

TABLE 1

Embodiment 1: NA = 1.45, β = −0.25, λ = 193.4 nm

| SURF | RADIUS | THICKNESS | MATERIAL | INDEX | SEMIDIAM. |
|---|---|---|---|---|---|
| 0 | 0.000000 | 37.647680 | | | 62.000 |
| 1 | 200.438805 | 20.912608 | SIO2HL | 1.56018811 | 83.110 |
| 2 | 747.538013 | 7.881173 | | | 83.845 |
| 3 | 317.250503 | 20.945704 | SIO2HL | 1.56018811 | 86.831 |
| 4 | 22587.222465 | 11.951766 | | | 86.988 |
| 5 | −354.957551 | 49.505975 | SIO2HL | 1.56018811 | 87.016 |
| 6 | −278.404969 | 31.885410 | | | 92.050 |
| 7 | 133.981210 | 32.856595 | SIO2HL | 1.56018811 | 92.150 |
| 8 | 186.155059 | 11.833855 | | | 85.480 |
| 9 | 260.034334 | 38.111988 | SIO2HL | 1.56018811 | 85.440 |
| 10 | −248.127931 | 0.945803 | | | 84.087 |
| 11 | 97.319012 | 29.863172 | SIO2HL | 1.56018811 | 63.308 |
| 12 | 247.011352 | 15.182258 | | | 54.518 |
| 13 | 0.000000 | 13.667911 | | | 46.858 |
| 14 | −118.535589 | 9.039902 | SIO2HL | 1.56018811 | 47.472 |
| 15 | −136.528381 | 10.289540 | | | 49.929 |
| 16 | −117.640924 | 9.240335 | SIO2HL | 1.56018811 | 50.901 |
| 17 | −267.170322 | 7.604882 | | | 57.478 |
| 18 | −147.424814 | 27.656175 | SIO2HL | 1.56018811 | 58.338 |
| 19 | −83.904407 | 29.670597 | | | 63.295 |
| 20 | −79.022234 | 16.329258 | SIO2HL | 1.56018811 | 66.670 |
| 21 | −99.429984 | 38.001255 | | | 76.192 |
| 22 | −111.093244 | 49.234984 | SIO2HL | 1.56018811 | 86.007 |
| 23 | −144.921986 | 0.952550 | | | 106.817 |
| 24 | −6366.151454 | 44.409555 | SIO2HL | 1.56018811 | 119.243 |
| 25 | −217.880653 | 270.750636 | | | 120.802 |
| 26 | −219.739583 | −239.183412 | | REFL | 145.235 |
| 27 | 184.636114 | 269.507816 | | REFL | 128.436 |
| 28 | 197.874974 | 37.626342 | SIO2HL | 1.56018811 | 86.078 |
| 29 | 524.125561 | 15.614096 | | | 81.640 |
| 30 | −406.239674 | 8.985971 | SIO2HL | 1.56018811 | 81.383 |
| 31 | 106.800601 | 32.709694 | | | 77.510 |
| 32 | −1162.346319 | 30.365146 | SIO2HL | 1.56018811 | 78.287 |
| 33 | −161.881438 | 8.348534 | | | 81.054 |
| 34 | −166.445156 | 11.418724 | SIO2HL | 1.56018811 | 81.127 |
| 35 | −1076.211334 | 42.927908 | | | 95.134 |

TABLE 1-continued

Embodiment 1: NA = 1.45, β = −0.25, λ = 193.4 nm

| SURF | RADIUS | THICKNESS | MATERIAL | INDEX | SEMIDIAM. |
|---|---|---|---|---|---|
| 36 | −546.503260 | 41.443273 | SIO2HL | 1.56018811 | 113.022 |
| 37 | −173.835591 | 0.952741 | | | 119.110 |
| 38 | −372.875307 | 32.537548 | SIO2HL | 1.56018811 | 128.490 |
| 39 | −210.380863 | 1.042699 | | | 131.802 |
| 40 | 303.213120 | 50.564746 | SIO2HL | 1.56018811 | 145.286 |
| 41 | 5346.623071 | 0.921057 | | | 144.413 |
| 42 | 262.055999 | 33.924688 | SIO2HL | 1.56018811 | 133.743 |
| 43 | 733.813747 | 0.928913 | | | 130.461 |
| 44 | 163.353186 | 39.409378 | SIO2HL | 1.56018811 | 116.482 |
| 45 | 349.938998 | 0.920003 | | | 111.971 |
| 46 | 279.917107 | 28.062402 | SIO2HL | 1.56018811 | 109.138 |
| 47 | 11299.235097 | 0.896338 | | | 104.077 |
| 48 | 88.608734 | 39.730068 | SIO2HL | 1.56018811 | 73.896 |
| 49 | 114.264419 | 0.751321 | | | 56.000 |
| 50 | 65.720894 | 25.021454 | SAPHIR | 1.92674849 | 49.523 |
| 51 | 131.441788 | 25.021469 | SAPHIR | 1.92674849 | 39.659 |
| 52 | 0.000000 | 1.000000 | HIINDEX | 1.55600000 | 18.066 |
| 53 | 0.000000 | 0.000000 | AIR | 0.00000000 | 15.503 |

TABLE 1A

ASPHERIC CONSTANTS

| | SRF | | | | |
|---|---|---|---|---|---|
| | 1 | 6 | 8 | 12 | 16 |
| K | 0 | 0 | 0 | 0 | 0 |
| C1 | −2.263569e−08 | 5.432610e−08 | −7.143508e−09 | 2.619298e−07 | −3.184960e−07 |
| C2 | −9.879901e−13 | −7.797101e−12 | 1.564097e−11 | −3.814641e−11 | −3.142211e−11 |
| C3 | 3.070713e−17 | 8.455873e−16 | −1.599946e−15 | 1.148617e−14 | −1.728296e−15 |
| C4 | −6.018627e−21 | −6.875038e−20 | 3.060476e−19 | −4.506119e−18 | −1.249207e−18 |
| C5 | 4.073174e−26 | 3.863486e−24 | −2.788321e−23 | −5.794434e−23 | −9.678014e−24 |
| C6 | 1.391778e−29 | −1.112310e−28 | 1.126553e−27 | 4.244063e−26 | −4.921692e−26 |
| C7 | 0.000000e+00 | 0.000000e+00 | 0.000000e+00 | 0.000000e+00 | 0.000000e+00 |

| | SRF | | | | |
|---|---|---|---|---|---|
| | 22 | 26 | 27 | 28 | 31 |
| K | 0 | 0 | 0 | 0 | 0 |
| C1 | 2.863527e−08 | 8.694636e−09 | −6.654566e−09 | 5.614883e−08 | −1.288689e−07 |
| C2 | 1.884154e−12 | 1.385871e−13 | −1.686449e−13 | 1.450774e−12 | −4.820574e−12 |
| C3 | 1.636375e−17 | 1.727286e−18 | −2.470942e−18 | 1.892047e−16 | 5.082977e−16 |
| C4 | 1.888300e−20 | 4.461465e−23 | −2.362157e−22 | 6.954696e−21 | −1.375138e−19 |
| C5 | −2.021635e−24 | −7.172318e−28 | 7.757389e−27 | −1.108417e−24 | 1.555422e−23 |
| C6 | 1.591959e−28 | 3.081240e−32 | −3.330142e−31 | 2.459404e−28 | −2.481857e−28 |
| C7 | 0.000000e+00 | 0.000000e+00 | 0.000000e+00 | 0.000000e+00 | 0.000000e+00 |

| | SRF | | | | |
|---|---|---|---|---|---|
| | 34 | 36 | 41 | 47 | 49 |
| K | 0 | 0 | 0 | 0 | 0 |
| C1 | −1.177998e−07 | −2.187776e−08 | −1.577571e−08 | −8.244653e−09 | 2.024084e−07 |
| C2 | −5.683441e−12 | −8.068584e−14 | 3.706857e−13 | 4.957466e−12 | 1.422789e−11 |
| C3 | −5.647064e−16 | 8.600815e−17 | −1.492063e−17 | −2.442972e−16 | 3.923209e−15 |
| C4 | −7.031797e−21 | −2.071494e−20 | −9.742126e−22 | 6.741381e−21 | 4.845684e−19 |
| C5 | −1.902336e−24 | 1.290940e−24 | 6.498365e−26 | 2.034640e−25 | −2.134986e−22 |
| C6 | 2.891112e−29 | −3.884318e−29 | −9.630077e−31 | −2.570056e−29 | 5.591977e−26 |
| C7 | 0.000000e+00 | 0.000000e+00 | 0.000000e+00 | 9.579172e−34 | 0.000000e+00 |

TABLE 2

Embodiment 2 (b037b): NA = 1.35, β = −0.25, λ = 193.4 nm

| SURF | RADIUS | THICKNESS | MATERIAL | INDEX | SEMIDIAM. |
|---|---|---|---|---|---|
| 0 | 0.000000 | 37.647680 | | | 62.000 |
| 1 | 526.196808 | 49.977602 | SIO2HL | 1.56018811 | 75.944 |

TABLE 2-continued

Embodiment 2 (b037b): NA = 1.35, β = −0.25, λ = 193.4 nm

| SURF | RADIUS | THICKNESS | MATERIAL | INDEX | SEMIDIAM. |
|---|---|---|---|---|---|
| 2 | −256.668548 | 1.120100 | | | 85.473 |
| 3 | 696.160336 | 28.649736 | SIO2HL | 1.56018811 | 90.668 |
| 4 | −2056.955285 | 22.244610 | | | 92.750 |
| 5 | −195.811665 | 49.974335 | SIO2HL | 1.56018811 | 92.870 |
| 6 | −158.185918 | 9.821764 | | | 101.539 |
| 7 | 138.796255 | 49.218181 | SIO2HL | 1.56018811 | 90.394 |
| 8 | 301.060143 | 1.660319 | | | 80.597 |
| 9 | 161.646552 | 42.095627 | SIO2HL | 1.56018811 | 78.153 |
| 10 | −406.812049 | 0.979493 | | | 70.852 |
| 11 | 100.020556 | 24.469422 | SIO2HL | 1.56018811 | 52.354 |
| 12 | 102.330592 | 10.088496 | | | 38.573 |
| 13 | 0.000000 | 10.406389 | | | 37.226 |
| 14 | −157.109979 | 8.950512 | SIO2HL | 1.56018811 | 38.841 |
| 15 | 618.822068 | 8.847956 | | | 46.776 |
| 16 | −561.300665 | 33.147649 | SIO2HL | 1.56018811 | 51.388 |
| 17 | −73.150544 | 9.448760 | | | 56.377 |
| 18 | −69.300574 | 8.926672 | SIO2HL | 1.56018811 | 57.781 |
| 19 | −86.551998 | 8.003693 | | | 64.608 |
| 20 | −78.306541 | 10.360105 | SIO2HL | 1.56018811 | 66.592 |
| 21 | −117.142798 | 2.915635 | | | 75.827 |
| 22 | −356.673528 | 46.693825 | SIO2HL | 1.56018811 | 86.465 |
| 23 | −108.386760 | 266.538313 | | | 90.245 |
| 24 | −177.092218 | −236.552196 | | REFL | 129.567 |
| 25 | 200.462621 | 288.213928 | | REFL | 136.687 |
| 26 | 604.677438 | 50.022575 | SIO2HL | 1.56018811 | 82.440 |
| 27 | 125.234518 | 13.901039 | | | 73.274 |
| 28 | 257.421526 | 34.367199 | SIO2HL | 1.56018811 | 73.449 |
| 29 | 111.034905 | 29.307766 | | | 73.890 |
| 30 | −848.480773 | 29.119950 | SIO2HL | 1.56018811 | 74.404 |
| 31 | −194.073508 | 7.840952 | | | 80.032 |
| 32 | −225.307336 | 46.053997 | SIO2HL | 1.56018811 | 81.668 |
| 33 | −535.709449 | 0.941640 | | | 105.651 |
| 34 | −1622.810467 | 46.410355 | SIO2HL | 1.56018811 | 108.373 |
| 35 | −173.207717 | 0.932943 | | | 113.398 |
| 36 | −236.921577 | 22.327373 | SIO2HL | 1.56018811 | 116.764 |
| 37 | −261.220038 | 0.938270 | | | 124.709 |
| 38 | 364.988031 | 40.936258 | SIO2HL | 1.56018811 | 142.520 |
| 39 | 11406.698081 | 0.943482 | | | 142.679 |
| 40 | 379.203162 | 36.840265 | SIO2HL | 1.56018811 | 142.867 |
| 41 | −33782.420006 | 0.921857 | | | 141.929 |
| 42 | 245.879991 | 49.886843 | SIO2HL | 1.56018811 | 134.831 |
| 43 | −10061.581161 | 0.883850 | | | 132.020 |
| 44 | 145.995266 | 39.892414 | SIO2HL | 1.56018811 | 105.854 |
| 45 | 375.256079 | 0.817132 | | | 99.565 |
| 46 | 86.107554 | 37.429431 | SIO2HL | 1.56018811 | 73.276 |
| 47 | 215.234027 | 0.667291 | | | 63.094 |
| 48 | 52.718236 | 26.546970 | SIO2HL | 1.56018811 | 42.800 |
| 49 | 0.000000 | 16.594510 | SAPHIR | 1.92674849 | 42.800 |
| 50 | 0.000000 | 0.999826 | H2O | 1.43612686 | 42.800 |
| 51 | 0.000000 | 0.000000 | AIR | 0.00000000 | 15.501 |

TABLE 2A

ASPHERIC CONSTANTS

| | SRF | | | | |
|---|---|---|---|---|---|
| | 1 | 6 | 9 | 12 | 14 |
| K | 0 | 0 | 0 | 0 | 0 |
| C1 | −8.448852e−08 | −4.108258e−09 | −6.153759e−08 | 4.456016e−07 | −6.305745e−07 |
| C2 | −4.761055e−12 | −9.598657e−12 | −1.480269e−11 | 1.857407e−11 | −7.903687e−11 |
| C3 | −1.420861e−16 | 1.072661e−15 | 1.473191e−15 | 1.064538e−14 | −2.534563e−14 |
| C4 | −8.023974e−20 | −6.889975e−20 | −3.255374e−19 | −5.079476e−18 | −3.735078e−18 |
| C5 | 1.173437e−23 | 2.314066e−24 | 3.131675e−23 | 1.056992e−22 | 1.905659e−22 |
| C6 | −1.454073e−27 | −3.793935e−29 | −6.955428e−28 | 7.981996e−26 | −3.500146e−26 |
| C7 | 0.000000e+00 | 0.000000e+00 | 0.000000e+00 | 0.000000e+00 | 0.000000e+00 |

TABLE 2A-continued

ASPHERIC CONSTANTS

| | \multicolumn{5}{c}{SRF} |
| --- | --- | --- | --- | --- | --- |
| | 20 | 24 | 25 | 26 | 29 |
| K  | 0 | 0 | 0 | 0 | 0 |
| C1 | 1.209336e−07 | 1.259532e−08 | −4.077497e−09 | 1.111414e−07 | −8.942189e−08 |
| C2 | 1.869926e−11 | 3.424345e−13 | −8.690596e−14 | 3.172584e−13 | −1.116520e−13 |
| C3 | 1.314270e−15 | 6.952906e−18 | −1.505812e−18 | 3.429058e−19 | 4.168290e−16 |
| C4 | 3.650689e−19 | 3.744203e−22 | −8.583957e−23 | −1.068048e−20 | −2.231424e−19 |
| C5 | −5.603440e−23 | −1.203108e−26 | 2.784182e−27 | 1.935865e−24 | 2.267328e−23 |
| C6 | 9.844086e−27 | 6.714766e−31 | −1.066606e−31 | −5.318242e−29 | −1.588914e−27 |
| C7 | 0.000000e+00 | 0.000000e+00 | 0.000000e+00 | 0.000000e+00 | 0.000000e+00 |

| | \multicolumn{5}{c}{SRF} |
| --- | --- | --- | --- | --- | --- |
| | 32 | 34 | 39 | 45 | 47 |
| K  | 0 | 0 | 0 | 0 | 0 |
| C1 | −9.549663e−08 | −5.673614e−09 | −1.220571e−08 | −2.613273e−08 | 1.649072e−07 |
| C2 | −3.034519e−12 | −5.774683e−14 | 4.574492e−13 | 4.882999e−12 | −4.982295e−13 |
| C3 | 1.985443e−16 | −1.715933e−16 | −3.026161e−17 | −2.171852e−16 | −2.462341e−16 |
| C4 | −1.403621e−20 | 5.949307e−21 | 8.480395e−22 | 8.220913e−21 | 6.329880e−19 |
| C5 | 2.496197e−24 | 1.220843e−25 | −5.629908e−27 | 2.183741e−25 | −1.498580e−22 |
| C6 | −1.598958e−28 | −2.178077e−29 | −3.377722e−32 | −2.816869e−29 | 1.552461e−26 |
| C7 | 0.000000e+00 | 0.000000e+00 | 0.000000e+00 | 1.520501e−33 | 0.000000e+00 |

TABLE 3

Embodiment 3 (b037a): NA = 1.45, β = −0.25, λ = 193.4 nm

| SURF | RADIUS | THICKNESS | MATERIAL | INDEX | SEMIDIAM. |
| --- | --- | --- | --- | --- | --- |
| 0  | 0.000000 | 37.647680 |        |            | 62.000  |
| 1  | 178.098560 | 47.089109 | SIO2HL | 1.56018811 | 83.684  |
| 2  | 508.791874 | 0.982161  |        |            | 86.920  |
| 3  | 260.152118 | 29.610169 | SIO2HL | 1.56018811 | 89.203  |
| 4  | −897.680969 | 14.988854 |       |            | 89.348  |
| 5  | −224.555868 | 50.010854 | SIO2HL | 1.56018811 | 89.318  |
| 6  | −167.290149 | 6.943751  |        |            | 94.603  |
| 7  | 185.350898 | 29.083481 | SIO2HL | 1.56018811 | 84.200  |
| 8  | 161.696842 | 4.567325  |        |            | 74.817  |
| 9  | 156.295097 | 29.687097 | SIO2HL | 1.56018811 | 74.801  |
| 10 | −1628.579737 | 27.610587 |      |            | 72.999  |
| 11 | 116.709207 | 25.652869 | SIO2HL | 1.56018811 | 57.349  |
| 12 | 3359.816893 | 2.336800 |        |            | 52.702  |
| 13 | 0.000000 | 42.058143 |        |            | 50.890  |
| 14 | −114.711496 | 34.899486 | SIO2HL | 1.56018811 | 53.065  |
| 15 | −73.282662 | 4.817213  |        |            | 60.856  |
| 16 | −72.166685 | 17.818288 | SIO2HL | 1.56018811 | 60.190  |
| 17 | −80.823907 | 4.905081  |        |            | 66.269  |
| 18 | −78.170209 | 34.642475 | SIO2HL | 1.56018811 | 65.802  |
| 19 | −161.353349 | 3.907912 |        |            | 83.613  |
| 20 | −250.115507 | 50.004289 | SIO2HL | 1.56018811 | 87.033  |
| 21 | −130.504962 | 244.427626 |       |            | 94.956  |
| 22 | −180.721067 | −214.432541 |     | REFL       | 135.011 |
| 23 | 179.125663 | 274.568868 |      | REFL       | 126.490 |
| 24 | 337.886373 | 47.239794 | SIO2HL | 1.56018811 | 107.066 |
| 25 | −899.516467 | 5.847365 |        |            | 104.221 |
| 26 | −2346.009271 | 43.828445 | SIO2HL | 1.56018811 | 101.016 |
| 27 | 101.771490 | 35.484160 |        |            | 86.055  |
| 28 | −4439.596410 | 23.703533 | SIO2HL | 1.56018811 | 86.263  |
| 29 | −254.324560 | 5.801976 |        |            | 87.609  |
| 30 | −445.540133 | 48.164461 | SIO2HL | 1.56018811 | 87.772  |
| 31 | −735.213902 | 16.951226 |       |            | 100.097 |
| 32 | −650.817086 | 49.961292 | SIO2HL | 1.56018811 | 102.416 |
| 33 | −281.005458 | 31.479288 |       |            | 116.698 |
| 34 | −649.019441 | 49.768062 | SIO2HL | 1.56018811 | 130.316 |
| 35 | −215.856617 | 0.928162  |       |            | 134.641 |
| 36 | 312.849138 | 39.828764 | SIO2HL | 1.56018811 | 135.256 |
| 37 | −1022.199791 | 0.857904 |       |            | 133.831 |
| 38 | 278.748013 | 42.635737 | SIO2HL | 1.56018811 | 128.369 |
| 39 | −3295.326556 | 0.914469 |       |            | 126.650 |

TABLE 3-continued

Embodiment 3 (b037a): NA = 1.45, β = −0.25, λ = 193.4 nm

| SURF | RADIUS | THICKNESS | MATERIAL | INDEX | SEMIDIAM. |
|---|---|---|---|---|---|
| 40 | 128.656616 | 61.387113 | SIO2HL | 1.56018811 | 106.520 |
| 41 | −2188.188515 | 0.730038 | | | 100.722 |
| 42 | 90.065507 | 18.596750 | SIO2HL | 1.56018811 | 69.706 |
| 43 | 93.775489 | 1.000000 | | | 60.097 |
| 44 | 73.203900 | 33.227474 | SAPHIR | 1.92674849 | 55.900 |
| 45 | 0.000000 | 11.657723 | SIO2HL | 1.56018811 | 55.900 |
| 46 | 0.000000 | 0.999913 | HIINDEX | 1.55600000 | 55.900 |
| 47 | 0.000000 | 0.000000 | AIR | 0.00000000 | 15.520 |

TABLE 3A

ASPHERIC CONSTANTS

| | SRF | | | | |
|---|---|---|---|---|---|
| | 1 | 6 | 8 | 12 | 14 |
| K | 0 | 0 | 0 | 0 | 0 |
| C1 | −3.797021e−08 | 4.091151e−08 | 9.284044e−09 | 1.793476e−07 | −3.526789e−07 |
| C2 | −1.858357e−12 | −7.880362e−12 | 2.927990e−11 | −4.710051e−11 | −5.029864e−11 |
| C3 | 6.026920e−17 | 9.074630e−16 | −2.187906e−15 | 2.197728e−15 | −6.353989e−15 |
| C4 | −3.792813e−20 | −7.153651e−20 | 3.131133e−19 | −3.553387e−18 | −2.243484e−18 |
| C5 | 3.121506e−24 | 2.884237e−24 | −3.422295e−23 | −7.638265e−23 | 1.422334e−23 |
| C6 | −1.940311e−28 | −4.358943e−29 | 2.472280e−27 | 2.576563e−26 | −7.652798e−26 |
| C7 | 0.000000e+00 | 0.000000e+00 | 0.000000e+00 | 0.000000e+00 | 0.000000e+00 |

| | SRF | | | | |
|---|---|---|---|---|---|
| | 18 | 22 | 23 | 24 | 27 |
| K | 0 | 0 | 0 | 0 | 0 |
| C1 | 4.805447e−08 | 1.366493e−08 | −7.247654e−09 | 2.039086e−09 | −2.335210e−07 |
| C2 | 6.053101e−12 | 3.157722e−13 | −1.844324e−13 | 4.079171e−12 | −3.581428e−12 |
| C3 | 1.864225e−16 | 4.418704e−18 | −3.130608e−18 | 3.415807e−19 | 8.204976e−16 |
| C4 | 1.774391e−19 | 3.842541e−22 | −2.876782e−22 | −3.143532e−21 | −1.472132e−19 |
| C5 | −1.538124e−23 | −1.422352e−26 | 1.047999e−26 | −6.009771e−26 | 1.193755e−23 |
| C6 | 1.486597e−27 | 5.625242e−31 | −4.798652e−31 | 5.373759e−30 | −5.012293e−28 |
| C7 | 0.000000e+00 | 0.000000e+00 | 0.000000e+00 | 0.000000e+00 | 0.000000e+00 |

| | SRF | | | | |
|---|---|---|---|---|---|
| | 30 | 32 | 37 | 41 | 43 |
| K | 0 | 0 | 0 | 0 | 0 |
| C1 | −9.015949e−08 | −4.710517e−08 | 2.981775e−08 | 7.825942e−08 | −1.254855e−07 |
| C2 | −5.963683e−12 | 1.502154e−12 | −1.562632e−15 | −5.678508e−12 | 4.044789e−11 |
| C3 | −2.709599e−17 | −1.008729e−16 | −1.924785e−17 | 9.897699e−16 | 5.935178e−15 |
| C4 | 1.782520e−20 | −2.037099e−20 | 1.470777e−21 | −1.257950e−19 | −7.518165e−19 |
| C5 | −1.313151e−25 | 1.244695e−24 | −9.287054e−26 | 1.131690e−23 | 5.626054e−23 |
| C6 | 1.114296e−28 | −7.926554e−29 | 2.454712e−30 | −6.106697e−28 | 5.101190e−26 |
| C7 | 0.000000e+00 | 0.000000e+00 | 0.000000e+00 | 1.494562e−32 | 0.000000e+00 |

TABLE 4

Embodiment 4: NA = 1.35, β = −0.25, λ = 193.4 nm

| SURF | RADIUS | THICKNESS | MATERIAL | INDEX | SEMIDIAM. |
|---|---|---|---|---|---|
| 0 | 0.000000 | 37.647680 | | | 62.000 |
| 1 | 213.097095 | 21.139875 | SIO2HL | 1.56018811 | 81.073 |
| 2 | 980.962863 | 0.933467 | | | 81.638 |
| 3 | 312.309311 | 19.869666 | SIO2HL | 1.56018811 | 82.923 |
| 4 | 7050.227976 | 14.977212 | | | 82.853 |
| 5 | −284.845054 | 46.899913 | SIO2HL | 1.56018811 | 82.842 |
| 6 | −316.674517 | 31.820687 | | | 87.867 |
| 7 | 127.504953 | 32.199127 | SIO2HL | 1.56018811 | 90.842 |
| 8 | 177.687028 | 14.069304 | | | 84.748 |
| 9 | 233.816949 | 49.949045 | SIO2HL | 1.56018811 | 84.566 |
| 10 | −272.601570 | 1.802731 | | | 81.010 |
| 11 | 92.974202 | 24.948435 | SIO2HL | 1.56018811 | 61.866 |

TABLE 4-continued

Embodiment 4: NA = 1.35, β = -0.25, λ = 193.4 nm

| SURF | RADIUS | THICKNESS | MATERIAL | INDEX | SEMIDIAM. |
|---|---|---|---|---|---|
| 12 | 228.036841 | 31.795297 | | | 55.983 |
| 13 | -128.436888 | 15.028089 | SIO2HL | 1.56018811 | 45.986 |
| 14 | -208.039449 | 19.686225 | | | 50.292 |
| 15 | -85.822730 | 9.039605 | SIO2HL | 1.56018811 | 51.590 |
| 16 | -124.923386 | 5.248146 | | | 59.096 |
| 17 | -134.255203 | 24.981296 | SIO2HL | 1.56018811 | 61.621 |
| 18 | -86.028170 | 70.079618 | | | 66.114 |
| 19 | -91.784845 | 49.926992 | SIO2HL | 1.56018811 | 78.125 |
| 20 | -130.258172 | 3.354815 | | | 102.297 |
| 21 | -819.889396 | 43.461173 | SIO2HL | 1.56018811 | 114.993 |
| 22 | -193.549016 | 277.291798 | | | 117.690 |
| 23 | -220.432400 | -231.344649 | | REFL | 147.536 |
| 24 | 175.171589 | 261.356424 | | REFL | 120.087 |
| 25 | 222.618410 | 49.895981 | SIO2HL | 1.56018811 | 93.866 |
| 26 | 227.634130 | 10.722465 | | | 85.687 |
| 27 | 469.132386 | 43.799915 | SIO2HL | 1.56018811 | 85.491 |
| 28 | 112.693662 | 31.313114 | | | 76.622 |
| 29 | 12293.399547 | 31.702057 | SIO2HL | 1.56018811 | 77.313 |
| 30 | -155.449641 | 4.962336 | | | 79.575 |
| 31 | -219.506451 | 26.268152 | SIO2HL | 1.56018811 | 79.827 |
| 32 | -1377.822971 | 32.354789 | | | 93.063 |
| 33 | -519.892544 | 47.183977 | SIO2HL | 1.56018811 | 101.635 |
| 34 | -163.140684 | 1.841108 | | | 110.786 |
| 35 | -340.920966 | 26.977392 | SIO2HL | 1.56018811 | 116.967 |
| 36 | -214.582539 | 2.006234 | | | 120.143 |
| 37 | 271.181444 | 53.143321 | SIO2HL | 1.56018811 | 127.047 |
| 38 | -1118.441818 | 19.790952 | | | 125.887 |
| 39 | 0.000000 | -14.609943 | | | 112.489 |
| 40 | 174.102740 | 52.205661 | SIO2HL | 1.56018811 | 107.954 |
| 41 | -663.589997 | 3.836965 | | | 104.404 |
| 42 | 84.561977 | 46.625084 | SIO2HL | 1.56018811 | 71.481 |
| 43 | 95.046969 | 0.694913 | | | 51.033 |
| 44 | 64.492898 | 46.885676 | SAPHIR | 1.92674849 | 46.520 |
| 45 | 0.000000 | 1.000000 | H2O | 1.43612686 | 18.265 |
| 46 | 0.000000 | 0.000000 | AIR | 0.00000000 | 15.515 |

TABLE 4A

ASPHERIC CONSTANTS

| | SRF | | | | |
|---|---|---|---|---|---|
| | 1 | 6 | 8 | 12 | 15 |
| K | 0 | 0 | 0 | 0 | 0 |
| C1 | -7.766221e-09 | 3.921777e-08 | -1.973978e-08 | 2.262385e-07 | -2.849645e-07 |
| C2 | -1.414298e-12 | -7.469962e-12 | 1.686856e-11 | -3.111178e-11 | -3.795087e-11 |
| C3 | 2.026799e-16 | 9.877277e-16 | -1.521195e-15 | 8.999889e-15 | -4.195519e-15 |
| C4 | -9.311177e-21 | -6.240165e-20 | 2.838141e-19 | -4.631502e-18 | -2.684695e-18 |
| C5 | 8.983777e-26 | 3.683666e-24 | -2.893390e-23 | 7.225241e-23 | -2.249016e-23 |
| C6 | -5.139250e-30 | -1.606542e-28 | 1.372152e-27 | 5.035383e-26 | -5.606361e-26 |
| C7 | 0.000000e+00 | 0.000000e+00 | 0.000000e+00 | 0.000000e+00 | 0.000000e+00 |

| | SRF | | | | |
|---|---|---|---|---|---|
| | 19 | 23 | 24 | 25 | 28 |
| K | 0 | 0 | 0 | 0 | 0 |
| C1 | 2.306275e-08 | 9.197905e-09 | -7.280789e-09 | 8.044076e-07 | -1.035389e-08 |
| C2 | 1.672430e-12 | 1.297990e-13 | -2.062090e-13 | 6.845761e-13 | 5.752946e-14 |
| C3 | -3.451288e-18 | 1.447412e-18 | -3.885785e-18 | 8.440855e-17 | 3.412577e-16 |
| C4 | 3.656429e-20 | 4.002605e-23 | -3.101616e-22 | -8.233892e-21 | -1.247784e-19 |
| C5 | -5.091821e-24 | -7.044663e-28 | 1.113163e-26 | 1.115110e-24 | 5.556509e-24 |
| C6 | 5.148418e-28 | 3.011922e-32 | -6.186058e-31 | -3.079026e-29 | 1.295943e-27 |
| C7 | 0.000000e+00 | 0.000000e+00 | 0.000000e+00 | 0.000000e+00 | 0.000000e+00 |

| | SRF | | | | |
|---|---|---|---|---|---|
| | 31 | 33 | 38 | 41 | 44 |
| K | 0 | 0 | 0 | 0 | 0 |
| C1 | -1.291718e-07 | -4.530057e-08 | -1.801990e-08 | -2.682021e-08 | -1.900216e-07 |

TABLE 4A-continued

ASPHERIC CONSTANTS

| | | | | | |
|---|---|---|---|---|---|
| C2 | −4.385607e−12 | −2.081953e−13 | 6.277450e−13 | 7.361672e−12 | −4.832504e−11 |
| C3 | −2.255698e−16 | 1.680387e−16 | −5.256278e−17 | −3.951877e−16 | −1.233010e−14 |
| C4 | −2.117620e−21 | −4.155797e−20 | −4.688822e−21 | 1.434967e−20 | 7.440284e−19 |
| C5 | −1.322919e−24 | 3.040355e−24 | 4.497908e−25 | −3.980440e−26 | 1.430823e−22 |
| C6 | 1.074049e−28 | −1.238033e−28 | −9.348185e−30 | −2.642973e−29 | −3.924075e−25 |
| C7 | 0.000000e+00 | 0.000000e+00 | 0.000000e+00 | 1.163864e−33 | 0.0000 |

TABLE 5

Embodiment 5: NA = 1.6, β = −0.25, λ = 193.4 nm

| SURF | RADIUS | THICKNESS | MATERIAL | INDEX | SEMIDIAM. |
|---|---|---|---|---|---|
| 0 | 0.000000 | 37.663108 | | | 62.000 |
| 1 | 192.084227 | 26.622297 | SIO2V | 1.56078570 | 87.833 |
| 2 | 1075.649716 | 0.946456 | | | 88.233 |
| 3 | 491.402040 | 19.101530 | SIO2V | 1.56078570 | 88.867 |
| 4 | −934.209447 | 36.905290 | | | 88.935 |
| 5 | 125.340633 | 9.623977 | SIO2V | 1.56078570 | 90.013 |
| 6 | 122.019859 | 23.963817 | | | 87.312 |
| 7 | 252.185057 | 44.239148 | SIO2V | 1.56078570 | 87.669 |
| 8 | −204.394078 | 0.923049 | | | 87.161 |
| 9 | 102.471834 | 52.852020 | SIO2V | 1.56078570 | 67.768 |
| 10 | 254.533994 | 9.305878 | | | 48.073 |
| 11 | 0.000000 | 52.418616 | | | 46.820 |
| 12 | −75.641562 | 68.872834 | SIO2V | 1.56078570 | 58.068 |
| 13 | −124.953275 | 39.621161 | | | 93.864 |
| 14 | −835.558655 | 54.318921 | SIO2V | 1.56078570 | 126.993 |
| 15 | −178.850083 | 0.948020 | | | 130.230 |
| 16 | 2111.392648 | 22.857019 | SIO2V | 1.56078570 | 132.098 |
| 17 | −901.583067 | 358.679202 | | | 132.071 |
| 18 | −225.015829 | −231.613549 | | REFL | 160.876 |
| 19 | 168.185189 | 261.594819 | | REFL | 120.144 |
| 20 | −736.571530 | 23.114077 | SIO2V | 1.56078570 | 81.485 |
| 21 | 132.965130 | 36.406211 | | | 86.933 |
| 22 | −512.908458 | 28.535664 | SIO2V | 1.56078570 | 87.621 |
| 23 | −185.099986 | 6.615931 | | | 92.898 |
| 24 | −544.628556 | 33.807132 | SIO2V | 1.56078570 | 99.839 |
| 25 | −547.431224 | 19.995820 | | | 114.885 |
| 26 | −359.224408 | 99.479683 | SIO2V | 1.56078570 | 119.014 |
| 27 | −168.873687 | 12.916761 | | | 143.505 |
| 28 | 313.449462 | 92.758623 | SIO2V | 1.56078570 | 165.026 |
| 29 | 983.057723 | 1.167054 | | | 158.153 |
| 30 | 227.152511 | 48.817493 | SIO2V | 1.56078570 | 148.584 |
| 31 | 684.382976 | 0.981700 | | | 144.866 |
| 32 | 144.775480 | 60.829967 | SIO2V | 1.56078570 | 121.541 |
| 33 | 1285.387522 | 0.899534 | | | 116.276 |
| 34 | 99.002284 | 39.642869 | SIO2V | 1.56078570 | 84.155 |
| 35 | 243.117451 | 0.805490 | | | 74.674 |
| 36 | 65.952055 | 54.681070 | SAPHIR | 1.92674849 | 54.379 |
| 37 | 0.000000 | 0.000000 | AIR | 0.00000000 | 15.530 |

TABLE 5A

ASPHERIC CONSTANTS

| | SRF | | | | |
|---|---|---|---|---|---|
| | 4 | 5 | 10 | 14 | 18 |
| K | 0 | 0 | 0 | 0 | 0 |
| C1 | 4.332466e−08 | 5.983847e−08 | 4.678448e−07 | −5.502311e−09 | 9.581997e−09 |
| C2 | −4.251613e−12 | −1.394334e−11 | 1.214772e−11 | 6.759433e−14 | 1.191548e−13 |
| C3 | 8.548420e−16 | 1.246293e−15 | 1.462858e−14 | −2.777895e−18 | 5.628084e−19 |
| C4 | −7.822847e−20 | −2.065935e−19 | −5.084805e−18 | 1.850960e−22 | 7.255139e−23 |
| C5 | 3.463295e−24 | 1.861321e−23 | 4.192361e−22 | −7.883399e−27 | −1.691943e−27 |
| C6 | −7.495559e−29 | −7.372680e−28 | 1.456331e−26 | 1.533878e−31 | 3.619858e−32 |
| C7 | 0.000000e+00 | 0.000000e+00 | 0.000000e+00 | 0.000000e+00 | 0.000000e+00 |

TABLE 5A-continued

ASPHERIC CONSTANTS

| | SRF | | | | |
|---|---|---|---|---|---|
| | 19 | 20 | 21 | 24 | 26 |
| K | 0 | 0 | 0 | 0 | 0 |
| C1 | −5.661490e−09 | 8.762490e−08 | −3.207763e−08 | −6.520443e−08 | 4.364974e−09 |
| C2 | −1.921628e−13 | −1.093121e−11 | −5.311243e−12 | 4.777722e−13 | −1.522836e−12 |
| C3 | −7.055884e−19 | 1.359734e−15 | 6.816058e−16 | −7.895875e−17 | −6.656442e−18 |
| C4 | −6.935220e−22 | −2.479964e−19 | −2.253013e−19 | 1.733738e−20 | −2.640069e−21 |
| C5 | 3.152816e−26 | 2.421781e−23 | 2.354847e−23 | −2.097861e−24 | 2.889539e−25 |
| C6 | −1.191863e−30 | −1.346005e−27 | −1.003551e−27 | 1.235456e−28 | −1.101803e−29 |
| C7 | 0.000000e+00 | 0.000000e+00 | 0.000000e+00 | 0.000000e+00 | 0.000000e+00 |

| | SRF | | |
|---|---|---|---|
| | 29 | 33 | 35 |
| K | 0 | 0 | 0 |
| C1 | 8.788855e−09 | 3.258556e−08 | 1.084860e−07 |
| C2 | −6.462954e−13 | 1.588293e−12 | 6.094001e−12 |
| C3 | −1.551858e−17 | −1.752790e−16 | 1.646644e−16 |
| C4 | 1.099566e−21 | 1.227022e−20 | −9.287322e−20 |
| C5 | −1.930245e−26 | −5.173475e−25 | 1.657126e−23 |
| C6 | 1.160550e−31 | 1.295964e−29 | −1.278529e−27 |
| C7 | 0.000000e+00 | −1.104258e−34 | 0.000000e+00 |

TABLE 6

Shs2034

| SURFACE | RADIUS | THICKNESS | MATERIAL | INDEX 193.304 nm | ½ DIAM |
|---|---|---|---|---|---|
| 0 | 0.0000000000 | 13.434225652900 | | 1.00000000 | 52.000 |
| 1 | 204.3874298230AS | 17.365428346000 | SIO2 | 1.56028895 | 65.838 |
| 2 | 1142.1626550800AS | 16.068315513400 | | 1.00000000 | 66.043 |
| 3 | 86.0159109378AS | 25.645556590600 | SIO2 | 1.56028895 | 75.536 |
| 4 | 137.3169382110AS | 35.568722228500 | | 1.00000000 | 72.244 |
| 5 | 2336.6623042800AS | 31.001793035800 | SIO2 | 1.56028895 | 71.797 |
| 6 | −139.4399592830 | 0.700000001770 | | 1.00000000 | 72.786 |
| 7 | 380.7794975610AS | 15.351197739400 | SIO2 | 1.56028895 | 65.487 |
| 8 | −224.3812337980AS | 31.039821568900 | | 1.00000000 | 63.930 |
| 9 | 0.0000000000 | 60.200321556900 | | 1.00000000 | 53.223 |
| 10 | −64.2099274206 | 27.604283673900 | SIO2 | 1.56028895 | 59.641 |
| 11 | −79.6540010816 | 0.700000000000 | | 1.00000000 | 74.506 |
| 12 | 273.1750003050AS | 32.289852713200 | SIO2 | 1.56028895 | 106.773 |
| 13 | −2069.8862901100 | 0.700100443811 | | 1.00000000 | 107.271 |
| 14 | 165.6617490420AS | 76.997028967600 | SIO2 | 1.56028895 | 110.845 |
| 15 | −897.7469015400AS | 53.895298167500 | | 1.00000000 | 99.388 |
| 16 | 261.0741714970 | 256.541672929000 | | 1.00000000 | 87.549 |
| 17 REFL | −146.7196028870AS | −256.541672929000 | | −1.00000000 | 96.805 |
| 18 REFL | 261.0741714970AS | 256.541672929000 | | 1.00000000 | 201.836 |
| 19 | 0.0000000000 | 30.496109909800 | | 1.00000000 | 121.258 |
| 20 | 108.0456074120AS | 39.156429063400 | SIO2 | 1.56028895 | 87.427 |
| 21 | 132.3053653420 | 31.766137286300 | | 1.00000000 | 77.996 |
| 22 | 801.6162930400AS | 8.312069682500 | SIO2 | 1.56028895 | 74.098 |
| 23 | 165.0526781810 | 9.338882890150 | | 1.00000000 | 68.743 |
| 24 | 204.5021848420AS | 7.500000000060 | SIO2 | 1.56028895 | 68.005 |
| 25 | 90.1620315715AS | 51.282703485500 | | 1.00000000 | 63.506 |
| 26 | −176.5279024460AS | 9.804717509200 | SIO2 | 1.56028895 | 66.348 |
| 27 | 189.2637811660AS | 36.506600017800 | | 1.00000000 | 82.033 |
| 28 | −201.8303829090AS | 16.951309066700 | SIO2 | 1.56028895 | 86.005 |
| 29 | −294.2996128650 | 2.217117105890 | | 1.00000000 | 100.199 |
| 30 | 1265.9959137700AS | 69.614142391400 | SIO2 | 1.56028895 | 122.039 |
| 31 | −158.1782206310 | 0.933343606060 | | 1.00000000 | 127.287 |
| 32 | 1407.0565305900AS | 71.176921112100 | SIO2 | 1.56028895 | 159.879 |
| 33 | −286.7741415570 | 10.539079572600 | | 1.00000000 | 162.460 |
| 34 | 528.8765359890 | 20.852268104100 | SIO2 | 1.56028895 | 160.082 |
| 35 | 620.1839994330AS | 0.724062897109 | | 1.00000000 | 159.105 |
| 36 | 190.2199493410 | 46.240223494100 | SIO2 | 1.56028895 | 146.454 |
| 37 | 324.9149551340AS | 0.701214555902 | | 1.00000000 | 142.621 |
| 38 | 154.5074744160 | 52.370101208200 | SIO2 | 1.56028895 | 123.749 |

TABLE 6-continued

Shs2034

| SURFACE | RADIUS | THICKNESS | MATERIAL | INDEX 193.304 nm | ½ DIAM |
|---|---|---|---|---|---|
| 39 | 525.8220856250AS | 0.700181398503 | | 1.00000000 | 117.757 |
| 40 | 105.0571199310AS | 39.055206860100 | SIO2 | 1.56028895 | 85.088 |
| 41 | 251.0605459890AS | 0.700000009697 | | 1.00000000 | 77.136 |
| 42 | 61.2471992195AS | 8.767875977760 | SIO2 | 1.56028895 | 55.044 |
| 43 | 36.0000000000 | 0.200000000000 | IMM | 1.56100000 | 36.000 |
| 44 | 35.3477405743 | 47.730836867600 | SAPHIR | 1.92803200 | 35.348 |
| 45 | 0.0000000000 | 0.000000000000 | | 1.00000000 | 13.000 |

TABLE 6A

ASPHAERIC CONSTANTS

SURFACE NR. 1

| K | 0.000000000000 |
|---|---|
| C1 | 2.15559563865e−007 |
| C2 | 3.47269567925e−011 |
| C3 | −1.32743925608e−014 |
| C4 | 2.13245136549e−018 |
| C5 | −1.04461360941e−022 |
| C6 | −8.45930586562e−027 |
| C7 | 0.00000000000e+000 |
| C8 | 0.00000000000e+000 |
| C9 | 0.00000000000e+000 |

SURFACE NR. 2

| K | 0.000000000000 |
|---|---|
| C1 | 2.42680157673e−007 |
| C2 | 5.78637970516e−014 |
| C3 | −4.66956436865e−015 |
| C4 | 3.73035264802e−019 |
| C5 | 1.15267036277e−022 |
| C6 | −2.25371431397e−026 |
| C7 | 0.00000000000e+000 |
| C8 | 0.00000000000e+000 |
| C9 | 0.00000000000e+000 |

SURFACE NR. 3

| K | 0.000000000000 |
|---|---|
| C1 | 9.62983836062e−009 |
| C2 | −1.15848618185e−011 |
| C3 | 1.45469569660e−015 |
| C4 | −9.24677985263e−020 |
| C5 | 6.17618145883e−024 |
| C6 | −1.29171167523e−028 |
| C7 | 0.00000000000e+000 |
| C8 | 0.00000000000e+000 |
| C9 | 0.00000000000e+000 |

SURFACE NR. 4

| K | 0.000000000000 |
|---|---|
| C1 | 3.68219046737e−008 |
| C2 | 2.99597572849e−011 |
| C3 | −1.88053833273e−015 |
| C4 | 4.65784947865e−019 |
| C5 | −1.81718657348e−023 |
| C6 | 2.01146986754e−027 |
| C7 | 0.00000000000e+000 |
| C8 | 0.00000000000e+000 |
| C9 | 0.00000000000e+000 |

SURFACE NR. 5

| K | 0.000000000000 |
|---|---|
| C1 | −1.02837002998e−007 |
| C2 | −9.89947180534e−011 |
| C3 | 2.24018654893e−014 |
| C4 | −2.57279667909e−018 |
| C5 | 1.31518529616e−022 |
| C6 | −1.49133855112e−027 |
| C7 | 0.00000000000e+000 |
| C8 | 0.00000000000e+000 |
| C9 | 0.00000000000e+000 |

SURFACE NR. 7

| K | 0.000000000000 |
|---|---|
| C1 | −9.01134401945e−008 |
| C2 | 3.01055087653e−011 |
| C3 | −3.82363758531e−015 |
| C4 | 8.33075663400e−019 |
| C5 | −7.35510347731e−022 |
| C6 | 1.02885094729e−025 |
| C7 | 0.00000000000e+000 |
| C8 | 0.00000000000e+000 |
| C9 | 0.00000000000e+000 |

SURFACE NR. 8

| K | 0.000000000000 |
|---|---|
| C1 | 2.28096057131e−007 |
| C2 | 2.63297748454e−011 |
| C3 | 2.89958634508e−015 |
| C4 | 2.69025329856e−019 |
| C5 | −4.37286778691e−022 |
| C6 | 7.36963882703e−026 |
| C7 | 0.00000000000e+000 |
| C8 | 0.00000000000e+000 |
| C9 | 0.00000000000e+000 |

SURFACE NR. 12

| K | 0.000000000000 |
|---|---|
| C1 | −1.08578542065e−008 |
| C2 | 1.15897820514e−012 |
| C3 | 1.61159703971e−017 |
| C4 | −1.98581987305e−021 |
| C5 | 4.59387968528e−026 |
| C6 | −7.75179834831e−031 |
| C7 | 0.00000000000e+000 |
| C8 | 0.00000000000e+000 |
| C9 | 0.00000000000e+000 |

SURFACE NR. 14

| K | 0.000000000000 |
|---|---|
| C1 | 4.56717247971e−009 |
| C2 | 6.05265329766e−013 |
| C3 | −1.57336406950e−017 |
| C4 | 1.73349069478e−021 |
| C5 | −2.24443235811e−026 |
| C6 | −3.21226611551e−032 |
| C7 | 0.00000000000e+000 |
| C8 | 0.00000000000e+000 |
| C9 | 0.00000000000e+000 |

SURFACE NR. 15

| K | 0.000000000000 |
|---|---|
| C1 | 1.24012917431e−007 |
| C2 | 6.88679826614e−013 |
| C3 | 1.79993705657e−017 |
| C4 | 3.28162687874e−021 |
| C5 | −5.12141876726e−026 |

TABLE 6A-continued

ASPHAERIC CONSTANTS

| | |
|---|---|
| C6 | 1.82676171351e−030 |
| C7 | 0.00000000000e+000 |
| C8 | 0.00000000000e+000 |
| C9 | 0.00000000000e+000 |
| SURFACE NR. 17 | |
| K | −0.141806648213 |
| C1 | 1.42797597968e−008 |
| C2 | 4.87650527548e−013 |
| C3 | 2.67713889789e−018 |
| C4 | 1.30093166713e−021 |
| C5 | −5.44526859997e−026 |
| C6 | 2.45603797485e−030 |
| C7 | 0.00000000000e+000 |
| C8 | 0.00000000000e+000 |
| C9 | 0.00000000000e+000 |
| SURFACE NR. 18 | |
| K | −0.333522671830 |
| C1 | 4.07717280407e−010 |
| C2 | 4.97218066225e−015 |
| C3 | 3.41161783470e−020 |
| C4 | 7.60421041523e−025 |
| C5 | −6.13534482230e−030 |
| C6 | 1.46422388270e−034 |
| C7 | 0.00000000000e+000 |
| C8 | 0.00000000000e+000 |
| C9 | 0.00000000000e+000 |
| SURFACE NR. 20 | |
| K | 0.000000000000 |
| C1 | 1.09063780649e−009 |
| C2 | 2.41347526915e−013 |
| C3 | −3.49022317083e−017 |
| C4 | 5.96622397636e−021 |
| C5 | −4.76391067699e−025 |
| C6 | 3.36304260357e−029 |
| C7 | 0.00000000000e+000 |
| C8 | 0.00000000000e+000 |
| C9 | 0.00000000000e+000 |
| SURFACE NR. 22 | |
| K | 0.000000000000 |
| C1 | 3.28730013300e−008 |
| C2 | 2.67725791434e−012 |
| C3 | −8.77612115397e−016 |
| C4 | 2.74025083311e−019 |
| C5 | −2.94821254019e−023 |
| C6 | 1.38371215675e−027 |
| C7 | 0.00000000000e+000 |
| C8 | 0.00000000000e+000 |
| C9 | 0.00000000000e+000 |
| SURFACE NR. 24 | |
| K | 0.000000000000 |
| C1 | −7.45788707680e−008 |
| C2 | 1.23793311020e−011 |
| C3 | −3.18968579478e−015 |
| C4 | −9.46422242864e−019 |
| C5 | 2.12313752406e−022 |
| C6 | −1.22943475906e−026 |
| C7 | 0.00000000000e+000 |
| C8 | 0.00000000000e+000 |
| C9 | 0.00000000000e+000 |
| SURFACE NR. 25 | |
| K | 0.000000000000 |
| C1 | −2.93508405651e−009 |
| C2 | 2.32860225180e−011 |
| C3 | −2.50652260330e−015 |
| C4 | −1.18381249114e−018 |
| C5 | 1.40037428387e−022 |
| C6 | 1.47882131747e−027 |
| C7 | 0.00000000000e+000 |
| C8 | 0.00000000000e+000 |
| C9 | 0.00000000000e+000 |

TABLE 6A-continued

ASPHAERIC CONSTANTS

| | |
|---|---|
| SURFACE NR. 26 | |
| K | 0.000000000000 |
| C1 | −1.77688857374e−008 |
| C2 | −1.04099845293e−011 |
| C3 | −3.62402222822e−015 |
| C4 | 5.23096050239e−019 |
| C5 | −5.56344386153e−023 |
| C6 | 2.85184791444e−027 |
| C7 | 0.00000000000e+000 |
| C8 | 0.00000000000e+000 |
| C9 | 0.00000000000e+000 |
| SURFACE NR. 27 | |
| K | 0.000000000000 |
| C1 | 2.42141471393e−008 |
| C2 | −1.09079610419e−011 |
| C3 | −4.38567604241e−015 |
| C4 | 1.09882688211e−018 |
| C5 | −1.03478683716e−022 |
| C6 | 3.81545440937e−027 |
| C7 | 0.00000000000e+000 |
| C8 | 0.00000000000e+000 |
| C9 | 0.00000000000e+000 |
| SURFACE NR. 28 | |
| K | 0.000000000000 |
| C1 | −1.85204408243e−008 |
| C2 | 3.92673589370e−012 |
| C3 | 2.05047525875e−016 |
| C4 | −2.78920677409e−021 |
| C5 | −3.39994106260e−026 |
| C6 | 1.08861694678e−028 |
| C7 | 0.00000000000e+000 |
| C8 | 0.00000000000e+000 |
| C9 | 0.00000000000e+000 |
| SURFACE NR. 30 | |
| K | 0.000000000000 |
| C1 | −3.82792958476e−008 |
| C2 | 4.03438821160e−013 |
| C3 | −1.64535675887e−017 |
| C4 | −3.01893664173e−022 |
| C5 | 4.34266604202e−026 |
| C6 | −2.08739982859e−030 |
| C7 | 0.00000000000e+000 |
| C8 | 0.00000000000e+000 |
| C9 | 0.00000000000e+000 |
| SURFACE NR. 32 | |
| K | 0.000000000000 |
| C1 | −4.79983324244e−010 |
| C2 | −7.59672446738e−015 |
| C3 | 1.13909585954e−019 |
| C4 | 5.21104458389e−025 |
| C5 | 1.69574498336e−027 |
| C6 | −4.14079584136e−032 |
| C7 | 0.00000000000e+000 |
| C8 | 0.00000000000e+000 |
| C9 | 0.00000000000e+000 |
| SURFACE NR. 35 | |
| K | 0.000000000000 |
| C1 | −1.09859844654e−008 |
| C2 | 6.92192966090e−014 |
| C3 | −7.90470393533e−018 |
| C4 | −2.80761708448e−022 |
| C5 | 1.46654006207e−026 |
| C6 | −1.61624013736e−031 |
| C7 | 0.00000000000e+000 |
| C8 | 0.00000000000e+000 |
| C9 | 0.00000000000e+000 |
| SURFACE NR. 37 | |
| K | 0.000000000000 |
| C1 | −2.96676883270e−009 |
| C2 | −2.06488328052e−013 |

TABLE 6A-continued

ASPHAERIC CONSTANTS

| | |
|---|---|
| C3 | -1.43371546279e-018 |
| C4 | -6.78491894336e-023 |
| C5 | 6.97408517528e-027 |
| C6 | 4.92679247796e-032 |
| C7 | 0.00000000000e+000 |
| C8 | 0.00000000000e+000 |
| C9 | 0.00000000000e+000 |

SURFACE NR. 39

| | |
|---|---|
| K | 0.000000000000 |
| C1 | 7.60133220905e-009 |
| C2 | 1.56591482650e-013 |
| C3 | 1.01464432332e-016 |
| C4 | -6.41181749755e-021 |
| C5 | 2.56797352661e-025 |
| C6 | -4.06394006222e-030 |
| C7 | 0.00000000000e+000 |
| C8 | 0.00000000000e+000 |
| C9 | 0.00000000000e+000 |

SURFACE NR. 40

| | |
|---|---|
| K | 0.000000000000 |
| C1 | 6.00864999995e-008 |
| C2 | 1.54951310671e-012 |
| C3 | 2.95817046515e-016 |
| C4 | 1.52932567259e-020 |
| C5 | -1.91359153221e-025 |
| C6 | 4.03904851500e-028 |
| C7 | 0.00000000000e+000 |
| C8 | 0.00000000000e+000 |
| C9 | 0.00000000000e+000 |

SURFACE NR. 41

| | |
|---|---|
| K | 0.000000000000 |
| C1 | 1.28537465592e-007 |
| C2 | 1.13373406274e-012 |
| C3 | 4.58603338636e-016 |
| C4 | -2.43895218759e-020 |
| C5 | -1.87969207694e-024 |
| C6 | -1.33020757412e-028 |
| C7 | 0.00000000000e+000 |
| C8 | 0.00000000000e+000 |
| C9 | 0.00000000000e+000 |

SURFACE NR. 42

| | |
|---|---|
| K | 0.000000000000 |
| C1 | -1.06506281524e-007 |
| C2 | -2.07189661732e-011 |
| C3 | -3.34536569101e-015 |
| C4 | -5.55548935549e-019 |
| C5 | 1.27150562286e-022 |
| C6 | 1.16078588552e-027 |
| C7 | 0.00000000000e+000 |
| C8 | 0.00000000000e+000 |
| C9 | 0.00000000000e+000 |

TABLE 6Z

SHS 2034

| Nr | Sf | Rv | RENV | 2 * Hmax | Def[mμ] | Z9 | Z16 | Z25 | Z36 | Z49 | Z64 | Z81 | Z100 |
|---|---|---|---|---|---|---|---|---|---|---|---|---|---|
| 1: | 1 | 204.39 | 149.48 | 128.99 | 906.0 | 607.50 | -30.79 | -8.18 | 0.00 | -1.277 | -0.0531 | 0.00000 | 0.000000 |
| 2: | 2 | -1142.16 | -401.48 | 129.35 | 713.2 | -473.48 | 67.25 | 7.45 | 2.08 | 1.245 | 0.1472 | 0.00000 | 0.000000 |
| 3: | 3 | 86.02 | 86.68 | 146.09 | 79.6 | -60.63 | 17.67 | 15.71 | 1.24 | 0.404 | 0.0476 | 0.00660 | 0.000548 |
| 4: | 4 | -137.32 | -115.59 | 139.10 | 1314.6 | -832.51 | -203.65 | -23.90 | -4.75 | -0.204 | -0.0349 | 0.00011 | 0.000007 |
| 5: | 5 | 2336.66 | -454.98 | 137.35 | 1759.2 | -1184.23 | -17.83 | 22.36 | -8.33 | 1.273 | -0.0226 | 0.00000 | 0.000000 |
| 6: | 7 | 380.78 | 464.41 | 126.32 | 321.0 | -184.43 | -71.41 | -25.43 | 5.17 | 3.059 | 0.4822 | 0.00000 | 0.000000 |
| 7: | 8 | 224.38 | 538.02 | 123.36 | 1479.9 | -976.20 | -99.47 | -6.46 | -4.14 | -1.784 | -0.2476 | 0.00000 | 0.000000 |
| 8: | 12 | 273.18 | 268.56 | 221.47 | 365.8 | 229.33 | 86.38 | -7.92 | -1.05 | 0.047 | -0.0094 | 0.00000 | 0.000000 |
| 9: | 14 | 165.66 | 160.21 | 227.80 | 483.7 | 312.75 | 62.66 | 5.19 | 0.45 | -0.236 | -0.0153 | -0.00154 | -0.000112 |
| 10: | 15 | 897.75 | -586.24 | 203.91 | 3882.4 | -2578.70 | -108.64 | -15.36 | -1.35 | -0.021 | -0.0070 | 0.00000 | 0.000000 |
| 11: | 17 | -146.72 | -155.15 | 193.61 | 511.7 | 337.75 | 34.57 | 3.18 | 0.34 | 0.027 | 0.0054 | 0.00007 | 0.000005 |
| 12: | 18 | -261.07 | -273.22 | 403.67 | 1186.6 | 756.16 | 152.09 | 27.66 | 4.68 | 0.727 | 0.0978 | 0.01115 | 0.000814 |
| 13: | 20 | 108.05 | 107.80 | 178.57 | 29.2 | 18.66 | 4.61 | 1.52 | 0.47 | 0.051 | 0.0073 | -0.00158 | -0.000130 |
| 14: | 22 | 801.62 | 559.38 | 151.29 | 471.9 | 306.75 | 43.57 | 8.22 | 0.59 | -0.067 | 0.0810 | 0.00000 | 0.000000 |
| 15: | 24 | 204.50 | 255.08 | 137.49 | 829.7 | -524.53 | -128.81 | -15.65 | 4.78 | 0.108 | -0.1886 | 0.00000 | 0.000000 |
| 16: | 25 | -90.16 | -89.72 | 127.07 | 103.4 | 20.01 | 76.98 | 17.79 | -2.69 | -0.743 | -0.0061 | 0.00015 | 0.000011 |
| 17: | 26 | -176.53 | -155.07 | 131.42 | 677.0 | -433.47 | -102.30 | -4.60 | 0.62 | -0.088 | 0.0233 | 0.00000 | 0.000000 |
| 18: | 27 | -189.26 | -220.58 | 157.62 | 984.7 | 657.53 | 108.11 | -30.63 | -0.11 | 1.276 | -0.3964 | 0.00000 | 0.000000 |
| 19: | 28 | -201.83 | -212.14 | 167.14 | 523.2 | 312.67 | 124.00 | 12.06 | 1.75 | 0.330 | 0.0257 | 0.00000 | 0.000000 |
| 20: | 30 | 1266.00 | -7224.09 | 227.28 | 1480.8 | -984.52 | -7.01 | -8.58 | -0.84 | -0.256 | -0.0364 | 0.00000 | 0.000000 |
| 21: | 32 | 1407.06 | 1442.79 | 295.20 | 36.8 | -23.42 | 11.31 | 3.38 | 0.00 | -0.169 | -0.0281 | 0.00000 | 0.000000 |
| 22: | 35 | -620.18 | -1014.16 | 304.16 | 2167.7 | 1425.44 | 173.11 | 12.99 | -6.51 | -0.262 | 0.1667 | 0.00000 | 0.000000 |
| 23: | 37 | -324.91 | -352.45 | 282.80 | 774.1 | 522.77 | 46.40 | -20.18 | -5.86 | -0.721 | -0.0184 | 0.00000 | 0.000000 |
| 24: | 39 | -525.82 | -406.99 | 240.20 | 1458.2 | -940.92 | -193.43 | -12.92 | 0.20 | -0.503 | -0.1538 | 0.00000 | 0.000000 |
| 25: | 40 | 105.06 | 98.61 | 175.40 | 625.2 | 473.07 | 34.96 | 0.09 | -4.33 | -1.911 | -0.5581 | -0.09587 | -0.008072 |
| 26: | 41 | -251.06 | -176.51 | 163.03 | 1466.2 | -984.32 | -14.98 | 14.30 | 4.90 | 0.464 | 0.0222 | 0.00000 | 0.000000 |
| 27: | 42 | 61.25 | 62.75 | 112.90 | 143.0 | -127.78 | 49.34 | 35.43 | 11.79 | 2.671 | 0.4590 | 0.06114 | 0.005294 |

TABLE 7

Shs2035

| SURFACE | RADIUS | THICKNESS | MATERIAL | INDEX 193.304 nm | ½ DIAM |
|---|---|---|---|---|---|
| 0 | 0.0000000000 | 15.679282349200 | | 1.00000000 | 52.000 |
| 1 | 188.9361455030AS | 18.288674598600 | SIO2 | 1.56028895 | 68.284 |

TABLE 7-continued

Shs2035

| SURFACE | RADIUS | THICKNESS | MATERIAL | INDEX 193.304 nm | ½ DIAM |
|---|---|---|---|---|---|
| 2 | 694.1043431650AS | 13.221429473000 | | 1.00000000 | 68.292 |
| 3 | 84.8053215142AS | 26.533452202300 | SIO2 | 1.56028895 | 75.689 |
| 4 | 139.9217727560AS | 35.813107735000 | | 1.00000000 | 71.829 |
| 5 | 991.1217961470AS | 26.635290884600 | SIO2 | 1.56028895 | 71.359 |
| 6 | −152.4471481430 | 0.705435225252 | | 1.00000000 | 71.866 |
| 7 | 561.4522817590AS | 15.771790808700 | SIO2 | 1.56028895 | 66.252 |
| 8 | −188.7715763730AS | 31.039821568900 | | 1.00000000 | 64.663 |
| 9 | 0.0000000000 | 60.200321556900 | | 1.00000000 | 53.209 |
| 10 | −63.2575986324 | 27.604744379400 | SIO2 | 1.56028895 | 59.416 |
| 11 | −80.7157309618 | 0.700000551729 | | 1.00000000 | 75.455 |
| 12 | 296.4896501680AS | 37.879478386600 | SIO2 | 1.56028895 | 111.891 |
| 13 | −763.9145212360 | 0.700037253092 | | 1.00000000 | 112.624 |
| 14 | 170.2692851210AS | 80.042091181800 | SIO2 | 1.56028895 | 116.621 |
| 15 | −952.4975107830AS | 66.049513376500 | | 1.00000000 | 104.125 |
| 16 | 261.0741714970 | 255.783578603000 | | 1.00000000 | 89.528 |
| 17 REFL | −146.1773704860AS | −255.783578603000 | | −1.00000000 | 97.453 |
| 18 REFL | 261.0997517790AS | 255.783578603000 | | 1.00000000 | 205.856 |
| 19 | 0.0000000000 | 28.735542080900 | | 1.00000000 | 124.760 |
| 20 | 109.6782509150AS | 38.909049290900 | SIO2 | 1.56028895 | 88.089 |
| 21 | 135.0819403950 | 34.026191601900 | | 1.00000000 | 77.262 |
| 22 | 924.4561476110AS | 8.069959863570 | SIO2 | 1.56028895 | 72.489 |
| 23 | 160.5273775430 | 10.595882904100 | | 1.00000000 | 67.277 |
| 24 | 235.8718663040AS | 7.500000282500 | SIO2 | 1.56028895 | 66.691 |
| 25 | 91.9041643509AS | 53.294023047800 | | 1.00000000 | 62.768 |
| 26 | −205.3313455720AS | 10.112177939500 | SIO2 | 1.56028895 | 67.817 |
| 27 | 181.5659153660AS | 36.638050799700 | | 1.00000000 | 84.020 |
| 28 | −218.8110282430AS | 17.002554642700 | SIO2 | 1.56028895 | 88.472 |
| 29 | −306.0771138910 | 2.194650554950 | | 1.00000000 | 101.900 |
| 30 | 1012.5233622100AS | 70.026755238900 | SIO2 | 1.56028895 | 124.857 |
| 31 | −164.6431855120 | 1.440946030220 | | 1.00000000 | 130.125 |
| 32 | 2428.6611437000AS | 73.814351328800 | SIO2 | 1.56028895 | 162.607 |
| 33 | −268.7836036320 | 5.493021022200 | | 1.00000000 | 165.580 |
| 34 | 488.5298714750 | 22.840490084300 | SIO2 | 1.56028895 | 163.904 |
| 35 | 580.9338597070AS | 0.700105164493 | | 1.00000000 | 162.871 |
| 36 | 187.5425527570 | 48.105092550200 | SIO2 | 1.56028895 | 148.849 |
| 37 | 309.0482752900AS | 0.700000000000 | | 1.00000000 | 144.793 |
| 38 | 154.7060357500 | 52.700158760500 | SIO2 | 1.56028895 | 125.378 |
| 39 | 487.2890983560AS | 0.700109862209 | | 1.00000000 | 119.143 |
| 40 | 108.8519037810AS | 38.999967097200 | SIO2 | 1.56028895 | 86.389 |
| 41 | 255.7300706450AS | 0.700000000028 | | 1.00000000 | 78.106 |
| 42 | 58.8111563603AS | 8.208600134150 | SIO2 | 1.56028895 | 54.205 |
| 43 | 36.0000000000 | 0.200000000000 | IMM | 1.56100000 | 36.000 |
| 44 | 35.5270708244 | 47.858381827100 | SAPHIR | 1.92803200 | 35.527 |
| 45 | 0.0000000000 | 0.000000000000 | | 1.00000000 | 13.000 |

TABLE 7A

ASPHAERIC CONSTANTS

SURFACE NR. 1

| K | 0.000000000000 |
|---|---|
| C1 | 1.86059361768e−007 |
| C2 | 4.05057017192e−011 |
| C3 | −1.31841572067e−014 |
| C4 | 2.11455178287e−018 |
| C5 | −1.37550363215e−022 |
| C6 | −3.06548485772e−027 |
| C7 | 0.00000000000e+000 |
| C8 | 0.00000000000e+000 |
| C9 | 0.00000000000e+000 |

SURFACE NR. 2

| K | 0.000000000000 |
|---|---|
| C1 | 2.24682809077e−007 |
| C2 | −3.80408550218e−013 |
| C3 | −5.07763034577e−015 |
| C4 | 8.78051550397e−019 |
| C5 | −3.18680606332e−023 |
| C6 | −8.78627241886e−027 |
| C7 | 0.00000000000e+000 |
| C8 | 0.00000000000e+000 |
| C9 | 0.00000000000e+000 |

SURFACE NR. 3

| K | 0.000000000000 |
|---|---|
| C1 | 3.08843746784e−008 |
| C2 | −1.63321292542e−011 |
| C3 | 2.56349264518e−015 |
| C4 | −1.58876710814e−019 |
| C5 | 4.77752939064e−024 |
| C6 | 1.23800518289e−027 |
| C7 | 0.00000000000e+000 |
| C8 | 0.00000000000e+000 |
| C9 | 0.00000000000e+000 |

TABLE 7A-continued

ASPHAERIC CONSTANTS

SURFACE NR. 4

| | |
|---|---|
| K | 0.000000000000 |
| C1 | 1.07709071403e-007 |
| C2 | 2.81021734141e-011 |
| C3 | -8.15414861895e-016 |
| C4 | 4.62084903826e-019 |
| C5 | -5.11359978782e-024 |
| C6 | 4.23529675830e-027 |
| C7 | 0.00000000000e+000 |
| C8 | 0.00000000000e+000 |
| C9 | 0.00000000000e+000 |

SURFACE NR. 5

| | |
|---|---|
| K | 0.000000000000 |
| C1 | -9.53421881016e-008 |
| C2 | -1.03844971388e-010 |
| C3 | 2.32054024129e-014 |
| C4 | -2.55893960085e-018 |
| C5 | 1.46964131542e-022 |
| C6 | -5.68168161656e-027 |
| C7 | 0.00000000000e+000 |
| C8 | 0.00000000000e+000 |
| C9 | 0.00000000000e+000 |

SURFACE NR. 7

| | |
|---|---|
| K | 0.000000000000 |
| C1 | -1.42410844113e-007 |
| C2 | 3.63573091706e-011 |
| C3 | -3.59181355360e-015 |
| C4 | 3.88098016915e-019 |
| C5 | -7.68689276860e-022 |
| C6 | 1.36306743838e-025 |
| C7 | 0.00000000000e+000 |
| C8 | 0.00000000000e+000 |
| C9 | 0.00000000000e+000 |

SURFACE NR. 8

| | |
|---|---|
| K | 0.000000000000 |
| C1 | 1.82920529853e-007 |
| C2 | 3.21137729148e-011 |
| C3 | 1.67685051231e-015 |
| C4 | 4.42833608238e-019 |
| C5 | -5.21173870061e-022 |
| C6 | 1.01042894894e-025 |
| C7 | 0.00000000000e+000 |
| C8 | 0.00000000000e+000 |
| C9 | 0.00000000000e+000 |

SURFACE NR. 12

| | |
|---|---|
| K | 0.000000000000 |
| C1 | -1.09760181303e-008 |
| C2 | 8.99330099331e-013 |
| C3 | 2.07163843123e-017 |
| C4 | -1.45949776651e-021 |
| C5 | -7.59048793631e-027 |
| C6 | 6.78605969949e-031 |
| C7 | 0.00000000000e+000 |
| C8 | 0.00000000000e+000 |
| C9 | 0.00000000000e+000 |

SURFACE NR. 14

| | |
|---|---|
| K | 0.000000000000 |
| C1 | 3.68587285688e-009 |
| C2 | 8.03420920687e-013 |
| C3 | -2.41712300553e-017 |
| C4 | 2.07350539074e-021 |
| C5 | -4.32523648446e-026 |
| C6 | 8.09494371326e-031 |
| C7 | 0.00000000000e+000 |
| C8 | 0.00000000000e+000 |
| C9 | 0.00000000000e+000 |

SURFACE NR. 15

| | |
|---|---|
| K | 0.000000000000 |
| C1 | 1.14142103559e-007 |
| C2 | 5.38434133214e-013 |
| C3 | 3.63169684499e-017 |
| C4 | 3.00299527459e-021 |
| C5 | -7.77924941038e-026 |
| C6 | 1.73446531567e-030 |
| C7 | 0.00000000000e+000 |
| C8 | 0.00000000000e+000 |
| C9 | 0.00000000000e+000 |

SURFACE NR. 17

| | |
|---|---|
| K | -0.130103822401 |
| C1 | 1.51920737571e-008 |
| C2 | 5.22604911334e-013 |
| C3 | 2.59906899521e-018 |
| C4 | 1.63390676191e-021 |
| C5 | -7.55562058166e-026 |
| C6 | 3.26060344061e-030 |
| C7 | 0.00000000000e+000 |
| C8 | 0.00000000000e+000 |
| C9 | 0.00000000000e+000 |

SURFACE NR. 18

| | |
|---|---|
| K | -0.337383833302 |
| C1 | 4.20663807019e-010 |
| C2 | 5.30791743228e-015 |
| C3 | 3.12683337206e-020 |
| C4 | 1.14513963911e-024 |
| C5 | -1.22569865540e-029 |
| C6 | 2.15298250643e-034 |
| C7 | 0.00000000000e+000 |
| C8 | 0.00000000000e+000 |
| C9 | 0.00000000000e+000 |

SURFACE NR. 20

| | |
|---|---|
| K | 0.000000000000 |
| C1 | 3.07330350059e-009 |
| C2 | 3.51299446462e-013 |
| C3 | -2.73096011107e-017 |
| C4 | 7.53235543248e-021 |
| C5 | -5.51768568282e-025 |
| C6 | 4.77403823132e-029 |
| C7 | 0.00000000000e+000 |
| C8 | 0.00000000000e+000 |
| C9 | 0.00000000000e+000 |

SURFACE NR. 22

| | |
|---|---|
| K | 0.000000000000 |
| C1 | 3.73843386108e-008 |
| C2 | 2.42848115213e-012 |
| C3 | -9.69703374779e-016 |
| C4 | 3.36358677040e-019 |
| C5 | -3.68962417533e-023 |
| C6 | 1.70287625834e-027 |
| C7 | 0.00000000000e+000 |
| C8 | 0.00000000000e+000 |
| C9 | 0.00000000000e+000 |

SURFACE NR. 24

| | |
|---|---|
| K | 0.000000000000 |
| C1 | -7.89532696153e-008 |
| C2 | 1.31890077992e-011 |
| C3 | -3.76703391800e-015 |
| C4 | -1.09246682182e-018 |
| C5 | 2.62589383473e-022 |
| C6 | -1.51931245274e-026 |
| C7 | 0.00000000000e+000 |
| C8 | 0.00000000000e+000 |
| C9 | 0.00000000000e+000 |

SURFACE NR. 25

| | |
|---|---|
| K | 0.000000000000 |
| C1 | 2.60931514972e-008 |
| C2 | 2.51002823061e-011 |
| C3 | -3.21559778683e-015 |
| C4 | -1.33762959057e-018 |
| C5 | 1.72420265055e-022 |
| C6 | 4.07836656337e-027 |
| C7 | 0.00000000000e+000 |

TABLE 7A-continued

ASPHAERIC CONSTANTS

| | |
|---|---|
| C8 | 0.00000000000e+000 |
| C9 | 0.00000000000e+000 |

SURFACE NR. 26

| | |
|---|---|
| K | 0.000000000000 |
| C1 | 1.03539135151e-008 |
| C2 | -1.16928750430e-011 |
| C3 | -3.73401954915e-015 |
| C4 | 6.94086715792e-019 |
| C5 | -8.72530972529e-023 |
| C6 | 5.60584760968e-027 |
| C7 | 0.00000000000e+000 |
| C8 | 0.00000000000e+000 |
| C9 | 0.00000000000e+000 |

SURFACE NR. 27

| | |
|---|---|
| K | 0.000000000000 |
| C1 | 2.25456278813e-008 |
| C2 | -1.08400561429e-011 |
| C3 | -4.50684319751e-015 |
| C4 | 1.09796369033e-018 |
| C5 | -1.01874753749e-022 |
| C6 | 3.70973359868e-027 |
| C7 | 0.00000000000e+000 |
| C8 | 0.00000000000e+000 |
| C9 | 0.00000000000e+000 |

SURFACE NR. 28

| | |
|---|---|
| K | 0.000000000000 |
| C1 | -2.36838070001e-008 |
| C2 | 4.98343064034e-012 |
| C3 | 1.78215458358e-016 |
| C4 | 9.85666857804e-022 |
| C5 | -7.70745734815e-026 |
| C6 | 8.05694832124e-029 |
| C7 | 0.00000000000e+000 |
| C8 | 0.00000000000e+000 |
| C9 | 0.00000000000e+000 |

SURFACE NR. 30

| | |
|---|---|
| K | 0.000000000000 |
| C1 | -3.85494020143e-008 |
| C2 | 3.54826973931e-013 |
| C3 | -1.49388026004e-017 |
| C4 | -1.35039738322e-022 |
| C5 | 2.90800216333e-026 |
| C6 | -1.62600691982e-030 |
| C7 | 0.00000000000e+000 |
| C8 | 0.00000000000e+000 |
| C9 | 0.00000000000e+000 |

SURFACE NR. 32

| | |
|---|---|
| K | 0.000000000000 |
| C1 | -6.25892500858e-010 |
| C2 | -1.36988090673e-014 |
| C3 | -9.26633392978e-020 |
| C4 | -6.32699253504e-025 |
| C5 | 2.00230743996e-027 |
| C6 | -4.26768706269e-032 |
| C7 | 0.00000000000e+000 |
| C8 | 0.00000000000e+000 |
| C9 | 0.00000000000e+000 |

SURFACE NR. 35

| | |
|---|---|
| K | 0.000000000000 |
| C1 | -1.08959324605e-008 |
| C2 | 7.24998109883e-014 |
| C3 | -7.82840684501e-018 |
| C4 | -2.81131614820e-022 |
| C5 | 1.42546937787e-026 |
| C6 | -1.52188651619e-031 |
| C7 | 0.00000000000e+000 |
| C8 | 0.00000000000e+000 |
| C9 | 0.00000000000e+000 |

SURFACE NR. 37

| | |
|---|---|
| K | 0.000000000000 |

TABLE 7A-continued

ASPHAERIC CONSTANTS

| | |
|---|---|
| C1 | -2.80186987842e-009 |
| C2 | -2.05383027167e-013 |
| C3 | -1.55866356601e-018 |
| C4 | -8.89189354781e-023 |
| C5 | 5.35867582708e-027 |
| C6 | 9.12022739781e-032 |
| C7 | 0.00000000000e+000 |
| C8 | 0.00000000000e+000 |
| C9 | 0.00000000000e+000 |

SURFACE NR. 39

| | |
|---|---|
| K | 0.000000000000 |
| C1 | 7.83474440861e-009 |
| C2 | 1.40055971213e-013 |
| C3 | 1.00311924761e-016 |
| C4 | -6.35254246763e-021 |
| C5 | 2.65703273552e-025 |
| C6 | -4.14720963970e-030 |
| C7 | 0.00000000000e+000 |
| C8 | 0.00000000000e+000 |
| C9 | 0.00000000000e+000 |

SURFACE NR. 40

| | |
|---|---|
| K | 0.000000000000 |
| C1 | 7.46127188025e-008 |
| C2 | 5.67967381528e-013 |
| C3 | 4.17445504105e-016 |
| C4 | 2.57082159937e-021 |
| C5 | 9.18165436064e-025 |
| C6 | 3.30686900059e-028 |
| C7 | 0.00000000000e+000 |
| C8 | 0.00000000000e+000 |
| C9 | 0.00000000000e+000 |

SURFACE NR. 41

| | |
|---|---|
| K | 0.000000000000 |
| C1 | 1.25881731383e-007 |
| C2 | 1.23553315215e-012 |
| C3 | 4.54918020734e-016 |
| C4 | -1.63322327917e-020 |
| C5 | -1.95435442503e-024 |
| C6 | -1.52319096577e-028 |
| C7 | 0.00000000000e+000 |
| C8 | 0.00000000000e+000 |
| C9 | 0.00000000000e+000 |

SURFACE NR. 42

| | |
|---|---|
| K | 0.000000000000 |
| C1 | -1.20018996760e-007 |
| C2 | -2.10066510146e-011 |
| C3 | -3.78177102896e-015 |
| C4 | -6.06882898398e-019 |
| C5 | 6.74996127002e-023 |
| C6 | 2.11373972091e-027 |
| C7 | 0.00000000000e+000 |
| C8 | 0.00000000000e+000 |
| C9 | 0.00000000000e+000 |

TABLE 7Z

SHS2035

| Nr | Sf | RV | RENV | 2*HMax | Def[mµ] | Z9 | Z16 | Z25 | Z36 | Z49 | Z64 | Z81 | Z100 |
|---|---|---|---|---|---|---|---|---|---|---|---|---|---|
| 1: | 1 | 188.94 | 141.31 | 132.80 | 982.0 | 660.48 | −27.25 | −12.55 | −0.29 | −1.470 | −0.0290 | 0.00000 | 0.000000 |
| 2: | 2 | −694.10 | −340.18 | 132.77 | 672.2 | −444.77 | 82.07 | 11.44 | 3.35 | 1.328 | 0.0827 | 0.00000 | 0.000000 |
| 3: | 3 | 84.81 | 84.75 | 146.07 | 52.7 | −14.57 | 32.69 | 23.06 | 1.84 | 0.662 | 0.0385 | −0.00075 | −0.000063 |
| 4: | 4 | −139.92 | −109.28 | 137.98 | 1788.3 | −1127.23 | −269.80 | −46.42 | −8.71 | −0.791 | −0.0651 | 0.00027 | 0.000017 |
| 5: | 5 | 991.12 | −645.57 | 136.00 | 1679.7 | −1130.72 | −12.02 | 21.89 | −10.13 | 0.582 | −0.0749 | 0.00000 | 0.000000 |
| 6: | 7 | 561.45 | 919.25 | 126.85 | 346.3 | −229.69 | −30.57 | −4.38 | 14.97 | 5.273 | 0.6767 | 0.00000 | 0.000000 |
| 7: | 8 | 188.77 | 344.09 | 124.03 | 1454.0 | −946.11 | −131.28 | −20.00 | −9.61 | −2.938 | −0.3664 | 0.00000 | 0.000000 |
| 8: | 12 | 296.49 | 293.38 | 233.48 | 361.7 | 226.20 | 92.62 | −12.43 | −1.97 | 0.172 | 0.0173 | 0.00000 | 0.000000 |
| 9: | 14 | 170.27 | 163.16 | 240.38 | 458.23 | 101.12 | 8.09 | 1.35 | −0.266 | −0.0024 | −0.00361 | −0.000269 | |
| 10: | 15 | 952.50 | −530.85 | 214.38 | 4543.7 | −3012.97 | −166.17 | −23.70 | −1.28 | 0.020 | −0.0134 | 0.00000 | 0.000000 |
| 11: | 17 | −146.18 | −154.88 | 194.91 | 540.1 | 356.25 | 37.31 | 3.55 | 0.38 | 0.030 | 0.0071 | 0.00005 | 0.000003 |
| 12: | 18 | −261.10 | −273.84 | 411.71 | 1307.3 | 828.82 | 173.55 | 32.91 | 5.82 | 0.937 | 0.1285 | 0.01549 | 0.001146 |
| 13: | 20 | 109.68 | 109.04 | 179.91 | 76.7 | 49.25 | 12.13 | 3.19 | 0.70 | 0.057 | 0.0012 | −0.00375 | −0.000306 |
| 14: | 22 | 924.46 | 594.22 | 150.88 | 526.5 | 341.24 | 51.73 | 10.11 | 0.43 | −0.109 | 0.0959 | 0.00000 | 0.000000 |
| 15: | 24 | 235.87 | 315.63 | 136.97 | 901.7 | −575.18 | −133.15 | −11.57 | 6.42 | 0.152 | −0.2210 | 0.00000 | 0.000000 |
| 16: | 25 | −91.90 | −90.37 | 126.92 | 78.8 | −7.97 | 71.75 | 15.41 | −4.50 | −1.032 | −0.0166 | 0.00040 | 0.000029 |
| 17: | 26 | −205.33 | −181.02 | 134.17 | 653.2 | −416.11 | −109.56 | −1.78 | 1.16 | 0.009 | 0.0611 | 0.00000 | 0.000000 |
| 18: | 27 | −181.57 | −214.29 | 160.36 | 1129.9 | 754.56 | 122.15 | −34.39 | −0.01 | 1.406 | −0.4904 | 0.00000 | 0.000000 |
| 19: | 28 | −218.81 | −234.75 | 170.68 | 696.9 | 419.02 | 162.59 | 14.14 | 1.91 | 0.319 | 0.0255 | 0.00000 | 0.000000 |
| 20: | 30 | 1012.52 | 36911.71 | 229.65 | 1567.6 | −1042.47 | −7.39 | −8.40 | −0.92 | −0.261 | −0.0328 | 0.00000 | 0.000000 |
| 21: | 32 | 2428.66 | 2636.47 | 300.93 | 86.8 | −58.82 | 9.88 | 4.93 | 0.28 | −0.201 | −0.0379 | 0.00000 | 0.000000 |
| 22: | 35 | −580.93 | −960.21 | 314.89 | 2562.9 | 1684.12 | 216.34 | 12.53 | −9.29 | −0.264 | 0.2550 | 0.00000 | 0.000000 |
| 23: | 37 | −309.65 | −335.64 | 290.07 | 895.0 | 603.76 | 63.59 | −23.21 | −7.82 | −1.133 | −0.0485 | 0.00000 | 0.000000 |
| 24: | 39 | −487.29 | −377.21 | 244.77 | 1659.7 | −1063.94 | −231.94 | −20.60 | −0.98 | −0.590 | 0.2043 | 0.00000 | 0.000000 |
| 25: | 40 | 108.85 | 100.56 | 178.68 | 771.4 | 572.59 | 39.64 | 4.88 | −4.27 | −2.024 | −0.6384 | −0.10717 | −0.008993 |
| 26: | 41 | −255.73 | −176.91 | 166.09 | 1597.2 | −1072.00 | −24.86 | 16.01 | 6.07 | 0.656 | 0.0330 | 0.00000 | 0.000000 |
| 27: | 42 | 58.81 | 60.03 | 110.98 | 253.7 | −130.26 | 55.04 | 38.29 | 13.36 | 3.241 | 0.5905 | 0.07998 | 0.007016 |

TABLE 8

Shs2037

| SURFACE | RADIUS | THICKNESS | MATERIAL | INDEX 193.304 nm | ½ DIAM |
|---|---|---|---|---|---|
| 0 | 0.0000000000 | 15.810079552000 | | 1.00000000 | 52.000 |
| 1 | 194.2935381300AS | 16.591815204300 | SIO2 | 1.56028895 | 67.574 |
| 2 | 599.2678445640AS | 2.473711578570 | | 1.00000000 | 67.809 |
| 3 | 123.3563381410AS | 15.001953129100 | SIO2 | 1.56028895 | 71.950 |
| 4 | 121.8236169490AS | 3.806346505350 | | 1.00000000 | 69.340 |
| 5 | 82.6748539660AS | 24.540486183000 | SIO2 | 1.56028895 | 72.939 |
| 6 | 138.0435204550AS | 33.844485536400 | | 1.00000000 | 69.312 |
| 7 | 736.5751676460AS | 24.435244066800 | SIO2 | 1.56028895 | 68.955 |
| 8 | −147.9088789550 | 1.468097249530 | | 1.00000000 | 69.749 |
| 9 | 619.0079534330AS | 16.326286757900 | SIO2 | 1.56028895 | 65.448 |
| 10 | −194.6423369760AS | 31.039821568900 | | 1.00000000 | 63.961 |
| 11 | 0.0000000000 | 60.200321556900 | | 1.00000000 | 53.505 |
| 12 | −64.0607429593 | 27.672266151600 | SIO2 | 1.56028895 | 60.343 |
| 13 | −81.8994655402 | 0.700006899642 | | 1.00000000 | 76.677 |
| 14 | 300.5543810080AS | 40.732384742000 | SIO2 | 1.56028895 | 115.616 |
| 15 | −701.1892029950 | 0.785236438990 | | 1.00000000 | 116.355 |
| 16 | 171.0611545630AS | 80.474599206900 | SIO2 | 1.56028895 | 119.977 |
| 17 | −952.2103040220AS | 74.278789447300 | | 1.00000000 | 106.915 |
| 18 | 261.1730320490 | 255.679935727000 | | 1.00000000 | 90.205 |
| 19 REFL | −146.0778111080AS | −255.679935727000 | | −1.00000000 | 96.734 |
| 20 REFL | 261.1730320490AS | 255.679935727000 | | 1.00000000 | 205.667 |
| 21 | 0.0000000000 | 28.155114662200 | | 1.00000000 | 124.101 |
| 22 | 107.8029883010AS | 39.129136084100 | SIO2 | 1.56028895 | 87.416 |
| 23 | 126.6127023030 | 32.978448966500 | | 1.00000000 | 75.756 |
| 24 | 678.1222765790AS | 7.747058572880 | SIO2 | 1.56028895 | 71.667 |
| 25 | 153.1345348420 | 10.845550065800 | | 1.00000000 | 66.710 |
| 26 | 222.0626041440AS | 7.561632762300 | SIO2 | 1.56028895 | 66.165 |
| 27 | 91.0487371180AS | 53.450515344400 | | 1.00000000 | 62.593 |
| 28 | −210.2033721970AS | 9.541566794310 | SIO2 | 1.56028895 | 68.085 |
| 29 | 182.2045733180AS | 36.701106495500 | | 1.00000000 | 83.677 |
| 30 | −218.8990245680AS | 17.036468896300 | SIO2 | 1.56028895 | 88.122 |
| 31 | −309.5664444770 | 2.224258751360 | | 1.00000000 | 101.829 |
| 32 | 1031.9633187400AS | 70.238501206000 | SIO2 | 1.56028895 | 124.916 |
| 33 | −164.4333032990 | 1.861034823470 | | 1.00000000 | 130.193 |
| 34 | 2976.9968593000AS | 75.107873726000 | SIO2 | 1.56028895 | 162.498 |
| 35 | −265.3917616970 | 5.701896462110 | | 1.00000000 | 165.855 |

TABLE 8-continued

Shs2037

| SURFACE | RADIUS | THICKNESS | MATERIAL | INDEX 193.304 nm | ½ DIAM |
|---|---|---|---|---|---|
| 36 | 513.4199596720 | 22.853974648100 | SIO2 | 1.56028895 | 164.253 |
| 37 | 616.1533487820AS | 0.700002451923 |  | 1.00000000 | 163.272 |
| 38 | 186.0855698410 | 48.359084978500 | SIO2 | 1.56028895 | 148.755 |
| 39 | 304.7433296040AS | 0.700000029556 |  | 1.00000000 | 144.657 |
| 40 | 154.6107905080AS | 52.735369452500 | SIO2 | 1.56028895 | 125.465 |
| 41 | 484.3905957550AS | 0.700000000065 |  | 1.00000000 | 119.213 |
| 42 | 108.9325471700AS | 39.093034673800 | SIO2 | 1.56028895 | 86.718 |
| 43 | 257.1050752120AS | 0.700000000380 |  | 1.00000000 | 78.362 |
| 44 | 58.5242862716AS | 8.064267877490 | SIO2 | 1.56028895 | 54.011 |
| 45 | 37.0000000000 | 0.200000000000 | IMM | 1.56100000 | 37.000 |
| 46 | 35.7672894016 | 47.937581141300 | SAPHIR | 1.92803200 | 35.767 |
| 47 | 0.0000000000 | 0.000000000000 |  | 1.00000000 | 13.000 |

TABLE 8A

ASPHAERIC CONSTANTS

SURFACE NR. 1

| K | 0.000000000000 |
| C1 | 1.52182763898e−007 |
| C2 | 4.24809796452e−011 |
| C3 | −1.44295707455e−014 |
| C4 | 2.38277641890e−018 |
| C5 | −1.66893393445e−022 |
| C6 | −3.49842235826e−027 |
| C7 | 2.80879323580e−031 |
| C8 | 0.00000000000e+000 |
| C9 | 0.00000000000e+000 |

SURFACE NR. 2

| K | 0.000000000000 |
| C1 | 2.07422919342e−007 |
| C2 | 1.38162113780e−012 |
| C3 | −5.54862074439e−015 |
| C4 | 6.87559406824e−019 |
| C5 | 8.60124142716e−023 |
| C6 | −2.47367492302e−026 |
| C7 | 7.20120427263e−031 |
| C8 | 0.00000000000e+000 |
| C9 | 0.00000000000e+000 |

SURFACE NR. 3

| K | 0.000000000000 |
| C1 | 4.05494558278e−008 |
| C2 | 1.71194535894e−012 |
| C3 | 7.80239442971e−016 |
| C4 | −1.32359674076e−020 |
| C5 | −5.92690524210e−024 |
| C6 | 3.31101767389e−027 |
| C7 | 2.57626321338e−031 |
| C8 | 0.00000000000e+000 |
| C9 | 0.00000000000e+000 |

SURFACE NR. 4

| K | 0.000000000000 |
| C1 | 4.45402219702e−009 |
| C2 | 6.84303103767e−012 |
| C3 | 1.97835007511e−015 |
| C4 | −2.75826461783e−019 |
| C5 | −1.34762459357e−023 |
| C6 | −1.52795781921e−027 |
| C7 | 1.76600445228e−030 |
| C8 | 0.00000000000e+000 |
| C9 | 0.00000000000e+000 |

SURFACE NR. 5

| K | 0.000000000000 |
| C1 | 7.59148457617e−009 |
| C2 | −1.80215106466e−011 |

TABLE 8A-continued

ASPHAERIC CONSTANTS

| C3 | 3.38958506925e−015 |
| C4 | −1.84290846470e−019 |
| C5 | −2.31445731822e−023 |
| C6 | 7.81157255294e−027 |
| C7 | −4.12124997105e−031 |
| C8 | 0.00000000000e+000 |
| C9 | 0.00000000000e+000 |

SURFACE NR. 6

| K | 0.000000000000 |
| C1 | 1.61817304740e−007 |
| C2 | 2.08867647801e−011 |
| C3 | −4.63692402231e−018 |
| C4 | 5.40354655370e−019 |
| C5 | 3.87822181008e−023 |
| C6 | 1.86998126066e−028 |
| C7 | 9.31747340946e−032 |
| C8 | 0.00000000000e+000 |
| C9 | 0.00000000000e+000 |

SURFACE NR. 7

| K | 0.000000000000 |
| C1 | −9.17034086271e−008 |
| C2 | −1.12670816401e−010 |
| C3 | 2.27728356757e−014 |
| C4 | −2.56904468427e−018 |
| C5 | 1.53411865137e−022 |
| C6 | −5.07226742096e−027 |
| C7 | −2.93943409972e−031 |
| C8 | 0.00000000000e+000 |
| C9 | 0.00000000000e+000 |

SURFACE NR. 9

| K | 0.000000000000 |
| C1 | −1.55721767088e−007 |
| C2 | 4.64105217679e−011 |
| C3 | −3.23552671170e−015 |
| C4 | 1.64704321079e−019 |
| C5 | −7.84222099542e−022 |
| C6 | 1.44342488486e−025 |
| C7 | 1.10578865155e−030 |
| C8 | 0.00000000000e+000 |
| C9 | 0.00000000000e+000 |

SURFACE NR. 10

| K | 0.000000000000 |
| C1 | 1.62873612582e−007 |
| C2 | 3.55429302902e−011 |
| C3 | 1.09995304587e−015 |
| C4 | 3.16759181854e−019 |
| C5 | −5.45588493495e−022 |
| C6 | 1.14044535432e−025 |
| C7 | 6.72560203300e−031 |

TABLE 8A-continued

ASPHAERIC CONSTANTS

| | |
|---|---|
| C8 | 0.00000000000e+000 |
| C9 | 0.00000000000e+000 |

SURFACE NR. 14

| | |
|---|---|
| K | 0.000000000000 |
| C1 | −1.02583520080e−008 |
| C2 | 8.62101570431e−013 |
| C3 | 2.52617150273e−017 |
| C4 | −1.77821214366e−021 |
| C5 | −3.61838153901e−026 |
| C6 | 3.69978552228e−030 |
| C7 | −6.72964835287e−035 |
| C8 | 0.00000000000e+000 |
| C9 | 0.00000000000e+000 |

SURFACE NR. 16

| | |
|---|---|
| K | 0.000000000000 |
| C1 | 3.01871225460e−009 |
| C2 | 8.64256452997e−013 |
| C3 | −2.20943941443e−017 |
| C4 | 1.62155795574e−021 |
| C5 | 3.85565127563e−027 |
| C6 | −9.12548831127e−031 |
| C7 | 6.03548065056e−035 |
| C8 | 0.00000000000e+000 |
| C9 | 0.00000000000e+000 |

SURFACE NR. 17

| | |
|---|---|
| K | 0.000000000000 |
| C1 | 1.10449705662e−007 |
| C2 | 6.85842701386e−013 |
| C3 | 4.19788193616e−017 |
| C4 | 3.22595315304e−021 |
| C5 | −1.81253203352e−025 |
| C6 | 1.31589880877e−029 |
| C7 | −1.85153915252e−034 |
| C8 | 0.00000000000e+000 |
| C9 | 0.00000000000e+000 |

SURFACE NR. 19

| | |
|---|---|
| K | −0.124078642688 |
| C1 | 1.59263594712e−008 |
| C2 | 5.17933205562e−013 |
| C3 | 5.10687019487e−018 |
| C4 | 1.53696239459e−021 |
| C5 | −8.19270825987e−026 |
| C6 | 4.44437653606e−030 |
| C7 | −3.99381634148e−035 |
| C8 | 0.00000000000e+000 |
| C9 | 0.00000000000e+000 |

SURFACE NR. 20

| | |
|---|---|
| K | −0.334751866761 |
| C1 | 4.25504836259e−010 |
| C2 | 5.12935210806e−015 |
| C3 | 4.06630894523e−020 |
| C4 | 7.71315257357e−025 |
| C5 | −3.21454909671e−030 |
| C6 | 1.03794698087e−034 |
| C7 | 5.90630815597e−040 |
| C8 | 0.00000000000e+000 |
| C9 | 0.00000000000e+000 |

SURFACE NR. 22

| | |
|---|---|
| K | 0.000000000000 |
| C1 | 1.95889815982e−009 |
| C2 | 1.90950690941e−013 |
| C3 | −1.67596486620e−017 |
| C4 | 3.97308136282e−021 |
| C5 | −1.65476547584e−026 |
| C6 | −1.02953550293e−029 |
| C7 | 2.62676701322e−033 |
| C8 | 0.00000000000e+000 |
| C9 | 0.00000000000e+000 |

TABLE 8A-continued

ASPHAERIC CONSTANTS

SURFACE NR. 24

| | |
|---|---|
| K | 0.000000000000 |
| C1 | 3.00346174150e−008 |
| C2 | 1.01567816642e−012 |
| C3 | −8.41093683088e−016 |
| C4 | 3.44567825340e−019 |
| C5 | −3.51270721176e−023 |
| C6 | 1.24599172791e−027 |
| C7 | 3.34365288294e−032 |
| C8 | 0.00000000000e+000 |
| C9 | 0.00000000000e+000 |

SURFACE NR. 26

| | |
|---|---|
| K | 0.000000000000 |
| C1 | −9.58302401144e−008 |
| C2 | 1.83907475529e−011 |
| C3 | −3.54912600401e−015 |
| C4 | −1.24336076571e−018 |
| C5 | 2.33183759371e−022 |
| C6 | −9.34466285683e−027 |
| C7 | −1.94663561010e−031 |
| C8 | 0.00000000000e+000 |
| C9 | 0.00000000000e+000 |

SURFACE NR. 27

| | |
|---|---|
| K | 0.000000000000 |
| C1 | −4.25221078555e−009 |
| C2 | 2.65084566155e−011 |
| C3 | −3.00865415952e−015 |
| C4 | −1.16738927967e−018 |
| C5 | 5.05891961004e−023 |
| C6 | 2.13721959869e−026 |
| C7 | −8.83523197621e−031 |
| C8 | 0.00000000000e+000 |
| C9 | 0.00000000000e+000 |

SURFACE NR. 28

| | |
|---|---|
| K | 0.000000000000 |
| C1 | 2.17234988260e−008 |
| C2 | −1.36995475440e−011 |
| C3 | −3.17632279806e−015 |
| C4 | 6.81029382890e−019 |
| C5 | −7.78327852134e−023 |
| C6 | 4.19803398784e−027 |
| C7 | 9.44775674860e−032 |
| C8 | 0.00000000000e+000 |
| C9 | 0.00000000000e+000 |

SURFACE NR. 29

| | |
|---|---|
| K | 0.000000000000 |
| C1 | 2.62642047061e−008 |
| C2 | −9.81419464212e−012 |
| C3 | −4.55036921427e−015 |
| C4 | 1.08147487200e−018 |
| C5 | −1.02047434407e−022 |
| C6 | 3.97968712547e−027 |
| C7 | −1.43310787576e−032 |
| C8 | 0.00000000000e+000 |
| C9 | 0.00000000000e+000 |

SURFACE NR. 30

| | |
|---|---|
| K | 0.000000000000 |
| C1 | −2.66765769286e−008 |
| C2 | 5.40155188970e−012 |
| C3 | 1.54518633501e−016 |
| C4 | 2.79510693226e−021 |
| C5 | −2.16525005908e−025 |
| C6 | 3.48924429453e−029 |
| C7 | 4.18617804812e−033 |
| C8 | 0.00000000000e+000 |
| C9 | 0.00000000000e+000 |

SURFACE NR. 32

| | |
|---|---|
| K | 0.000000000000 |
| C1 | −3.84351735665e−008 |
| C2 | 3.57796213684e−013 |

TABLE 8A-continued

ASPHAERIC CONSTANTS

| | |
|---|---|
| C3 | −1.36694485987e−017 |
| C4 | −6.23150437979e−023 |
| C5 | 2.34877803839e−026 |
| C6 | −1.56652695896e−030 |
| C7 | 1.06172810900e−035 |
| C8 | 0.00000000000e+000 |
| C9 | 0.00000000000e+000 |

SURFACE NR. 34

| | |
|---|---|
| K | 0.000000000000 |
| C1 | −6.56830430275e−010 |
| C2 | −1.45753876332e−014 |
| C3 | −1.37902933975e−019 |
| C4 | −1.91648562126e−024 |
| C5 | 2.02103444011e−027 |
| C6 | −4.33600228644e−032 |
| C7 | 9.12790371661e−038 |
| C8 | 0.00000000000e+000 |
| C9 | 0.00000000000e+000 |

SURFACE NR. 37

| | |
|---|---|
| K | 0.000000000000 |
| C1 | −1.08694129766e−008 |
| C2 | 7.33753920405e−014 |
| C3 | −7.79938334817e−018 |
| C4 | −2.79943871022e−022 |
| C5 | 1.41988595194e−026 |
| C6 | −1.56064111184e−031 |
| C7 | 1.63994569589e−037 |
| C8 | 0.00000000000e+000 |
| C9 | 0.00000000000e+000 |

SURFACE NR. 39

| | |
|---|---|
| K | 0.000000000000 |
| C1 | −2.74995147218e−009 |
| C2 | −2.04259498199e−013 |
| C3 | −1.51365186640e−018 |
| C4 | −8.81355353262e−023 |
| C5 | 5.24995776852e−027 |
| C6 | 1.00205162500e−031 |
| C7 | 1.56229882160e−037 |
| C8 | 0.00000000000e+000 |
| C9 | 0.00000000000e+000 |

SURFACE NR. 40

| | |
|---|---|
| K | 0.000000000000 |
| C1 | −2.62325914220e−010 |
| C2 | −4.64364714236e−015 |
| C3 | 1.27823808984e−018 |
| C4 | −5.19175820062e−023 |
| C5 | −3.08090505916e−027 |
| C6 | 7.16374159432e−032 |
| C7 | 1.11953280752e−035 |
| C8 | 0.00000000000e+000 |
| C9 | 0.00000000000e+000 |

SURFACE NR. 41

| | |
|---|---|
| K | 0.000000000000 |
| C1 | 7.81918075824e−009 |
| C2 | 1.38023573338e−013 |
| C3 | 9.99233116072e−017 |
| C4 | −6.36105773586e−021 |
| C5 | 2.70762174262e−025 |
| C6 | −4.06755279655e−030 |
| C7 | −1.99740574495e−035 |
| C8 | 0.00000000000e+000 |
| C9 | 0.00000000000e+000 |

SURFACE NR. 42

| | |
|---|---|
| K | 0.000000000000 |
| C1 | 7.24747559240e−008 |
| C2 | 3.57433450714e−013 |
| C3 | 4.10186245339e−016 |
| C4 | −6.14667957577e−022 |
| C5 | 1.44698262019e−024 |
| C6 | 2.65410265038e−028 |
| C7 | 4.61556982659e−033 |
| C8 | 0.00000000000e+000 |
| C9 | 0.00000000000e+000 |

SURFACE NR. 43

| | |
|---|---|
| K | 0.000000000000 |
| C1 | 1.25110570297e−007 |
| C2 | 1.53034565013e−012 |
| C3 | 4.68948451357e−016 |
| C4 | −1.41311581924e−020 |
| C5 | −1.87641445601e−024 |
| C6 | −2.65050647206e−028 |
| C7 | 7.88781238216e−033 |
| C8 | 0.00000000000e+000 |
| C9 | 0.00000000000e+000 |

SURFACE NR. 44

| | |
|---|---|
| K | 0.000000000000 |
| C1 | −1.14201791905e−007 |
| C2 | −1.93083955912e−011 |
| C3 | −2.96305450551e−015 |
| C4 | −9.55272113449e−019 |
| C5 | 2.64110397113e−022 |
| C6 | −4.57222488195e−026 |
| C7 | 4.83104261929e−030 |
| C8 | 0.00000000000e+000 |
| C9 | 0.00000000000e+000 |

TABLE 8Z

SHS2037

| Nr | Sf | RV | RENV | 2*HMax | Def[mμ] | Z9 | Z16 | Z25 | Z36 | Z49 | Z64 | Z81 | Z100 |
|---|---|---|---|---|---|---|---|---|---|---|---|---|---|
| 1: | 1 | 194.29 | 150.18 | 131.85 | 814.6 | 548.21 | −29.97 | −12.12 | 0.19 | −1.317 | 0.0118 | 0.00278 | 0.000000 |
| 2: | 2 | −599.27 | −327.11 | 132.27 | 624.9 | −413.30 | 65.62 | 5.32 | 2.16 | 1.438 | 0.1083 | −0.00749 | 0.000000 |
| 3: | 3 | 123.36 | 115.70 | 139.55 | 483.0 | 294.49 | 81.88 | 24.38 | 6.41 | 1.374 | 0.1563 | 0.00623 | −0.000005 |
| 4: | 4 | −121.82 | −116.29 | 134.72 | 386.2 | −237.64 | −68.69 | −11.88 | −5.93 | −2.202 | −0.3517 | −0.02461 | 0.000002 |
| 5: | 5 | 82.67 | 83.15 | 141.10 | 85.5 | −14.55 | 56.40 | 25.63 | 2.70 | 0.851 | 0.0333 | −0.00673 | 0.000443 |
| 6: | 6 | −138.04 | −106.32 | 133.65 | 1726.8 | −1087.89 | −252.55 | −51.29 | −7.83 | −0.447 | −0.0162 | −0.00090 | 0.000015 |
| 7: | 7 | 736.58 | −705.37 | 132.28 | 1832.1 | −1227.19 | −66.74 | 18.75 | −8.37 | 0.256 | −0.0913 | −0.00306 | 0.000000 |
| 8: | 9 | 619.01 | 877.97 | 125.56 | 148.2 | −103.05 | 4.36 | −1.43 | 15.67 | 5.415 | 0.6962 | 0.00500 | 0.000000 |
| 9: | 10 | 194.64 | 342.28 | 122.87 | 1334.2 | −865.67 | −124.44 | −21.34 | −11.04 | −3.228 | −0.3946 | −0.00215 | 0.000000 |
| 10: | 14 | 300.55 | 295.99 | 237.82 | 397.1 | 253.38 | 90.97 | −15.65 | −1.73 | 0.402 | −0.0035 | −0.00835 | 0.000000 |
| 11: | 16 | 171.06 | 163.13 | 244.58 | 879.3 | 551.88 | 147.08 | 20.77 | 4.94 | 0.342 | 0.0828 | 0.00637 | −0.000404 |
| 12: | 17 | 952.21 | −505.27 | 217.80 | 4938.7 | −3266.71 | −227.38 | −36.86 | −4.26 | −0.513 | −0.0421 | 0.00563 | 0.000000 |
| 13: | 19 | −146.08 | −154.78 | 193.47 | 529.2 | 349.39 | 35.33 | 3.31 | 0.34 | 0.029 | 0.0056 | −0.00016 | 0.000002 |
| 14: | 20 | −261.17 | −273.76 | 411.33 | 1289.9 | 817.80 | 171.36 | 32.43 | 5.73 | 0.922 | 0.1276 | 0.01480 | 0.001130 |
| 15: | 22 | 107.80 | 107.43 | 178.35 | 48.3 | 29.91 | 9.18 | 3.15 | 0.81 | 0.132 | 0.0225 | 0.00073 | −0.000208 |

TABLE 8Z-continued

SHS2037

| Nr | Sf | RV | RENV | 2*HMax | Def[mμ] | Z9 | Z16 | Z25 | Z36 | Z49 | Z64 | Z81 | Z100 |
|---|---|---|---|---|---|---|---|---|---|---|---|---|---|
| 16: | 24 | 678.12 | 512.65 | 149.50 | 431.7 | 274.73 | 54.97 | 12.80 | 0.56 | −0.098 | 0.0988 | 0.00247 | 0.000000 |
| 17: | 26 | 222.06 | 293.28 | 136.14 | 902.9 | −567.60 | −143.53 | −21.47 | 5.90 | 0.540 | −0.1730 | −0.00321 | 0.000000 |
| 18: | 27 | −91.05 | −90.65 | 126.85 | 127.9 | 30.91 | 74.05 | 19.94 | −3.72 | −1.115 | −0.0345 | 0.00482 | 0.000008 |
| 19: | 28 | −210.20 | −188.38 | 134.82 | 576.6 | −370.00 | −95.44 | 2.79 | 1.43 | 0.033 | 0.0690 | 0.00133 | 0.000000 |
| 20: | 29 | −182.20 | −212.10 | 160.24 | 1079.8 | 718.14 | 128.66 | −31.62 | −0.47 | 1.290 | −0.4727 | 0.00321 | 0.000000 |
| 21: | 30 | −218.90 | −233.81 | 170.44 | 682.6 | 410.25 | 161.43 | 12.40 | 1.79 | 0.368 | 0.0486 | 0.00252 | 0.000000 |
| 22: | 32 | 1031.96 | 64064.32 | 230.20 | 1552.0 | −1032.93 | −1.70 | −7.44 | −0.76 | −0.206 | −0.0210 | 0.00078 | 0.000000 |
| 23: | 34 | 2977.00 | 3330.52 | 299.00 | 98.1 | −66.92 | 7.63 | 4.80 | 0.44 | −0.139 | −0.0286 | 0.00044 | 0.000000 |
| 24: | 37 | −616.15 | −1029.87 | 310.22 | 2367.6 | 1556.05 | 195.70 | 13.11 | −8.12 | −0.371 | 0.1907 | −0.00143 | 0.000000 |
| 25: | 39 | −304.74 | −328.78 | 284.69 | 808.7 | 543.96 | 60.17 | −18.71 | −6.45 | −0.962 | −0.0462 | −0.00035 | 0.000000 |
| 26: | 40 | 154.61 | 154.67 | 251.84 | 10.7 | 0.42 | 5.28 | 2.57 | 1.22 | 0.391 | 0.0597 | 0.00376 | 0.000023 |
| 27: | 41 | −484.39 | −380.95 | 240.72 | 1490.8 | −957.75 | −204.76 | −17.04 | −0.14 | −0.332 | 0.2038 | 0.00301 | 0.000000 |
| 28: | 42 | 108.93 | 100.90 | 177.03 | 745.0 | 533.61 | 44.13 | 10.79 | −1.44 | −1.155 | −0.4406 | −0.07823 | −0.006942 |
| 29: | 43 | −257.11 | −178.88 | 162.60 | 1512.5 | −1012.96 | −33.74 | 11.78 | 4.88 | 0.491 | 0.0091 | −0.00223 | 0.000000 |
| 30: | 44 | 58.52 | 59.65 | 109.66 | 197.9 | −106.94 | 50.45 | 32.94 | 11.27 | 2.706 | 0.4936 | 0.06818 | 0.005742 |

What is claimed is:

1. A projection objective comprising:
a plurality of optical elements transparent to radiation at an operating wavelength of the projection objective and including a lens starting from which a convergent beam path begins to converge and remains convergent up to an image plane, and
an aperture diaphragm arranged at a distance of at least 10 mm from the lens and on the image side of the lens,
wherein the operating wavelength is a deep ultraviolet wavelength $\lambda \geq 193$ nm, and
wherein at least one of the optical elements has a refractive index $n \geq 1.6$ at the operating wavelength.

2. The projection objective according to claim 1, having an object-side numerical aperture $NA_{Obj}$ greater than 0.3.

3. The projection objective according to claim 1, wherein the plurality of optical elements comprises a last optical element arranged closest to the image plane and made at least partly of a high-index material having a refractive index $n > 1.6$ at the operating wavelength.

4. The projection objective according to claim 3, wherein the last optical element is a monolithic piano-convex lens made of a high-index material having a refractive index $n > 1.6$ at the operating wavelength.

5. The projection objective according to claim 1, having an image-side numerical aperture NA greater than 1.3.

6. The projection objective according to claim 1, having an image-side numerical aperture $1.7 \leq NA \leq 1.8$.

7. The projection objective according to claim 1, wherein the plurality of optical elements form:
a first objective part for imaging a pattern provided in an object plane of the projection objective into a first intermediate image;
a second objective part including at least one concave mirror for imaging the first intermediate image into a second intermediate image; and
a third objective part for imaging the second intermediate image onto the image plane.

8. The projection objective according to claim 7, wherein each of the first and third objective parts is a refractive objective part.

9. A projection objective comprising:
a plurality of optical elements transparent to radiation at an operating wavelength of the projection objective and including a lens starting from which a convergent beam path begins to converge and remains convergent up to an image plane, and
a pupil plane arranged at a distance of at least 10 mm from the lens and on the image side of the lens,
wherein the operating wavelength is a deep ultraviolet wavelength $\lambda \geq 193$ nm, and
wherein at least one of the optical elements has a refractive index $n \geq 1.6$ at the operating wavelength.

* * * * *

UNITED STATES PATENT AND TRADEMARK OFFICE
CERTIFICATE OF CORRECTION

| | |
|---|---|
| PATENT NO. | : 7,782,538 B2 |
| APPLICATION NO. | : 12/269686 |
| DATED | : August 24, 2010 |
| INVENTOR(S) | : Beder et al. |

It is certified that error appears in the above-identified patent and that said Letters Patent is hereby corrected as shown below:

Column 3, Line 16: Delete "monolytic" and insert -- monolithic --

Column 4, Line 58: Delete "asperic" and insert -- aspheric --

Column 12, Line 24: Delete "n1" and insert -- $n_I$ --

Column 16, Line 49-50: Delete " $Z81 = 12870 \cdot h^{16} - 51480 \cdot h^{14} + 84084 \cdot h^{12} - 72072 \cdot h^{10} - 34650 \cdot h^8 - 9240 \cdot h^6 + 1260 \cdot h^4 - 72 \cdot h^2 + 1$ " and insert -- $Z81 = 12870 \cdot h^{16} - 51480 \cdot h^{14} + 84084 \cdot h^{12} - 72072 \cdot h^{10} + 34650 \cdot h^8 - 9240 \cdot h^6 + 1260 \cdot h^4 - 72 \cdot h^2 + 1$ --

Column 18, Line 16: After "$-2.5 \geq K16/K25 \geq -3.5$" insert -- . --

Column 19, Line 16: After "$3.0 \leq K16/K25 \leq 5.0$" insert -- . --

Column 19, Line 34: After "$10.0 \leq K16/K25 \leq 15.0$" insert -- . --

Column 20, Line 31-36: Delete "
$-1.8 \leq K9/K16 \leq 2.5$
$+1.3 \leq K16/K25 \leq 1.7$
$+2.5 \leq K25/K36 \leq 4.0$
$+3.5 \leq K36/K49 \leq 5.0$
$+4.5 \leq K49/K64 \leq 7.0,$
" and insert --
$-1.8 \leq K9/K16 \leq 2.5$
$+1.3 \leq K16/K25 \leq 1.7$
$+2.5 \leq K25/K36 \leq 4.0$
$+3.5 \leq K36/K49 \leq 5.0$
$+4.5 \leq K49/K64 \leq 7.0.$
--

Column 20, Line 64: After "condition" insert -- : --

Signed and Sealed this
Thirty-first Day of May, 2011

David J. Kappos
*Director of the United States Patent and Trademark Office*